US012614698B2

(12) United States Patent
Suzuki et al.

(10) Patent No.: US 12,614,698 B2
(45) Date of Patent: Apr. 28, 2026

(54) PLASMA PROCESSING APPARATUS AND PLASMA PROCESSING METHOD

(71) Applicant: ULVAC, Inc., Kanagawa (JP)

(72) Inventors: Taichi Suzuki, Kanagawa (JP);
Yasuhiro Morikawa, Kanagawa (JP);
Kenta Doi, Kanagawa (JP); Toshiyuki Nakamura, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 311 days.

(21) Appl. No.: 18/213,228

(22) Filed: Jun. 22, 2023

(65) Prior Publication Data

US 2023/0420220 A1     Dec. 28, 2023

(30) Foreign Application Priority Data

Jun. 24, 2022     (JP) ................................. 2022-101845

(51) Int. Cl.
H01J 37/32           (2006.01)

(52) U.S. Cl.
CPC .. H01J 37/32174 (2013.01); H01J 37/32541 (2013.01); H01J 37/32568 (2013.01); *H01J 2237/332* (2013.01); *H01J 2237/334* (2013.01)

(58) Field of Classification Search
CPC ........... H01J 37/32174; H01J 37/32541; H01J 37/32568; H01J 2237/332; H01J 2237/334
USPC ........................................................ 438/789
See application file for complete search history.

(56) References Cited

U.S. PATENT DOCUMENTS

| | | | |
|---|---|---|---|
| 2010/0243162 A1 | 9/2010 | Koshimizu | |
| 2017/0316917 A1 | 11/2017 | Murayama et al. | |
| 2019/0237305 A1* | 8/2019 | Tsujimoto | H01L 21/6831 |
| 2020/0219699 A1* | 7/2020 | Yasui | H01L 21/02247 |

(Continued)

FOREIGN PATENT DOCUMENTS

| | | |
|---|---|---|
| JP | H08078191 A | 3/1996 |
| JP | 2004111971 A | 4/2004 |

(Continued)

OTHER PUBLICATIONS

English translation of JP WO2016114232-A1 (Year: 2016).*

(Continued)

*Primary Examiner* — Jami Valentine Miller
(74) *Attorney, Agent, or Firm* — Grossman, Tucker Perreault & Pfleger, PLLC; Edmund P. Pfleger

(57)           ABSTRACT

A plasma processing apparatus according to the invention includes a chamber, an inner electrode, an outer electrode, a plasma generating power source, and a gas introduction part. The plasma generating power source applies alternating-current power to the outer electrode. The outer electrode includes a first electrode, a second electrode, and a third electrode. The plasma generating power source includes a first high-frequency power source, a second high-frequency power source, and a power splitter. The first high-frequency power source applies alternating-current power having a first frequency $\lambda 1$ to the first electrode and the second electrode. The second high-frequency power source applies alternating-current power having a second frequency $\lambda 2$ to the third electrode. A relationship of $\lambda 1 > \lambda 2$ is satisfied. The power splitter is configured to split the alternating-current power into the first electrode and the second electrode with a predetermined split ratio.

12 Claims, 18 Drawing Sheets

(56)       References Cited

U.S. PATENT DOCUMENTS

| | | | | |
|---|---|---|---|---|
| 2022/0044938 A1* | 2/2022 | Doi | ..................... | H01L 21/3085 |
| 2023/0420220 A1* | 12/2023 | Suzuki | .............. | H01J 37/32174 |

FOREIGN PATENT DOCUMENTS

| | | | | | |
|---|---|---|---|---|---|
| JP | 2010238981 | A | 10/2010 | | |
| JP | 2015099820 | A | 5/2015 | | |
| JP | WO2016114232 | A1 * | 4/2017 | ........ | H01J 37/32568 |
| JP | 2018121051 | A | 8/2018 | | |
| JP | 2018142650 | A | 9/2018 | | |
| JP | 2019004057 | A | 1/2019 | | |
| TW | 309692 | B | 7/1997 | | |
| TW | 201546897 | A | 12/2015 | | |
| TW | 201630034 | A | 8/2016 | | |
| WO | WO-2013172203 | A1 * | 11/2013 | .......... | C23C 16/511 |
| WO | 2014065034 | A1 | 5/2014 | | |
| WO | 2016114232 | | 7/2016 | | |

OTHER PUBLICATIONS

English translation of WO-2013172203-A1 (Year: 2013).*
Notice of Allowance from Japanese Application No. 2022101845, mailed May 7, 2024. English translation attached. 5 pages.
Search Report from related Taiwanese Application No. 112123501, dated May 7, 2024. English translation attached. 6 pages.

* cited by examiner

11N

11N

IN/OUT=500/503

IN/OUT=250/753

COMPARISON OF Depo2-PROFILE

DISTANCE FROM SUBSTRATE CENTER (mm)

DISTANCE FROM SUBSTRATE CENTER (mm)

SEM image (X: ONLY LEFT-RIGHT)

PLASMA PROCESSING APPARATUS AND PLASMA PROCESSING METHOD

CROSS-REFERENCE TO RELATED APPLICATION

This application claims priority from Japanese Patent Application No. 2022-101845 filed on Jun. 24, 2022, the contents of which are incorporated herein by reference in their entirety.

BACKGROUND OF THE INVENTION

Field of the Invention

The present invention relates to a plasma processing apparatus and a plasma processing method.

Description of Related Art

Processing using plasma has been used in an etching step or a deposition step for manufacturing semiconductor devices or FPD (Flat Panel Display). Conventionally, a plasma processing apparatus provided with a counter electrode having a spiral-shaped antenna structure is known (for example, PCT International Publication No. WO 2016/114232).

In a case of carrying out plasma processing with respect to a target substrate using such a plasma processing apparatus, it is necessary to set or control a device configuration and processing conditions so as to obtain a desired space distribution of plasma. For example, it is conceivable to set or control a device configuration and processing conditions so as to obtain a plasma profile such that an in-plane distribution of plasma processing with respect to the target substrate is uniform or so as to generate plasma a desired position in a chamber.

Furthermore, for processing using such an apparatus, there is a case in which various processing types, for example, an etching step or a deposition step are carried out in the same chamber. Furthermore, even where the same processing is carried out, there is a case in which plasma processing may be carried out in the same chamber under various conditions, for example, using various types of gas.

Even in these cases, for each type of processing, it is necessary to obtain a preferable plasma profile in accordance with a processing purpose or it is necessary to generate plasma at a desired position in the chamber.

However, in an apparatus that achieves a preferable or a necessary profile of plasma condition in a specific type of processing, it is not necessarily that it is possible to achieve the preferable or the necessary profile of the plasma condition in the other processing in the same way. Particularly, for processing using various types of gas, even where a profile of plasma condition for realizing a required type of processing can be achieved by using one gas type, there is a case in which a defect occurs such that a profile of plasma condition for realizing a required type of processing cannot be completely achieved by using the other gas type. An apparatus for solving the above-described problems is not known.

Naturally, there is a case in which various types of processing are carried out in the same apparatus with respect to each of a plurality of target substrates which are the same as each other. In this case, it is necessary to realize a processing state such as in-plane uniformity of the substrate or the like for each type of processing step.

It is conceivable to achieve to satisfy the above-mentioned requirement by controlling a plasma state so as to change a profile of a plasma generation space or a plasma generation position depending on each of the plurality of the processing steps, and obtaining a desired plasma state.

However, an apparatus or technique is not known which can change a profile of a plasma generation space or a plasma generation position or can obtain a desired plasma state so as to satisfy the aforementioned requirement. It is required to achieve an apparatus or technique which carries out the foregoing processing.

Moreover, even where it is possible to control a profile of a plasma generation space or a plasma generation position, there is a case in which a plasma condition is not satisfied such that a predetermined electron density is not obtained. Accordingly, there is problem in that a required type of processing is not achieved.

SUMMARY OF THE INVENTION

The invention was conceived in view of the above-described circumstances and achieves the following objects.

1. To change or set a plasma state so as to sufficiently obtain a desired plasma profile or a desired plasma generation position even in processing in which a desired profile of a plasma generation space or a desired plasma generation position is not obtained.

2. To obtain a profile of a plasma generation space required for processing or a desired plasma generation position required for processing, and further achieve a plasma condition such as an electron density or the like required for processing.

A plasma processing apparatus according to one aspect of the invention includes: a chamber having a depressurizable internal space, the chamber being configured to carry out a plasma processing with respect to a target object in the internal space; an upper lid configured to be provided on an upper surface of the chamber, the upper lid being formed of a dielectric plate; a flat plate-shaped inner electrode disposed inside the chamber, the inner electrode being configured to receive the target object to be mounted thereon; a spiral-shaped outer electrode disposed outside the chamber, the outer electrode being disposed so as to face the inner electrode with the upper lid interposed therebetween; a plasma generating power source configured to apply alternating-current power having a predetermined frequency to the outer electrode; and a gas introduction part configured to introduce a processing gas into the internal space of the chamber. The outer electrode is separated in a radial direction of the outer electrode. The outer electrode includes a spiral-shaped first electrode, a spiral-shaped second electrode, and a spiral-shaped third electrode. The first electrode is disposed at a medial portion in the radial direction. The second electrode is disposed at an outer-peripheral portion in the radial direction. The third electrode is sandwiched between the first electrode and the second electrode in the radial direction. The plasma generating power source includes a first high-frequency power source, a second high-frequency power source, and a power splitter. The first high-frequency power source is configured to apply alternating-current power having a first frequency $\lambda 1$ to the first electrode and the second electrode. The second high-frequency power source is configured to apply alternating-current power having a second frequency $\lambda 2$ to the third electrode. The relationship between the first frequency $\lambda 1$ and the second frequency $\lambda 2$ satisfies a relationship of $\lambda 1 > \lambda 2$. The power splitter is configured to split the alternating-current power to be applied to the first electrode and the second electrode, into the first electrode and the second electrode, with a predetermined split ratio. The power splitter is configured to apply the split alternating-current power to each of the first electrode and the second electrode.

In the plasma processing apparatus according to one aspect of the invention, plasma having a space distribution controlled by the alternating-current power having the first frequency $\lambda 1$ which is split into and applied to the first electrode and the second electrode may be generated. An electron density of the plasma may be increased by the alternating-current power having the second frequency $\lambda 2$ applied to the third electrode.

In the plasma processing apparatus according to one aspect of the invention, the power splitter may be configured to split the alternating-current power to be applied to the first electrode and the second electrode, into the first electrode and the second electrode, with a predetermined split ratio, and may be configured to apply the split alternating-current power to each of the first electrode and the second electrode such that a magnetic field profile formed by the first electrode and the second electrode substantially coincides with a magnetic field profile formed by the third electrode.

In the plasma processing apparatus according to one aspect of the invention, the first frequency $\lambda 1$ may be 13.56 MHz. The second frequency $\lambda 2$ may be 2 MHz. The first high-frequency power source may apply the alternating-current power having the first frequency $\lambda 1$ to the first electrode and the second electrode. The second high-frequency power source may apply the alternating-current power having the second frequency $\lambda 2$ to the third electrode.

In the plasma processing apparatus according to one aspect of the invention, the outer electrode may include a plurality of parts stacked in an axis direction of a spiral shape.

A plasma processing method according to one aspect of the invention carries out plasma processing using the above-described plasma processing apparatus. The plasma processing method includes: generating plasma in the internal space by applying the alternating-current power having the first frequency $\lambda 1$ to the first electrode and the second electrode by use of the first high-frequency power source; controlling a space distribution of the plasma generated in the internal space by splitting the alternating-current power having the first frequency $\lambda 1$ into the first electrode and the second electrode with a predetermined split ratio by use of the power splitter; and increasing an electron density of the plasma by applying the alternating-current power having the second frequency $\lambda 2$ to the third electrode by use of the second high-frequency power source.

In the plasma processing method according to one aspect of the invention, in accordance with the processing gas to be introduced into the internal space of the chamber by the gas introduction part, the split ratio of the alternating-current power to be applied to the first electrode and the second electrode may be changed by the power splitter, and the space distribution of the plasma generated in the internal space may be thereby controlled.

In the plasma processing method according to one aspect of the invention, in a case in which the alternating-current power to be split by the power splitter and to be applied to the first electrode is defined as Winner, and the alternating-current power to be split by the power splitter and to be applied to the second electrode is defined as Wouter, the split ratio of the power splitter may be set so as to obtain a range of Winner:Wouter=0.5:0.5 to 0.1:0.9.

In the plasma processing method according to one aspect of the invention, the target object may be subjected to film formation processing using $SiF_4/O_2$ gas as the processing gas.

In the plasma processing method according to one aspect of the invention, in a case in which the alternating-current power to be split by the power splitter and to be applied to the first electrode is defined as Winner, and the alternating-current power to be split by the power splitter and to be applied to the second electrode is defined as Wouter, the split ratio of the power splitter may be set so as to obtain a range of Winner:Wouter=0.75:0.25 to 0.25:0.75.

In the plasma processing method according to one aspect of the invention, the target object may be subjected to film formation processing using $C_4F_8$ gas as the processing gas, or the target object may be subjected to etching processing using $SF_6/SiF_4/O_2$ gas as the processing gas.

In the plasma processing method according to one aspect of the invention, in a case in which the alternating-current power to be split by the power splitter and to be applied to the first electrode is defined as Winner, and the alternating-current power to be split by the power splitter and to be applied to the second electrode is defined as Wouter, the method may include: a first step of setting the split ratio of the power splitter so as to obtain a range of Winner:Wouter=0.5:0.5 to 0.1:0.9, using $SiF_4/O_2$ gas as the processing gas, and causing the target object to be subjected to film formation processing; a second step of setting the split ratio of the power splitter so as to obtain a range of Winner:Wouter=0.75:0.25 to 0.25:0.75, using $C_4F_8$ gas as the processing gas, and causing the target object to be subjected to film formation processing; and a third step of setting the split ratio of the power splitter so as to obtain a range of Winner:Wouter=0.75:0.25 to 0.25:0.75, using $SF_6/SiF_4/O_2$ gas as the processing gas, and causing the target object to be subjected to etching processing. The first step, the second step, and the third step may be sequentially carried out without breaking a vacuum state in the chamber.

A plasma processing apparatus according to one aspect of the invention includes: a chamber having a depressurizable internal space, the chamber being configured to carry out a plasma processing with respect to a target object in the internal space; an upper lid configured to be provided on an upper surface of the chamber, the upper lid being formed of a dielectric plate; a flat plate-shaped inner electrode disposed inside the chamber, the inner electrode being configured to receive the target object to be mounted thereon; a spiral-shaped outer electrode disposed outside the chamber, the outer electrode being disposed so as to face the inner electrode with the upper lid interposed therebetween; a plasma generating power source configured to apply alternating-current power having a predetermined frequency to the outer electrode; and a gas introduction part configured to introduce a processing gas into the internal space of the chamber. The outer electrode is separated in a radial direction of the outer electrode. The outer electrode includes a spiral-shaped first electrode, a spiral-shaped second electrode, and a spiral-shaped third electrode. The first electrode is disposed at a medial portion in the radial direction. The second electrode is disposed at an outer-peripheral portion in the radial direction. The third electrode is sandwiched between the first electrode and the second electrode in the radial direction. The plasma generating power source includes a first high-frequency power source, a second high-frequency power source, and a power splitter. The first high-frequency power source is configured to apply alternating-current power having a first frequency $\lambda 1$ to the first electrode and the second electrode. The second high-frequency power source is configured to apply alternating-current power having a second frequency $\lambda2$ to the third electrode. A relationship between the first frequency $\lambda1$ and the second frequency $\lambda2$ satisfies a relationship of $\lambda1>\lambda2$. The power splitter is configured to split the alternating-current power to be applied to the first electrode and the second electrode, into the first electrode and the second electrode, with a predetermined split ratio. The power splitter is configured to apply the split alternating-current power to each of the first electrode and the second electrode.

With the above-mentioned configuration, plasma is generated in the internal space of the chamber by the alternating-current power split by the power splitter and applied to the first electrode and the second electrode. Furthermore, an electron density of plasma increases by the alternating-current power applied to the third electrode located between the first electrode and the second electrode. Consequently, it is possible to carry out plasma processing with a high degree of dissociation of molecule of processing gas.

Accordingly, as the alternating-current power split by the power splitter is applied to the first electrode and the second electrode, plasma can be generated, and it is possible to obtain a desired space distribution of plasma. That is, it is possible to obtain a desired space distribution of plasma so as to correspond to a range defined by a region from a position of the first electrode to a position of the second electrode in a radial direction of the chamber. For example, it is possible to control a degree of generation state of plasma and a profile of the plasma generated in the radial direction of the chamber, and a degree of generation state of plasma and a profile of the plasma generated between the outer electrode and the inner electrode. At the same time, the control is achieved so as to obtain a probability function of a desired electron energy by the third electrode. That is, it is possible to heat a low-electron density plasma having a controlled spatial region. Because of this, it is possible to generate plasma in which both a plasma profile and a temperature is controlled, and it is possible to carry out a predetermined plasma processing.

Here, "a range defined by a region from a position of the first electrode to a position of the second electrode in a radial direction of the chamber" may mean a region from a position of the first electrode to a position of the second electrode in the radial direction, a region located inside the first electrode in the radial direction, or a region located outside the second electrode in the radial direction.

Additionally, "between the outer electrode and the inner electrode" may mean a region inside the chamber in a direction from the outer electrode to the inner electrode.

In the plasma processing apparatus according to one aspect of the invention, plasma having a space distribution controlled by the alternating-current power having the first frequency $\lambda1$ which is split into and applied to the first electrode and the second electrode is generated. An electron density of plasma is increased by the alternating-current power having the second frequency $\lambda2$ applied to the third electrode.

With the above-mentioned configuration, the magnetic field profile formed by the first electrode and the second electrode is adjusted by control of the split ratio of the power splitter functioning as a so-called an RF splitter. It is possible to control a spatial region in which plasma is generated. Furthermore, although plasma cannot be generated by only applying the alternating-current power having the second frequency $\lambda2$ to third electrode, plasma is generated by applying the alternating-current power having the second frequency $\lambda2$ to the third electrode in a state in which the alternating-current power having the first frequency $\lambda1$ is applied to the first electrode and the second electrode. In this case, the third electrode can apply oscillation to the generated plasma. For this reason, it is possible to increase a degree of electron density of the plasma.

In the plasma processing apparatus according to one aspect of the invention, the power splitter is configured to split the alternating-current power to be applied to the first electrode and the second electrode, into the first electrode and the second electrode, with a predetermined split ratio, and is configured to apply the split alternating-current power to each of the first electrode and the second electrode such that a magnetic field profile formed by the first electrode and the second electrode substantially coincides with a magnetic field profile formed by the third electrode.

With the above-mentioned configuration, the split ratio of the alternating-current power applied to the first electrode and the second electrode is controlled by the power splitter. Therefore, it is possible to control a plasma generation state between the first electrode and the second electrode, that is, not only at the position in the radial direction of the chamber but also at the position in an axis direction of the outer electrode. Here, "the axis direction of the outer electrode" is a direction along a center line of a concentric multi-circle in a case in which the spiral shape of the outer electrode approximates the concentric multi-circle. In other words, the axis direction of the outer electrode is parallel to a height direction of the chamber. Particularly, the axis direction of the outer electrode means a direction parallel to the direction in which the outer electrode and the inner electrode face each other.

In the plasma processing apparatus according to one aspect of the invention, the first frequency $\lambda1$ is 13.56 MHz. The second frequency $\lambda2$ is 2 MHz. The first high-frequency power source applies the alternating-current power having the first frequency $\lambda1$ to the first electrode and the second electrode. The second high-frequency power source applies the alternating-current power having the second frequency $\lambda2$ to the third electrode.

With the above-mentioned configuration, it is possible to generate plasma by the alternating-current power of 13.56 MHz, it is possible to set a plasma generation region (plasma creation region). Furthermore, it is possible to increase an electron density of plasma by the alternating-current power having the frequency of 2 MHz.

In the plasma processing apparatus according to one aspect of the invention, the outer electrode includes a plurality of parts stacked in an axis direction of a spiral shape.

With the above-mentioned configuration, at least part of the first electrode, the second electrode, and the third electrode includes a configuration in which a plurality of electrodes are stacked. In other words, the outer electrode includes an electrode stacked part. Consequently, it is possible to increase a magnetic field intensity generated by the plurality of the stacked electrodes. Accordingly, it is possible to suitably and easily control a space distribution of the magnetic field intensity in accordance with a purpose of processing carried out by the plasma processing apparatus. Note that, one or more of the first electrode, the second electrode, and the third electrode is selected, and the selected electrode may form a plurality of stacked electrodes. Additionally, one or more of the first electrode, the second electrode, and the third electrode is selected, and part of the selected electrode may form a plurality of stacked electrodes.

A plasma processing method according to one aspect of the invention carries out plasma processing using the above-described plasma processing apparatus. The plasma processing method includes: generating plasma in the internal space by applying the alternating-current power having the first frequency λ1 to the first electrode and the second electrode by use of the first high-frequency power source; controlling a space distribution of the plasma generated in the internal space by splitting the alternating-current power having the first frequency λ1 into the first electrode and the second electrode with a predetermined split ratio by use of the power splitter; and increasing an electron density of the plasma by applying the alternating-current power having the second frequency λ2 to the third electrode by use of the second high-frequency power source.

With the above-mentioned configuration, it is possible to generate plasma having a predetermined space distribution in the internal space of the chamber by adjusting the split ratio of the alternating-current power split by the power splitter. At the same time, it is possible to increase an electron density of plasma. Because of this, even in a case in which a plasma generation position varies depending on the types of processing gas to be applied to the internal space of the chamber or the like, it is possible to generate plasma in the same chamber so as to correspond to the plasma generation position. At the same time, even in a case in which an electron density varies depending on the conditions of the processing gas supplied to the internal space of the chamber, the conditions of the plasma processing carries out with respect to the target object, or the like, it is possible to generate plasma corresponding to various electron densities. Thus, the aforementioned effect is obtained by only controlling the alternating-current power applied to the first electrode, the second electrode, and the third electrode from the first high-frequency power source and the second high-frequency power source and controlling the gases supplied to the internal space of the chamber. That is, plasma processing using various types of gas or plasma processing under various conditions can be sequentially carried out with respect to the same target object by the same apparatus in a state in which replacement of the structures of the apparatus or the like is not necessary.

Consequently, in a case of carrying out processing required for a plurality of steps or the like with respect to a target object, it is possible to carry out a plurality of steps of the processing in a state in which a preferable profile of plasma processing, for example, an in-plane uniformity of the processed surface of the target object is maintained.

In the plasma processing method according to one aspect of the invention, in accordance with the processing gas to be introduced into the internal space of the chamber by the gas introduction par, the split ratio of the alternating-current power to be applied to the first electrode and the second electrode is changed by the power splitter, and the space distribution of the plasma generated in the internal space is thereby controlled.

With the above-mentioned configuration, the split ratio of the alternating-current power applied to the first electrode and the second electrode is controlled by the power splitter. Accordingly, a plasma state at the plasma generation position in the radial direction of the chamber can be controlled between the first electrode and the second electrode, that is, in a range defined by the region from the position of the first electrode to the position of the second electrode in the radial direction of the chamber. In other words, a plasma state at the plasma generation position in the radial direction of the chamber can be controlled at the region from the position of the first electrode to the position of the second electrode in the radial direction, at the region located inside the first electrode in the radial direction, and at the region located outside the second electrode in the radial direction.

Furthermore, for a plurality of gases that exhibit various reactivities in plasma processing, it is possible to form a magnetic field intensity having a space distribution corresponding to each of the plurality of gases. Because of this, even in a case in which a necessary space distribution of the magnetic field intensity varies depending on various types of gas, it is possible to obtain the magnetic field intensity having various space distributions so as to correspond to various types of gas, and it is possible to achieve the in-plane distribution having the required processing characteristics.

In the plasma processing method according to one aspect of the invention, in a case in which the alternating-current power to be split by the power splitter and to be applied to the first electrode is defined as Winner, and the alternating-current power to be split by the power splitter and to be applied to the second electrode is defined as Wouter, the split ratio of the power splitter is set so as to obtain a range of Winner:Wouter=0.5:0.5 to 0.1:0.9.

With the above-mentioned configuration, it is possible to increase the magnetic field intensity on the outer side in the radial direction of the chamber to be greater than the magnetic field intensity on the inner side in the radial direction of the chamber, so as to correspond to the aforementioned range of the split ratio. Therefore, the density of plasma generated at the region near the outer-peripheral portion in the radial direction of the chamber can be greater than the density of plasma generated at the region near the medial portion in the radial direction of the chamber.

For example, in a step of not carrying out power splitting, there is a case of using a gas that causes the result of lowering the processing characteristics of the outer-peripheral portion of the target object to be lower than the processing characteristics of the medial portion of the target object. In other words, in the film formation processing, there is a case of using a gas that causes the result of lowering the film thickness of the outer-peripheral portion of the target object to be thinner than the film thickness of the medial portion of the target object. In such a case, the film thickness of the target object in the radial direction can be uniform by setting the split ratio of the power splitter so as to obtain the aforementioned range.

In the plasma processing method according to one aspect of the invention, the target object is subjected to film formation processing using $SiF_4/O_2$ gas as the processing gas.

As the film formation processing, a CVD (chemical vapor deposition) method is used. With the above-mentioned configuration, in a case of forming a film containing silicon by the CVD method, it is possible to improve uniformity of the film thickness of the target object in the radial direction.

For example, there is a case of using a gas that causes the result that an electron density does not increase on the outer-peripheral portion in the radial direction of the chamber in comparison with the medial portion thereof. Furthermore, for example, there is a case of using a gas that causes the result that the gas is less easily dissociated on the outer-peripheral portion in the radial direction of the chamber in comparison with the medial portion thereof. In such a case, it is possible to improve uniformity of the film thickness of the target object in the radial direction by carrying out the aforementioned film formation processing.

In the plasma processing method according to one aspect of the invention, in a case in which the alternating-current power to be split by the power splitter and to be applied to the first electrode is defined as Winner, and the alternating-current power to be split by the power splitter and to be applied to the second electrode is defined as Wouter, the split ratio of the power splitter is set so as to obtain a range of Winner:Wouter=0.75:0.25 to 0.25:0.75.

With the above-mentioned configuration, it is possible to increase the magnetic field intensity on the outer side in the radial direction of the chamber to be greater than the magnetic field intensity on the inner side in the radial direction of the chamber, so as to correspond to the afore-mentioned range of the split ratio, or it is possible to reduce the magnetic field intensity on the outer side in the radial direction of the chamber to be lower than the magnetic field intensity on the inner side in the radial direction of the chamber. Furthermore, as the split ratio of the power splitter is set as described above, the density of plasma generated at a region close to the medial portion in the radial direction of the chamber can be balanced to the density of plasma generated at a region close to the outer-peripheral portion in the radial direction of the chamber. Moreover, it is possible to obtain a density gradient such that the plasma density gradually varies in a direction from the medial portion to the outer-peripheral portion.

For example, in a case of not carrying out power splitting, there is a case of using a gas that causes the result that the processing characteristics of the outer-peripheral portion of the target object are different from the processing charac-teristics of the medial portion of the target object. Addition-ally, for example, in the film formation processing, there is a case of using a gas that causes the result that the film thickness of the medial portion of the target object is different from the film thickness of the outer-peripheral portion of the target object. In such a case, the film thickness of the target object in the radial direction can be uniform by setting the split ratio of the power splitter so as to obtain the aforementioned range.

In the plasma processing method according to one aspect of the invention, the target object is subjected to film formation processing using $C_4F_8$ gas as the processing gas, or the target object is subjected to etching processing using $SF_6/SiF_4/O_2$ gas as the processing gas.

For example, in a step of not carrying out power splitting, there is a case of causing the result that the processing characteristics of the outer-peripheral portion of the target object and the processing characteristics of the medial portion of the target object vary. In such a case, the pro-cessing characteristics of the target object in the radial direction can be uniform by carrying out the film formation processing or the etching processing mentioned above. For example, as described above, it is possible to improve the in-plane uniformity of the etching depth of the target object in the etching processing. In an ashing processing, it is possible to improve the in-plane uniformity of the removal amount of the remaining product remaining on the target object. In the film formation processing, it is possible to improve the in-plane uniformity of the film thickness of the target object.

In the plasma processing method according to one aspect of the invention, in a case in which the alternating-current power to be split by the power splitter and to be applied to the first electrode is defined as Winner, and the alternating-current power to be split by the power splitter and to be applied to the second electrode is defined as Wouter, the method includes: a first step of setting the split ratio of the power splitter so as to obtain a range of Winner:Wouter=0.5:0.5 to 0.1:0.9, using $SiF_4/O_2$ gas as the processing gas, and causing the target object to be subjected to film formation processing; a second step of setting the split ratio of the power splitter so as to obtain a range of Winner:Wouter=0.75:0.25 to 0.25:0.75, using $C_4F_8$ gas as the pro-cessing gas, and causing the target object to be subjected to film formation processing; and a third step of setting the split ratio of the power splitter so as to obtain a range of Winner:Wouter=0.75:0.25 to 0.25:0.75, using $SF_6/SiF_4/O_2$ gas as the processing gas, and causing the target object to be subjected to etching processing. The first step, the second step, and the third step are sequentially carried out without breaking a vacuum state in the chamber.

With the above-mentioned configuration, when carrying out the plurality of the processing steps in the internal space of the same chamber while maintaining a sealing state of the chamber, the in-plane uniformity of the processing charac-teristics of the target object is maintained for each of the processing steps and the plurality of the processing steps can be sequentially carried out.

The above-described plasma processing method is appli-cable to, for example, an etching method of etching the target object. In this case, the etching method includes a mask pattern forming step, an etching step, and a resist protective film forming step. In the mask pattern forming step, it is possible to form a mask pattern on a resist layer made of a resin on the target object. In the etching step, the target object is etched via the resist layer having the mask pattern. In the resist protective film forming step, a resist protective film is formed on the resist layer. The etching step is repetitively carried out multiple times. After the etching steps are repetitively carried out multiple times, the resist protective film forming step is carried out.

Effects of the Invention

According to the invention, even in a case of carrying out the plurality of the processing steps different from each other, a profile of a plasma generation space or a plasma generation position is changed depending on each of the plurality of the processing steps, and it is possible to change or set a plasma state so as to sufficiently obtain a desired plasma profile or a desired plasma generation position. It is possible to provide the plasma processing apparatus and the plasma processing method which obtain a profile of a plasma generation space required for processing or a desired plasma generation position and further achieve a plasma condition such as an electron density or the like required for processing.

DETAILED DESCRIPTION OF THE INVENTION

Hereinafter, a plasma processing apparatus and a plasma processing method according to the embodiment of the invention will be described with reference to the drawings.

Figure 1:
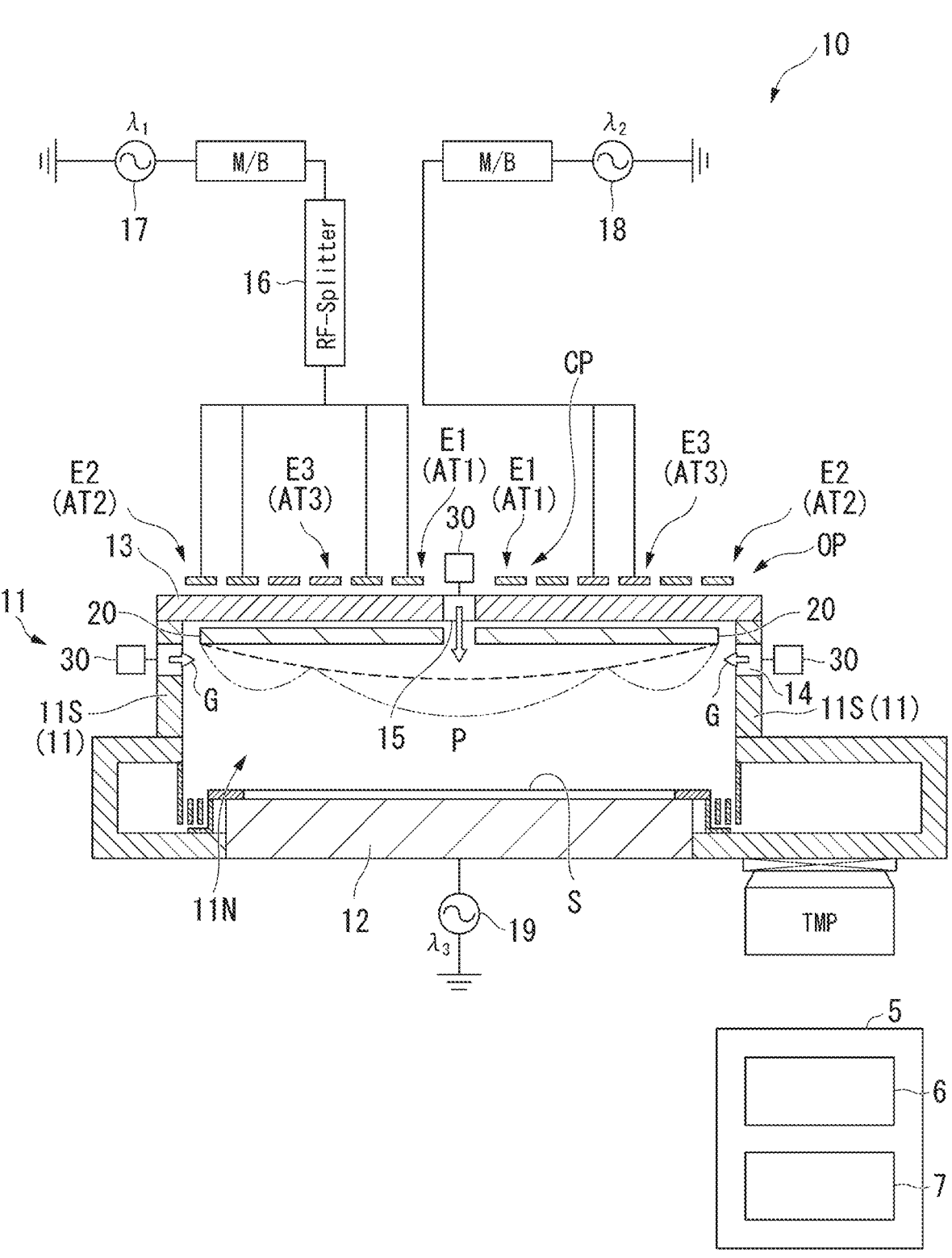
FIG. 1 is a schematic cross-sectional view showing a plasma processing apparatus according to an embodiment of the invention.
Figure 2:
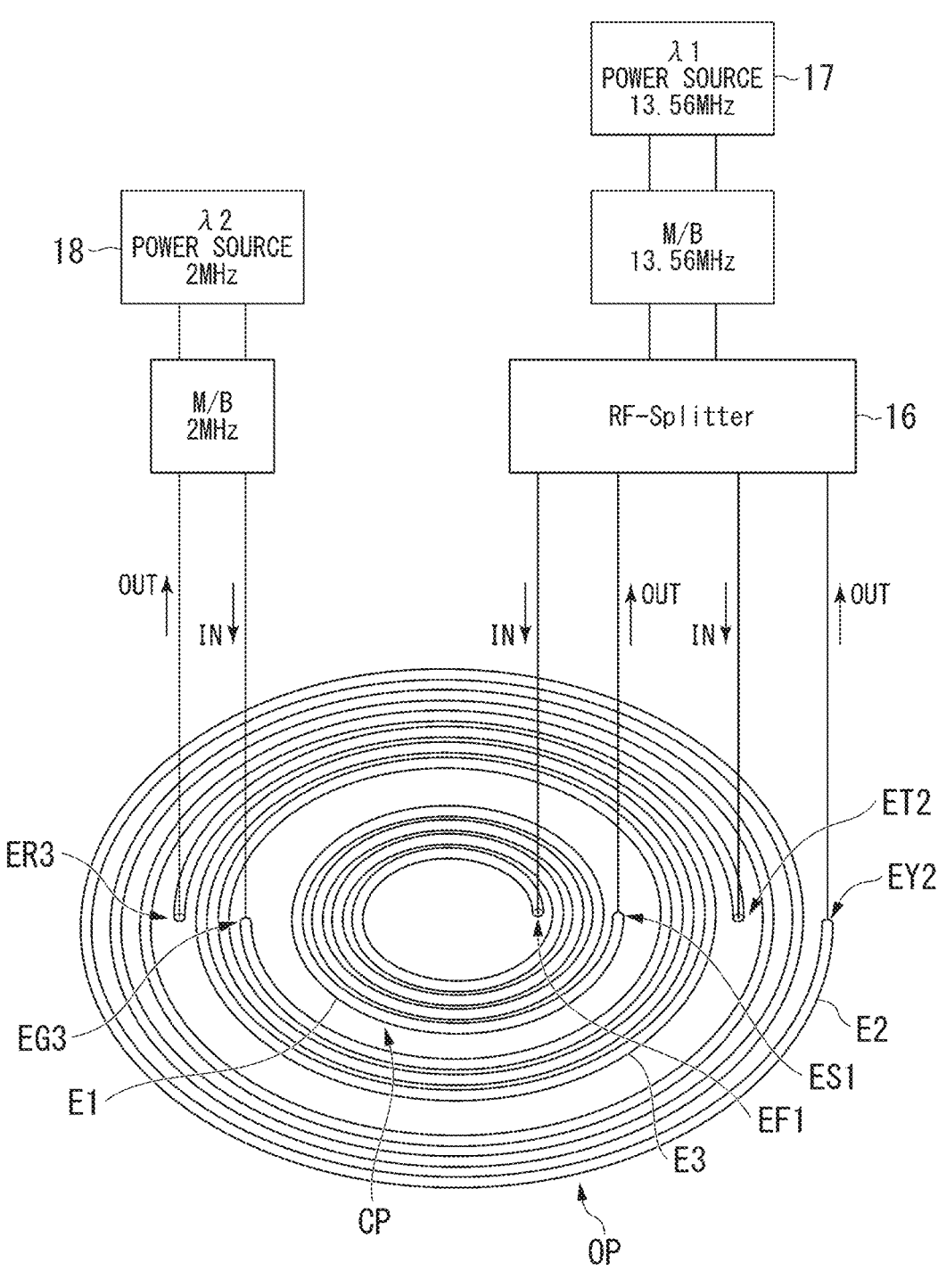
FIG. 2 is a schematic perspective view showing a first high-frequency power source, a second high-frequency power source, a power splitter, and an outer electrode which constitute the plasma processing apparatus according to the embodiment of the invention.

FIG. 1 is a schematic cross-sectional view showing a plasma processing apparatus according to the embodiment. In FIG. 1, reference numeral 10 represents the plasma processing apparatus. FIG. 2 is a schematic perspective view showing a first high-frequency power source, a second high-frequency power source, a power splitter, and an outer electrode which constitute the plasma processing apparatus 10 according to the embodiment. As shown in FIG. 2, in the plasma processing apparatus 10, a first spiral electrode is disposed at a medial portion CP in a radially inward direction, and a second spiral electrode is disposed at an outer-peripheral portion OP in a radially outward direction. A third spiral electrode is disposed between the first spiral electrode and the second spiral electrode in the radial direction. FIG. 2 shows a position of a power source. The power source is connected to each of the aforementioned three spiral electrodes.

As shown in FIGS. 1 and 2, the plasma processing apparatus 10 according to the embodiment includes, for example, a chamber 11 having a depressurizable internal space 11N. The pressure of the internal space 11N can be reduced by a vacuum pump device TMP. In the internal space 11N of the chamber 11, a substrate S (silicon substrate, target object) is subjected to plasma processing.

The plasma processing apparatus 10 includes: the hermetically sealable chamber 11; a flat plate-shaped inner electrode 12 (a substrate support and a substrate stage); an upper lid 13; a spiral-shaped first electrode E1 (antenna AT1) a spiral-shaped second electrode E2 (antenna AT2); a spiral-shaped third electrode E3 (antenna AT3); a gas introduction hole 14 (first gas introduction hole); a gas introduction hole 15 (second gas introduction hole); a power splitter 16 (RF splitter); a high-frequency power source 17 (plasma generating power source); a high-frequency power source 18 (plasma heating source); and a high-frequency power source 19 (bias power source); a gas introduction part 30. Note that, the meaning of the term "spiral-shaped" includes a concentric circle shape in which the number of windings is one. In the spiral-shape, the number of windings is not limited.

Figure 5:
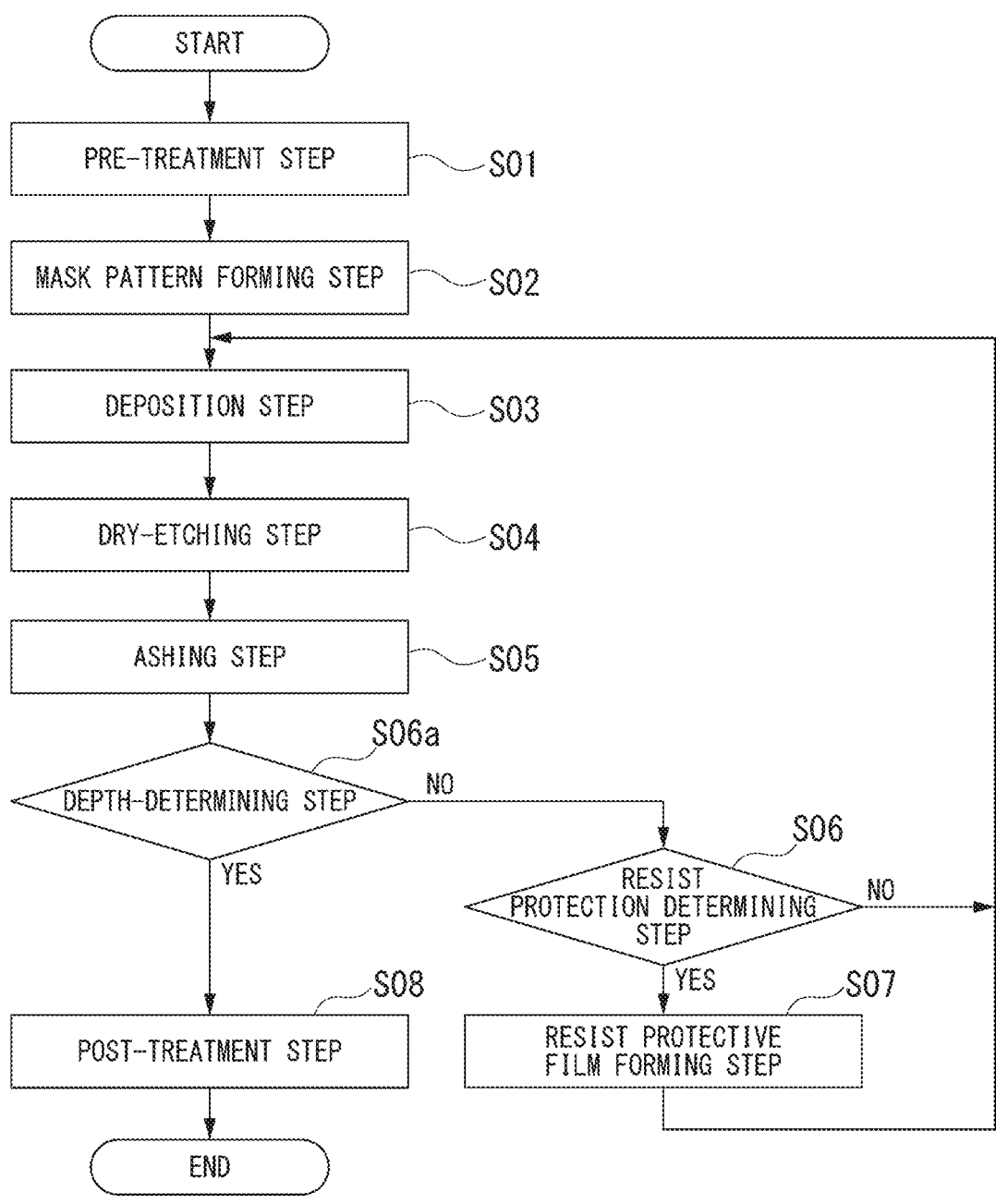
FIG. 5 is a flowchart showing plasma processing using the plasma processing method according to the Example of the invention.

The plasma processing apparatus 10 includes a controller 5. The controller 5 is, for example, a computer configured of a circuit board on which an electronic circuit is formed. The electronic circuit is, for example, Integrated Circuit such as a LSI (Large-scale Integrated Circuit) or ASIC (Application Specific Integrated Circuit). The controller 5 includes a recording medium 6 and a processor 7. In the recording medium 6, for example, a computer program that executes the steps of the flowchart shown in FIG. 5 is stored. The processor 7 is configured to process various information based on the steps shown in the flowchart. Therefore, the controller 5 comprehensively controls operation of the plasma processing apparatus 10 and executes each of steps of the plasma processing method of Example described below. For example, the controller 5 controls the operation of the members or devices such as the power splitter 16, the high-frequency power sources 17 and 18, the vacuum pump device TMP, or the like, which constitute the plasma processing apparatus 10.

The inner electrode 12 is disposed in the chamber 11. The inner electrode 12 is configured to receive the substrate S to be mounted thereon. The high-frequency power source 19 (third high-frequency power source) is configured to apply bias electric power having a frequency λ3 (third frequency) to the inner electrode 12.

The spiral-shaped first electrode E1 (outer electrode: antenna AT1), the spiral-shaped second electrode E2 (outer electrode: antenna AT2), and the spiral-shaped third electrode E3 (outer electrode: antenna AT3) are disposed outside the chamber 11.

The spiral-shaped first electrode E1, the spiral-shaped second electrode E2, and the spiral-shaped third electrode E3 are disposed so as to face the inner electrode 12 with the upper lid 13 interposed therebetween. The upper lid 13 is formed of a dielectric plate such as quartz or the like.

The spiral-shaped first electrode E1 is disposed at the medial portion CP along the upper lid 13. The spiral-shaped second electrode E2 is disposed at the outer-peripheral portion OP along the upper lid 13. In other words, the second electrode E2 is disposed outside the first electrode E1 in the radial direction. The spiral-shaped third electrode E3 is disposed at the position sandwiched between the spiral-shaped first electrode E1 and the spiral-shaped second electrode E2 in the radial direction of the chamber 11.

In the plasma processing apparatus 10, the gas introduction part 30 is connected to the chamber 11.

In the plasma processing apparatus 10, alternating-current power having the same first frequency λ1 is applied to both the first electrode E1 and the second electrode E2. A second frequency λ2 of the alternating-current power applied to the third electrode E3 is set lower than the first frequency λ1 of the alternating-current powers applied to the first electrode E1 and the second electrode E2. In other words, the first frequency λ1 of the alternating-current powers applied to the first electrode E1 and the second electrode E2 is high. The second frequency λ2 of the alternating-current power applied to the third electrode E3 is low. That is, in the plasma processing apparatus 10, a relationship between the first frequency λ1 and the second frequency λ2 satisfies a relationship of λ1>λ2.

The first electrode E1, the second electrode E2, and third electrode E3 which constitute the outer electrode may include a plurality of parts stacked in an axis direction of a spiral shape.

In other words, at least part of the first electrode E1, the second electrode E2, and the third electrode E3 includes a configuration in which a plurality of electrodes are stacked.

In other words, the outer electrode includes an electrode stacked part. Consequently, it is possible to increase a magnetic field intensity generated by the plurality of the stacked electrodes. Accordingly, it is possible to suitably and easily control a space distribution of the magnetic field intensity in accordance with a purpose of processing carried out by the plasma processing apparatus 10. Note that, one or more of the first electrode E1, the second electrode E2, and the third electrode E3 is selected, and the selected electrode may form a plurality of stacked electrodes. Additionally, one or more of the first electrode E1, the second electrode E2, and the third electrode E3 is selected, and part of the selected electrode may form a plurality of stacked electrodes.

The high-frequency power source 17 (first high-frequency power source) is configured to apply the alternating-current power having the first frequency λ1 to the first electrode E1 and the second electrode E2 (FIG. 1). As shown in FIG. 2, the first electrode E1 has a first portion EF1 and a second portion ES1. The first portion EF1 is disposed at the inner-peripheral end of the spiral-shaped first electrode E1. The high-frequency power is applied to the first portion EF1 from the first high-frequency power source 17. The second portion ES1 is disposed at the outer-peripheral end of the spiral-shaped first electrode E1. The second portion ES1 is connected to the ground. The first portion EF1 is located close to the center of the chamber 11 in the radial direction. The second portion ES1 is located close to the third electrode E3.

As shown in FIG. 2, the second electrode E2 has a third portion ET2 and a fourth portion EY2. The third portion ET2 is disposed at the inner-peripheral end of the spiral-shaped second electrode E2. The high-frequency power is applied to the third portion ET2 from the first high-frequency power source 17. The fourth portion EY2 is disposed at the outer-peripheral end of the spiral-shaped second electrode E2. The fourth portion EY2 is connected to the ground. The third portion ET2 is located close to the third electrode E3. The fourth portion EY2 is located at the outermost periphery in the radial direction of the chamber 11.

The high-frequency power source 18 (second high-frequency power source) is configured to apply the alternating-current power having the second frequency λ2 to the third electrode E3 (FIG. 1). As shown in FIG. 2, the third electrode E3 has a fifth portion EG3 and a sixth portion ER3. The fifth portion EG3 is disposed at the inner-peripheral end of the spiral-shaped third electrode E3. The high-frequency power is applied to the fifth portion EG3 from the second high-frequency power source 18. The sixth portion ER3 is disposed at the outer-peripheral end of the spiral-shaped third electrode E3. The sixth portion ER3 is connected to the ground. The fifth portion EG3 is located close to the first electrode E1. The sixth portion ER3 is located close to the second electrode E2.

The first high-frequency power source 17 applies the alternating-current power having the first frequency λ1 to the first electrode E1 and the second electrode E2, via the power splitter 16. The power splitter 16 is connected to the first high-frequency power source 17. The power splitter 16 is configured to split the high-frequency power supplied from the first high-frequency power source 17 into the first electrode E1 and the second electrode E2. The power splitter 16 can set a split ratio of the alternating-current powers applied to the first electrode E1 and the second electrode E2. The power splitter 16 includes a variable capacitor or the like and thereby has a configuration in which it is possible to set the split ratio of the electric power supplied to the first electrode E1 and the second electrode E2.

The second high-frequency power source 18 applies the alternating-current power having the second frequency λ2 to the third electrode E3.

In the plasma processing apparatus 10, the gas introduction part 30 is connected to the medial portion CP of the upper lid 13 or a side wall portion 11S of the chamber 11 (FIG. 1). The gas introduction part 30 is configured to introduce a predetermined processing gas G to the internal space 11N of the chamber 11 through the gas introduction hole 14 provided on the side wall portion 11S of the chamber 11 or through the gas introduction hole 15 provided on the medial portion CP of the upper lid 13. The gas introduction part 30 is configured to switch the kinds of the gas included in the processing gas G to be introduced into the internal space 11N of the chamber 11 and the flow rate (flow ratio) of each of a plurality of gases. In other words, the gas introduction part 30 is configured to adjust the conditions of the processing gas G depending on the processing type to be carried out in the plasma processing apparatus 10 and to supply the adjusted processing gas G to the internal space 11N.

Note that, the processing gas G to be introduced into the internal space 11N of the chamber 11 by the gas introduction part 30 may be a single gas or a mixed gas containing a plurality of kinds of gases mixed together.

Here, the gas introduction part 30 is configured to mix a plurality of gases different from each other so as to correspond to a plurality of plasma processing types different from each other and to introduce the processing gas G into the internal space 11N of the chamber 11. The gas introduction part 30 is configured to switch between the gas introduction into the internal space 11N through the gas introduction hole 14 and the gas introduction into the internal space 11N through the gas introduction hole 15. Furthermore, the gas introduction part 30 is configured to adjust the flow rate of the gas introduced into the internal space 11N through the gas introduction hole 14 and the flow rate of the gas introduced into the internal space 11N through the gas introduction hole 15. The gas introduction part 30 is configured to select one of the gas introduction hole 14 and the gas introduction hole 15 depending on the characteristics of the gas supplied to the internal space 11N, the characteristics of plasma generation, a space distribution of plasma, the processing characteristics of film formation, or the like. The gas introduction part 30 is configured to supply the selected gas to the internal space 11N. Moreover, the gas introduction part 30 is also configured to supply the gas to the internal space 11N from both the gas introduction hole 14 and the gas introduction hole 15. The gas introduction part 30 is also configured to adjust the flow ratio and the compositional ratio of the gas, or the like.

The plasma processing apparatus 10 includes a solid source 20 for sputtering disposed in the internal space 11N of the chamber 11. The solid source 20 is disposed at a position close to the upper lid 13 and at a position at which the solid source faces the inner electrode 12. Specifically, in the plasma processing apparatus 10, the region at which solid source 20 is disposed overlaps the second electrode E2 disposed on the outer-peripheral portion OP in vertical direction of the plasma processing apparatus 10.

In the plasma processing apparatus 10, the region at which the solid source 20 is disposed in the chamber 11 is located so as to overlap the first electrode E1, the third electrode E3, and the second electrode E2 in the vertical direction. The region at which the solid source 20 is disposed in the chamber 11 is located so as to cover the inner electrode 12. The solid source 20 is a body different from the upper lid 13.

In the embodiment, when supplying the processing gas from the gas introduction part 30 to the inside of the chamber 11, it is possible to reduce the pressure of the internal space 11N of the chamber 11 by the vacuum pump device TMP. The vacuum pump device TMP can discharge the gas present in the internal space 11N of the chamber 11.

In the plasma processing in the plasma processing apparatus 10, a predetermined processing gas G is introduced into the inside of the chamber 11 through the gas introduction hole 15 by the gas introduction part 30.

In the plasma processing apparatus 10, a magnetic field having a forming area defined at the position close to the upper lid 13 in the internal space 11N of the chamber 11 is generated by the first electrode E1 and the second electrode E2. Therefore, a magnetic field having a controlled space distribution in the chamber 11 is generated. Moreover, plasma P is heated by the third electrode E3, and a magnetic field that can increase an electron density of plasma is generated.

The magnetic fields formed in the internal space 11N by the electric power having frequencies different from each other generated by the first electrode E1, the second electrode E2, and the third electrode E3 are superimposed on each other.

In the plasma processing apparatus 10, due to the magnetic field generated by the first electrode E1 and the second electrode E2, the forming area is defined at the position close to the upper lid 13 in the internal space 11N of the chamber 11, and the plasma P having a controlled space distribution is generated in the chamber 11. Furthermore, due to the magnetic field generated by the third electrode E3, the plasma P is heated, and therefore the electron density increases.

Here, in the plasma processing in the plasma processing apparatus 10, the alternating-current power having the first frequency λ1 is applied to the first electrode E1 and the second electrode E2 by the first high-frequency power source 17. Consequently, plasma P is generated in the internal space 11N of the chamber 11.

When the first high-frequency power source 17 outputs high-frequency power, the high-frequency power of the first frequency λ1 output from the first high-frequency power source 17 is supplied to a parallel circuit formed by the two antennas, that is, the first electrode E1 and the second electrode E2 at the same time. In this situation, an output impedance of the first electrode E1 is matched to an input impedance of the load including the second electrode E2 by a first matching circuit of the matching box M/B for the antenna.

Furthermore, an output impedance of the first high-frequency power source 17 is matched to an input impedance of the load including the first electrode E1 and the second electrode E2 by a second matching circuit of the matching box M/B for the antenna.

At the same time, the amount of the electrical current flowing to the first electrode E1 and the amount of the electrical current flowing to the second electrode E2 are set with a predetermined split ratio by an output variable capacitor of the power splitter 16.

At this time, it is possible to set the generation region of the plasma P and the space distribution of the plasma P by setting the split ratio of the alternating-current powers applied to the first electrode E1 and the second electrode E2 from the first high-frequency power source 17.

Here, the power splitter 16 may set the magnetic field such that the space distribution of the magnetic field generated by the first electrode E1 and the second electrode E2 coincides with the space distribution of the magnetic field generated by the third electrode E3. Furthermore, the power splitter 16 can control a superimposed state of magnetic fields having frequencies different from each other in accordance with a characteristic distribution required for plasma processing to be carried out by the generated plasma P.

Figure 3:
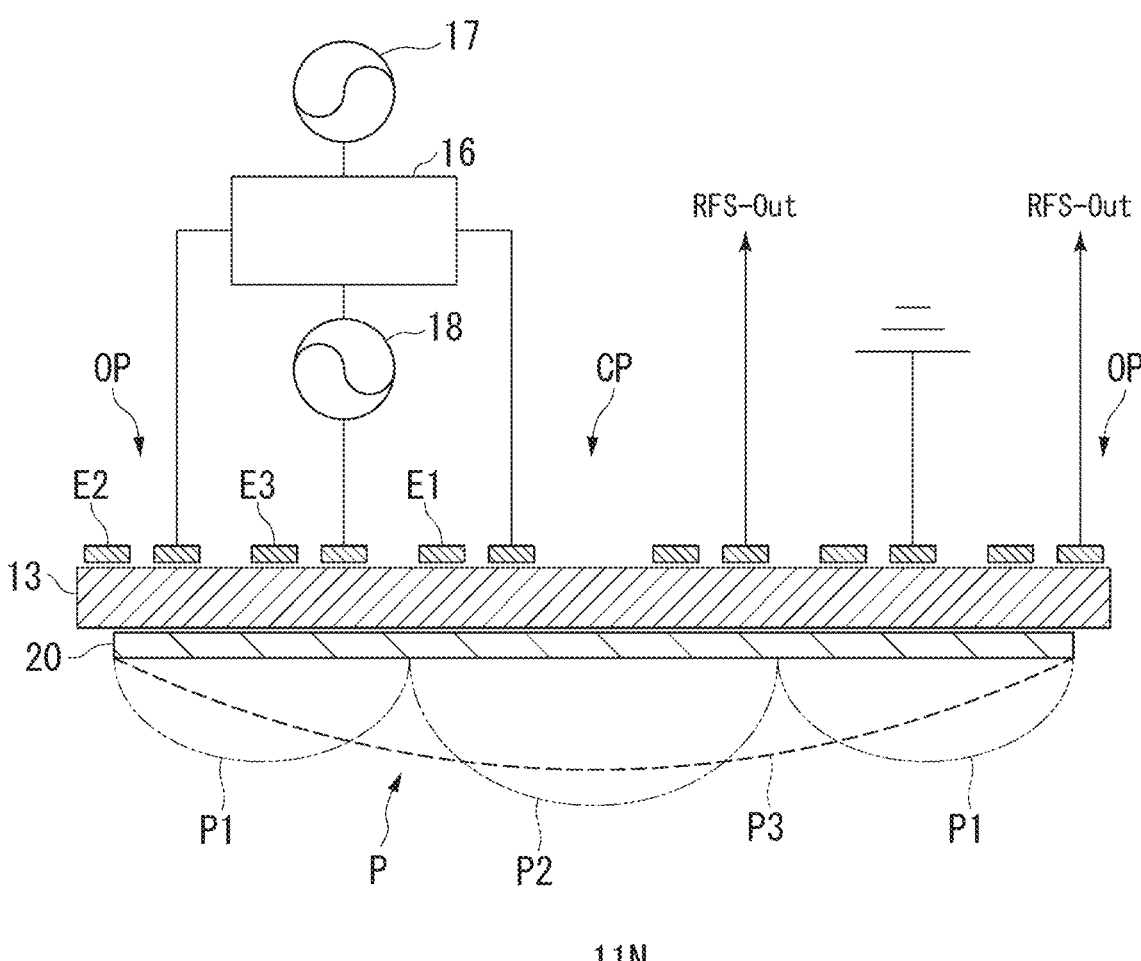
FIG. 3 is a schematic cross-sectional view explaining plasma generation in a plasma processing method according to the embodiment of the invention.

FIG. 3 a schematic cross-sectional view explaining plasma generation in a plasma processing method according to the embodiment Here, the split ratio controlled by the power splitter 16, that is, the split ratio of the alternating-current powers applied to the first electrode E1 and the second electrode E2 from the first high-frequency power source 17 will be described.

Specifically, as shown in FIG. 3, in a case in which the alternating-current power having the first frequency $\lambda 1$ applied to the first electrode E1 is higher than that of the second electrode E2, the intensity of the plasma P generated in the space located under the first electrode E1 is higher than that of the space located under the second electrode E2. This state is shown by reference numeral P1 in FIG. 3. That is, in the state, plasma P1 is mainly generated at the outer-peripheral portion OP in the radial direction of the chamber 11.

Here, the term "the intensity of the plasma P generated in the space is high" means at least one of:

(1) the density of the plasma P increases; and (2) the generation region of the plasma P becomes larger.

In contrast, as shown in FIG. 3, in a case in which the alternating-current power having the first frequency $\lambda 1$ applied to the second electrode E2 is higher than that of the first electrode E1, the intensity of the plasma P generated in the space located under the second electrode E2 is higher than that of the space located under the first electrode E1. This state is shown by reference numeral P2 in FIG. 3. That is, in the state, the plasma P2 is mainly generated at the medial portion CP in the radial direction of the chamber 11.

Moreover, as shown in FIG. 3, in a case in which alternating-current powers having the first frequency $\lambda 1$ applied to the first electrode E1 and the second electrode E2 are substantially equal to each other, the plasma P generated in both the space located under the first electrode E1 and the space located under the second electrode E2 are substantially uniformly distributed. This state is shown by reference numeral P3 in FIG. 3. That is, in the state, the plasma P3 is substantially uniformly generated in the radial direction of the chamber 11.

Here, the generation region of the plasma P is controlled by the power splitter 16 and is not set only by the split ratio of the alternating-current powers applied to the first electrode E1 and the second electrode E2. The space distribution of the plasma P varies depending on the processing gas G supplied to the internal space 11N.

This is because the characteristics of the gases are different from each other such as the gas type of the processing gas G, the mixture ratio of the gases, a degree of ease of gas ionization, or the like.

For example, even in a case of setting the split ratio of the power splitter 16 such that the alternating-current powers applied to the first electrode E1 and the second electrode E2 are equal to each other, a gas having the characteristics such that the electron density of the outer-peripheral portion OP in the radial direction does not increase as compared with that of the medial portion CP or such as being less easily dissociated can be used. In this case, plasma is easily generated at the medial portion CP in the radial direction of the chamber 11 as shown by the plasma P2.

For example, even in a case of setting the split ratio of the power splitter 16 such that the alternating-current powers applied to the first electrode E1 and the second electrode E2 are equal to each other, a gas having the characteristics such that the electron density of the medial portion CP in the radial direction does not increase as compared with that of the outer-peripheral portion OP or such as being less easily dissociated can be used. In this case, plasma is easily generated at the outer-peripheral portion OP in the radial direction of the chamber 11 as shown by the plasma P1.

In other words, in the direction (radial direction) in which the first electrode E1 and the second electrode E2 face each other, and in the peripheral regions of the first electrode E1 and the second electrode E2, a tendency of plasma on the generation region of the plasma P may vary depending on the kinds of the gas included in the processing gas supplied to the internal space 11N and a supply state of the processing gas. Even in this case, it is possible to control variations of the space distribution of plasma in the generation region of the plasma P, variations of the plasma intensity, variations of the plasma generation position, or the like by setting the split ratio of the alternating-current powers applied to the first electrode E1 and the second electrode E2 from the first high-frequency power source 17 by use of the power splitter 16 functioning as a so-called RF splitter.

Furthermore, in the plasma processing using the plasma processing apparatus 10, as described above, the power splitter 16 sets the split ratio of the alternating-current powers applied to the first electrode E1 and the second electrode E2 from the first high-frequency power source 17. Consequently, a desired space distribution in which the plasma P is generated is obtained, and the alternating-current power having the second frequency $\lambda 2$ is applied to the third electrode E3 by the second high-frequency power source 18. Accordingly, it is possible to increase the electron density of the plasma P.

Although plasma cannot be generated by only supplying the alternating-current power having the second frequency $\lambda 2$ to the third electrode E3, plasma is generated by applying the alternating-current power having the second frequency $\lambda 2$ to the third electrode E3 in a state in which the alternating-current powers having the first frequency $\lambda 1$ are supplied to the first electrode E1 and the second electrode E2. In this case, the third electrode E3 can apply vibration to electrons of the generated the plasma P. Because of this, a temperature condition in the plasma becomes higher, and it is possible to obtain a desired processing characteristics such as reactivity or the like in the plasma processing.

Figure 4:
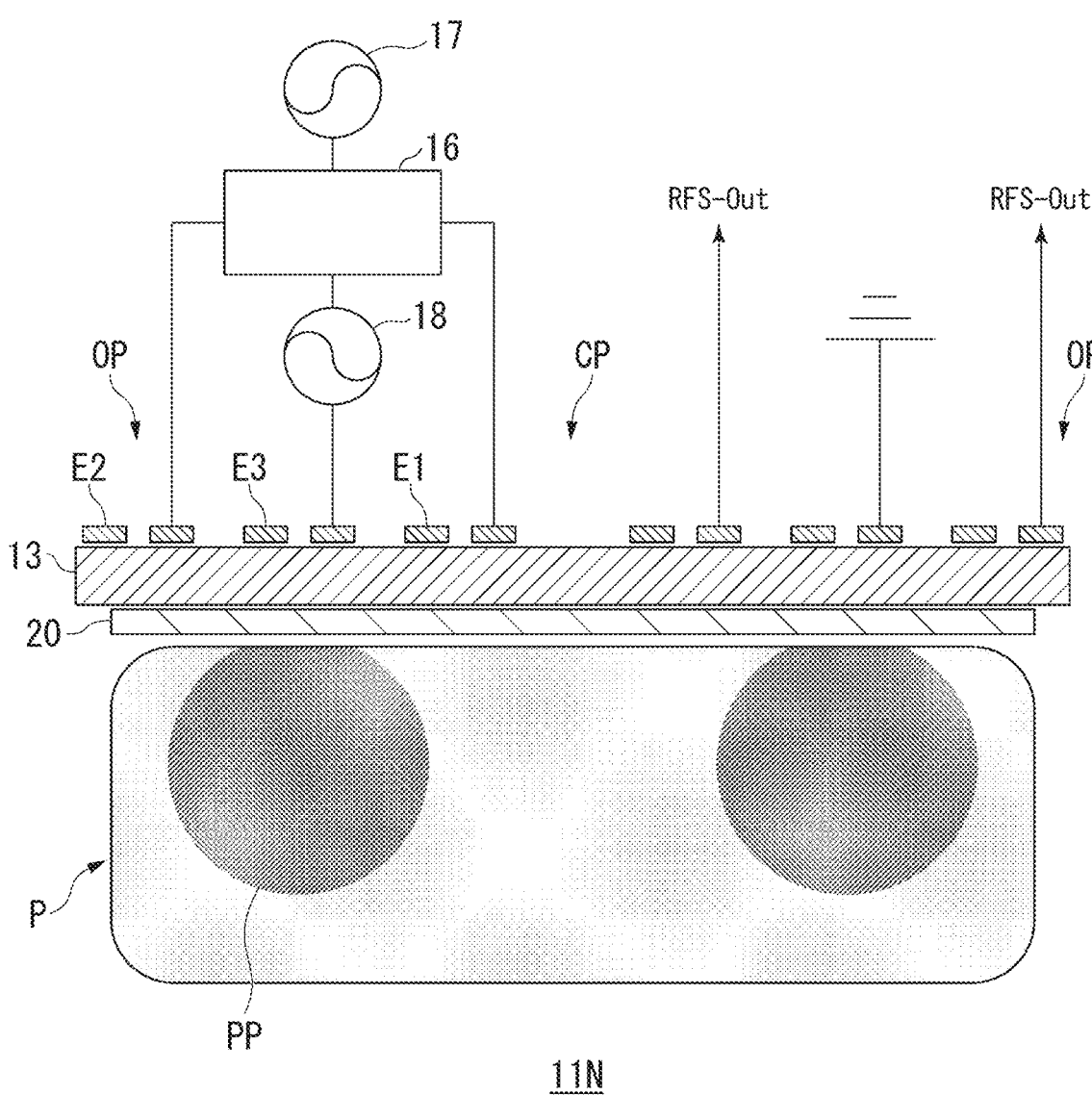
FIG. 4 is a schematic cross-sectional view explaining plasma generation in the plasma processing method accord-ing to the embodiment of the invention.

FIG. 4 is a schematic cross-sectional view explaining plasma generation in the plasma processing method.

Specifically, as shown by reference numeral PP in FIG. 4, as the second high-frequency power source 18 applies the alternating-current power having the second frequency $\lambda 2$ to the third electrode E3, the plasma P generated om the internal space 11N is further heated, and the electron density of plasma increases.

For this reason, even in a case of carrying out processing using the processing gas having the characteristics such that the electron density of the outer-peripheral portion OP located outside the medial portion CP in the radial direction of the chamber 11 does not increase or such as being less easily dissociated, it is possible to sufficiently carry out the processing in a state in which the electron density of plasma increases.

Furthermore, regarding the plasma profile, the space distribution of the generated plasma P becomes a predetermined state by setting the split ratio controlled by the power splitter 16, that is, the split ratio of the alternating-current powers applied to the first electrode E1 and the second electrode E2 from the first high-frequency power source 17. Therefore, it is possible to independently set only the electron density.

Moreover, in the plasma processing apparatus 10 according to the embodiment, a glass substrate, a quartz substrate, a silicon substrate, a MoSi substrate, a silicide substrate such as a SiC substrate, a resin substrate, or the like may be used as the substrate S. As the plasma processing method according to the embodiment, a dry-etching step, a deposition step (film formation step) associated with the dry-etching step, an ashing step, and an etching step continuous with the film formation step may be carried out. Additionally, the plasma processing method according to the embodiment may be used as steps of sequentially carrying out a plurality of plasma processing types with respect to the aforementioned substrate S.

Particularly, for example, the following steps may be adopted as the plasma processing method according to the embodiment.

(A) A dry-etching step of etching a silicon substrate using a fluorine compound.

(B) A deposition step of carrying out anisotropic plasma processing using a fluorocarbon gas such as $CHF_3$, $C_2F_6$, $C_2F_4$, $C_4F_8$, or the like.

(C) An ashing step of using $O_2$ gas.

(D) An etching step of using $SF_6$ or $NF_3$ as the etching gas, using $SiF_4$ as silicon compound in the etching gas, using $O_2$, $N_2$, $N_2O$, NO, $NO_x$, or $CO_2$ as a reactant, adding the reactant to the etching gas, and intensively etching holes or the like provided on a substrate.

Furthermore, the plasma processing method according to the embodiment can be applied to steps of sequentially or intermittently carrying out etching processing and film formation processing using various types of gas multiple times. However, conventionally, regarding the steps of sequentially or intermittently carrying out etching processing and film formation processing multiple times, there is a problem in that it is difficult to maintain not only the in-plane uniformity of the etching depth but also the in-plane uniformity of the film-formation rate of the film formation processing for each time.

In contrast, in the plasma processing method according to the embodiment, when the steps of sequentially or intermittently carrying out etching processing and film formation processing multiple times are carried out, the split ratio of the alternating-current powers applied to the first electrode E1 and the second electrode E2 is adjusted by the power splitter 16. Particularly, the split ratio varies depending on the gas supplied to the internal space 11N of the chamber 11 such that the in-plane distribution of the processing characteristics is uniform. Consequently, it is possible to obtain the uniformity of the processing along the processed surface of the substrate S.

Furthermore, in the plasma processing to be sequentially or intermittently carried out multiple times using various types of gas, the alternating-current power applied to the third electrode E3 may be varied. In this case, it is possible to obtain the uniformity of the processing characteristics along the processed surface of the substrate S by controlling a plasma temperature.

For example, the first frequency $\lambda 1$ of the alternating-current powers applied to the first electrode E1 and the second electrode E2 from the first high-frequency power source 17 may be set in a range of 10 MHz to 100 MHz. Particularly, the first frequency $\lambda 1$ may be set to be 13.56

MHz. Therefore, it is possible to excite plasma of the processing gas G supplied to the internal space 11N of the chamber 11. Furthermore, a plasma state such as a space distribution of the generated plasma P, a generation region of the plasma P, or the like can be set. Consequently, it is possible to utilize the alternating-current power having the first frequency $\lambda 1$ as power for plasma generation.

Additionally, the second frequency $\lambda 2$ of the alternating-current power applied to the third electrode E3 from the second high-frequency power source 18 may be set in a range of 0.1 MHz to 10 MHz. Particularly, the second frequency $\lambda 2$ may be 2 MHz. Accordingly, it is possible to further improve an excited state of plasma. For this reason, the probability function of the electron energy increases, and it is possible to increase the electron density.

The plasma processing method according to the embodiment can be applied to a case of forming a recess on a silicon substrate by a method complied with a so-called Bosch process. For example, in a case of carrying out a plurality of plasma processing types, for example, in a case of repetitively carrying out a processing cycle including a plurality of steps, various gases are used for each of the plurality of the plasma processing types. In this case, it is possible to maintain the in-plane uniformity of the plasma processing for each of the plurality of the processing steps. It is possible to obtain the desired processing characteristics.

Furthermore, as a plasma temperature is individually set and a plasma profile is individually set for each of the plurality of the plasma processing steps, it is possible to cause plasma to reach a deep position of the recess of the silicon substrate. Therefore, it is possible to maintain a preferable processing state.

EXAMPLES

Hereinbelow, Examples according to the invention will be described.

Here, as a specific example of a deposition-etching cycle processing with respect to a silicon substrate for a verification test of the plasma processing apparatus and the plasma processing method of the invention will be described.

FIG. 5 is a flowchart showing an etching method serving as a cycle processing according to the Example.

The etching method according to the Example is a silicon dry etching method of using a silicon substrate S as a target object and carrying out etching while protecting a resist made of resin or the like. Note that, as long as the etching can be carried out while protecting the resist, the etching method according to the Example is not limited to the etching method described below.

As shown in FIG. 5, the silicon dry etching method according to the Example includes a plurality of steps. The plurality of the steps constitute one cycle. The plurality of the steps are repetitively carried out, that is, a plurality of cycle processing steps is carried out. Consequently, a recess pattern VS and a recess pattern VL are formed on a surface of the silicon substrate S (refer to FIGS. 6 to 11).

The recess pattern VS has a diameter (size) of $\Phi S$. The recess pattern VL has a diameter (size) of $\Phi L$. The diameter $\Phi L$ may be set larger than the diameter $\Phi S$.

The depth of the recess pattern VS is the same as the depth of the recess pattern VL.

Each of the recess pattern VS and the recess pattern VL is formed in a shape with a high-aspect ratio, for example, in a range of approximately 4 to 8, more preferably in a range of approximately 8 to 14.

Note that, the recess pattern VS and the recess pattern VL may penetrate through the silicon substrate S.

As shown in FIG. 5, the silicon dry etching method according to the Example includes a pre-treatment step S01, a mask pattern forming step S02, a deposition step S03, a dry-etching step S04, an ashing step S05, a depth-determining step S06*a*, a resist protection determining step S06, a resist protective film forming step S07, and a post-treatment step S08.

In the pre-treatment step S01 shown in FIG. 5, the silicon substrate S is subjected to pretreatment by, for example, heat-treatment of 200° C. or more using a known lamp heater or the like.

Figure 6:
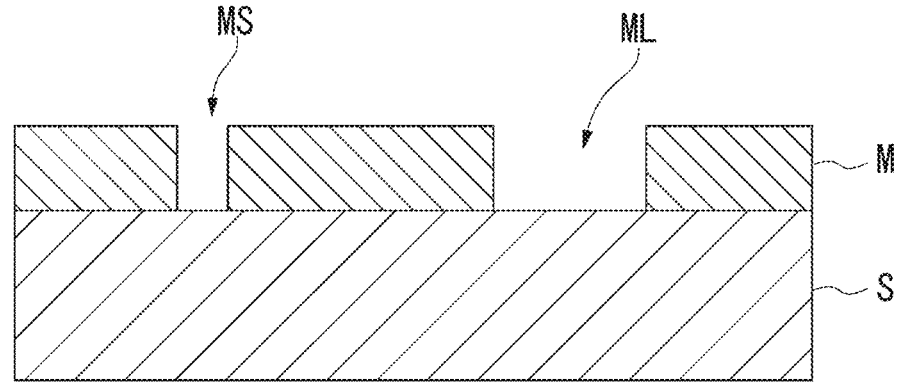
FIG. 6 is a cross-sectional view showing a step of the plasma processing method according to the Example of the invention.

FIG. 6 is a cross-sectional view showing a step of the silicon dry etching method according to the Example.

In the mask pattern forming step S02 shown in FIG. 5, a resist layer M having a pattern is formed on the surface of the silicon substrate S as shown in FIG. 6. The resist layer M is an example of a mask layer.

The resist layer M can be formed of a known resin resist. The resist layer M can be formed so as to have a predetermined thickness by appropriately selecting a positive resist, a negative resist, an exposure wavelength, or the like, or by selecting conditions such as deposition methods or the like. As a material used to form the resist layer M, for example, a photosensitive insulating material or other known materials may be used.

Moreover, in the mask pattern forming step S02, as shown in FIG. 6, an opening pattern MS and an opening pattern ML are formed on the resist layer M. The opening pattern MS is an opening pattern that sets a processing region so as to correspond to a shape of the recess pattern VS on the silicon substrate S. The opening pattern ML is an opening pattern that sets a processing region so as to correspond to a shape of the recess pattern VL on the silicon substrate S.

Specifically, in the mask pattern forming step S02, the resist layer M serving as a photoresist is formed on the silicon substrate S, and a treatment such as exposure, development, or the like is carried out. Furthermore, the resist layer M is subjected to a known treatment such as a wet etching treatment, a dry etching treatment, or the like. Accordingly, the resist layer M having the opening pattern MS and the opening pattern ML is formed on the silicon substrate S.

Figure 7:
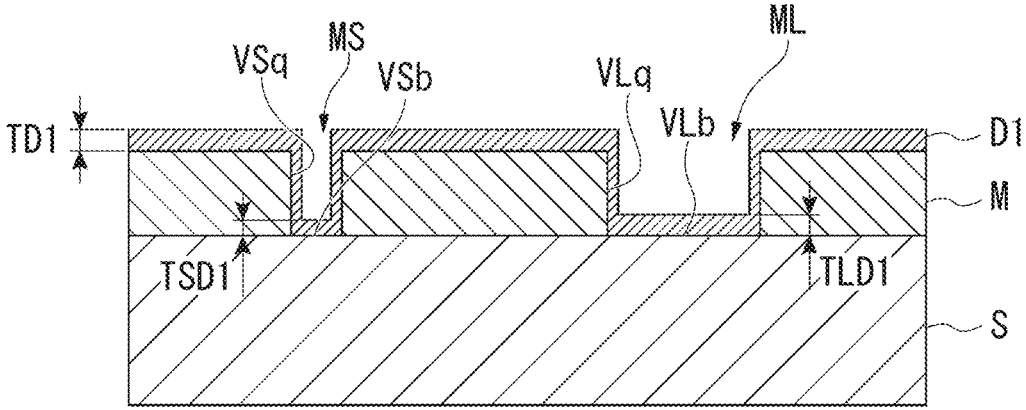
FIG. 7 is a cross-sectional view showing a step of the plasma processing method according to the Example of the invention.

FIG. 7 is a cross-sectional view showing a step of the silicon dry etching method according to the Example.

In the deposition step S03 shown in FIG. 7, a deposition layer D1 made of a polymer such as fluorocarbon or the like is formed on the entire surface of the silicon substrate S by anisotropic plasma processing as shown in FIG. 4. The deposition layer D1 protects side walls of the recess pattern VS and the recess pattern VL from being etched by the dry-etching step S04.

The deposition layer D1 is formed in order to protect the side walls VSq and VLq of the recess patterns VS and VL from being etched, respectively, and in order to limitedly carry out etching with respect to the bottom portions VSb and VLb of the recess patterns VS and VL, respectively. Consequently, the vertical side walls VSq and VLq are obtained in the dry-etching step S04, which is etching using a fluorine compound.

The deposition layer D1 is formed on the surface of the resist layer M and the bottom portions VSb and VLb of the recess patterns VS and VL. Although the deposition layer D1 coated on the side walls VSq and VLq of the recess patterns VS and VL, respectively, is shown in FIG. 7, practically, the deposition layer D1 is almost not formed on the side walls VSq and VLq.

In the deposition step S03, a plasma processing is carried out using a fluorocarbon gas such as $CHF_3$, $C_2F_6$, $C_2F_4$, $C_4F_8$, or the like. Here, a plasma processing apparatus 10 shown in FIGS. 1 and 2 described above is used.

When carrying out the deposition step S03 in the plasma processing apparatus 10, the high-frequency power of the first frequency λ1 is applied to the first electrode E1 and the second electrode E2. The high-frequency power of the second frequency λ2 is applied to the third electrode E3. The first frequency λ1 is set higher than the second frequency λ2. Particularly, the first frequency λ1 is 13.56 MHz. and the second frequency λ2 is 2 MHz. In the deposition step S03, the maximum value of the electric power having the first frequency λ2 and the maximum value of the electric power having the second frequency λ2 are the maximum values of the electric power outputtable from the high-frequency power sources 17 and 18, respectively. Accordingly, it is possible to improve the deposition rate.

Moreover, in the deposition step S03, the values of the alternating-current powers having the first frequency λ1 applied to the first electrode E1 and the second electrode E2 may be set lower than those of the dry-etching step S04 and the ashing step S05 described below. Additionally, in the plasma processing apparatus 10, a bias voltage may not be applied to the inner electrode 12.

In the atmosphere in which the deposition step S03 is carried out, a predetermined pressure is set, and a deposition process is carried out. Moreover, in the deposition step S03, for example, a noble gas such as Ar or the like may be added to a gas used in deposition processing at a predetermined amount.

Furthermore, in the deposition step S03, the alternating-current power having the first frequency λ1 output from the high-frequency power source 17 is split into the first electrode E1 and the second electrode E2 by the power splitter 16.

Therefore, it is possible to suppress variations in deposition rate of the deposition layer D1 in the radial direction. Here, the split ratio of the first electrode E1 and the second electrode E2 controlled by the power splitter 16 is set depending on the kinds of processing gas and the variations in the deposition rate.

Regarding the film thickness of the deposition layer D1 formed by the deposition step S03, the film thickness of the deposition layer D1 formed on the bottom portion VLb corresponding to the opening pattern ML having a large diameter becomes larger than the film thickness of the deposition layer D1 formed on the bottom portion VSb corresponding to the opening pattern MS having a small diameter. Note that, the film thickness of the deposition layer D1 formed on the bottom portion VLb of the opening pattern ML becomes equal to or smaller than the film thickness of the deposition layer D1 formed on the surface of the resist layer M located outside the opening patterns MS and ML.

That is, regarding the film thickness of the deposition layer D1, the film thicknesses gradually become smaller in the order of the film thickness TD1 of the deposition layer D1 formed on the surface of the resist layer M positioned outside the opening patterns MS and ML, the film thickness TLD1 of the deposition layer D1 formed on the bottom portion VLb of the opening pattern ML, and the film thickness TSD1 of the deposition layer D1 formed on the bottom portion VSb of the opening pattern MS.

In the deposition step S03, the deposition coverage of the deposition layer D1 of the bottom portions VSb and VLb corresponding to the opening patterns MS and ML, respectively, can be controlled so as to obtain optimized deposition coverage by setting deposition conditions as described above. Here, the preferred conditions for forming the deposition coverage are those that shorten a processing time required for causing the deposition layer D1 having a necessary film thickness to be formed on the bottom portions VSb and VLb. That is, the preferred conditions for forming the deposition layer D1 are those that increase the film-formation rate of the deposition layer D1 formed on the bottom portions VSb and VLb.

Additionally, the preferred conditions for forming the deposition coverage are those that control the deposition coverage depending on the etching depth and the aspect ratio. That is, even in a case in which the aspect ratios are changed depending on variations in the depths of the bottom portions VSb and VLb, it is possible to form the deposition layer D1 having a desired thickness at a predetermined film-formation rate.

Furthermore, the preferred conditions for forming the deposition coverage are those that improve uniformity and reliability with respect to the deposition layer D1 formed on the bottom portion VSb and improve uniformity and reliability with respect to the deposition layer D1 formed on the bottom portion VLb.

Figure 8:
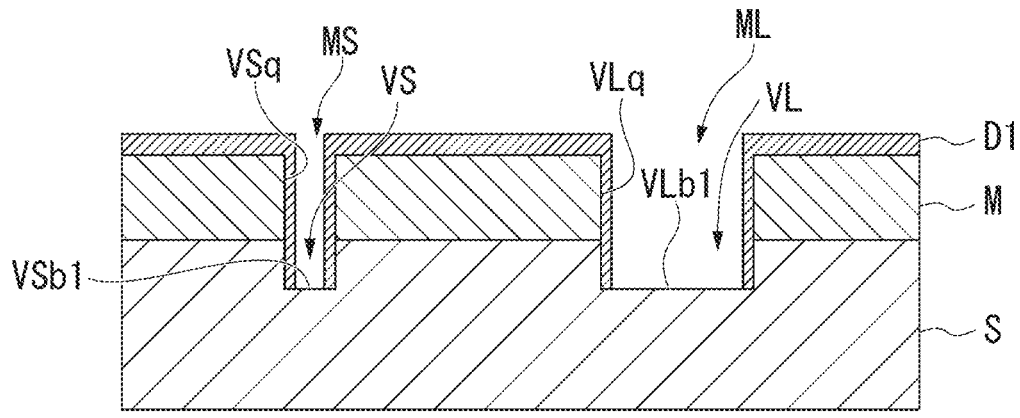
FIG. 8 is a cross-sectional view showing a step of the plasma processing method according to the Example of the invention.

FIG. 8 is a cross-sectional view showing a step of the silicon dry etching method according to the Example.

In the dry-etching step S04 shown in FIG. 5, the bottom portions VSb and VLb corresponding to the opening patterns MS and ML are etched by anisotropic plasma etching as shown in FIG. 8, the positions of the bottom portions VSb and VLb are lowered, and thereby the bottom portions VSb1 and VLb1 are formed.

In this situation, the depths of the bottom portion VSb1 corresponding to the opening pattern MS and the bottom portion VLb1 corresponding to the opening pattern ML formed by the dry-etching step S04 are uniform by adjusting the processing conditions of the dry-etching step S04, the plasma anisotropy thereof, and the difference between the film thickness of the deposition layers D1 formed by the deposition step S03.

Particularly, the film thickness TSD1 of the deposition layer D1 formed on the bottom portion VSb corresponding to the opening pattern MS is smaller than the film thickness TLD1 of the deposition layer D1 formed on the bottom portion VLb corresponding to the opening pattern ML. Moreover, the etching amount with respect to the bottom portion VSb corresponding to the opening pattern MS is smaller than the etching amount with respect to the bottom portion VLb corresponding to the opening pattern ML. Therefore, the film thickness of the deposition layer formed by the aforementioned deposition and the etching amount of the aforementioned etching are balanced. Accordingly, the depth of the bottom portion VSb1 corresponding to the opening pattern MS and the depth of the bottom portion VLb1 corresponding to the opening pattern ML are uniform.

Additionally, an effect of the etching with respect to the side walls VSq and VLq corresponding to the opening patterns MS and ML, respectively, is extremely reduced by adjusting the processing conditions of the dry-etching step S04, the plasma anisotropy thereof, and the deposition layer D1. For this reason, the side walls VSq and VLq are vertical to the surface of the silicon substrate S. Each of the side walls VSq and VLq has an even surface extending in the depth direction. Accordingly, the side walls VSq and VLq without irregularities are formed so as to extend in the depth direction.

That is, as the recess patterns VS and VL, the bottom portions VSb1 and VLb1 are formed so as to have a uniform diameter.

The plasma processing apparatus 10 shown in FIGS. 1 and 2 described above is used to generate plasma with high anisotropy in the dry-etching step S04 so as to achieve this shape.

When carrying out the dry-etching step S04 in the plasma processing apparatus 10, the high-frequency power of the first frequency $\lambda 1$ is applied to the first electrode E1 and the second electrode E2. The high-frequency power of the second frequency $\lambda 2$ is applied to the third electrode E3. The first frequency $\lambda 1$ is set higher than the second frequency $\lambda 2$. Particularly, the first frequency $\lambda 1$ is 13.56 MHz, and the second frequency $\lambda 2$ is 2 MHz.

Furthermore, in the dry-etching step S04, the alternating-current power having the first frequency $\lambda 1$ output from the high-frequency power source 17 is split into the first electrode E1 and the second electrode E2 by the power splitter 16.

Therefore, it is possible to suppress variations in etching rate with respect to the deposition layer D1 in the radial direction. Here, the split ratio of the first electrode E1 and the second electrode E2 controlled by the power splitter 16 is set depending on the kinds of processing gas and the variations in the etching rate.

Additionally, in the dry-etching step S04, the values of the alternating-current powers having the first frequency $\lambda 1$ applied to the first electrode E1 and the second electrode E2 may be set higher than those of the deposition step S03 or may be equal to those of the ashing step S05.

Moreover, in the dry-etching step S04, the values of the alternating-current powers having the first frequency $\lambda 1$ applied to the first electrode E1 and the second electrode E2 are set higher than the value of the alternating-current power having the second frequency $\lambda 2$ applied to the third electrode E3.

Furthermore, in the dry-etching step S04, it is preferable to apply the bias voltage having the frequency $\lambda 3$ to the inner electrode 12. The value of the frequency $\lambda 3$ may be set lower than the second frequency $\lambda 2$. The frequency $\lambda 3$ may be, for example, 400 kHz.

Furthermore, in the anisotropic plasma etching of the dry-etching step S04, a mixed gas of $SF_6$ and $O_2$ is decomposed by plasma, and anisotropic etching with respect to Si is carried out. For this reason, Si is etched by the F-radical generated due to decomposition of $SF_6$ ($F+Si \rightarrow SiF_4$). This etching reaction occurs in isotropic etching. In order to carry out anisotropic etching, the etching reaction with respect to the side walls VSq and VLq may be suppressed by forming an insulating layer (protective film) that adheres to the side walls VSq and VLq.

In the anisotropic plasma etching using the mixed gas of $SF_6/O_2$ in the dry-etching step S04, the deposition layer D1 is removed from the side walls VSq and VLq corresponding to the opening patterns MS and ML, respectively, and the side walls VSq and VLq are exposed.

Here, in the anisotropic plasma etching using the mixed gas of $SF_6/O_2$ in the dry-etching step S04, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, in the dry-etching step S04, $SiF_4$ can be used as an etching gas in order to prevent lack of the etching product of $SiF_4$.

Moreover, in the dry-etching step S04, $SF_6$ or $NF_3$ is used as an etching gas, $SiF_4$ serving as a silicon compound is added to the etching gas, and $O_2$, $N_2$, $N_2O$, NO, $NO_x$, or $CO_2$, which serves as a reactant, is added to the gas. Accordingly, the bottom portions VSb and VLb can be intensively etched.

Furthermore, in the dry-etching step S04, a substrate temperature during processing is lowered by using the inner electrode 12 that includes a cooling medium route thereinside and is provided with an electrostatic chuck, and therefore it is possible to increase a degree of anisotropy. For example, the temperature of a cooling medium flowing to the cooling medium route is set to be lower than or equal to 10° C.

Figure 9:
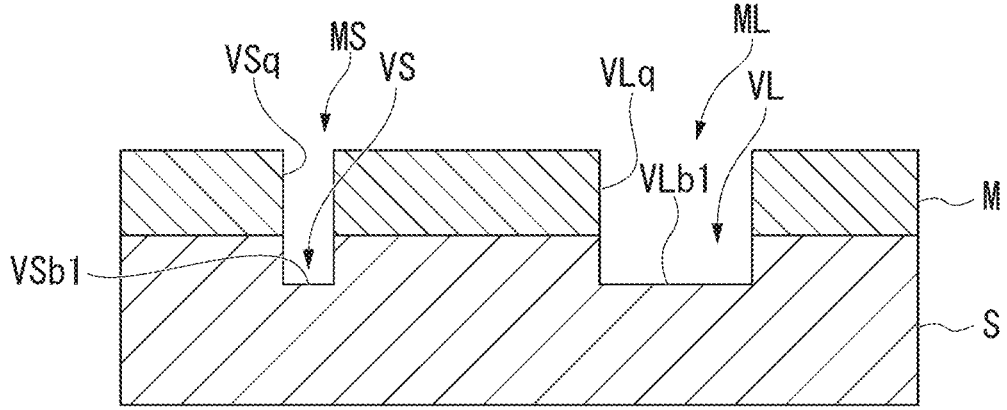
FIG. 9 is a cross-sectional view showing a step of the plasma processing method according to the Example of the invention.

FIG. 9 is a cross-sectional view showing a step of the silicon dry etching method according to the Example.

In the ashing step S05 shown in FIG. 5, the remaining deposition layer D1 is removed after the dry-etching step S04 is completed as shown in FIG. 9.

Particularly, in the ashing step S05, ashing conditions are set so as to reliably remove the deposition layer D1 that remains on the region close to the inner-peripheries of the opening pattern MS and the opening pattern ML of the resist layer M.

In the ashing step S05, after the dry-etching step S04 is completed, the deposition layer D1 adhered to the surface of the resist layer M, the deposition layer D1 that remains on the region close to the inner-peripheries of the opening pattern MS and the opening pattern ML of the resist layer M. and the deposition layers D1 that remain on the side walls VSq and VLq corresponding to the opening patterns MS and ML, respectively, are removed. Furthermore, in a case in which the deposition layer D1 remains on the bottom portion VSb1 corresponding to the opening pattern MS and the deposition layer D1 remains on the bottom portion VLb1 corresponding to the opening pattern ML, the remaining deposition layers are removed.

In the ashing step S05, the deposition layer D1 that remains on the inner-periphery positions of the opening pattern MS and the deposition layer D1 that remains on the inner-periphery positions of the opening pattern ML are not completely removed and thereby may still remain. As described below, the presence of the remaining product is not preferable. Particularly, in cycles (first cycle, second cycle cyclic, or the like) of repetitively carrying out a plurality of steps including the deposition step S03, the dry-etching step S04, and the ashing step S05, a deposition layer D2 may be further deposited on the remaining deposition layer D1 by carrying out the deposition step S03 of the second cycle. In this case, the opening diameters (opening spaces) of the opening pattern MS and the opening pattern ML of the resist layer M decrease.

As described above, in a case in which the opening diameters of the opening pattern MS and the opening pattern ML of the resist layer M decrease, even where the etching with a high degree of anisotropy is carried out in the dry-etching step S04 of the second cycle carried out next to the ashing step S05 of the first cycle, the deposition layer D1 and the deposition layer D2 inhibit the etching plasma from reaching the bottom portion VSb1 and the bottom portion VLb1. Accordingly, there is a possibility that the etching with respect to the bottom portion VSb1 and the bottom portion VLb1 is not carried out. For this reason, the side walls VSq and VLq corresponding to the opening patterns MS and ML, respectively, are not vertical, and therefore there is possibility that the shapes of the recess patterns VS and VL each become a tapered shape.

In contrast, in a state in which the deposition layer D1 does not remain at the inner-periphery position of the opening pattern MS and the deposition layer D1 does not remain at the inner-periphery position of the opening pattern ML, the deposition layer D2 is not further deposited on the remaining deposition layer D1 in the deposition step S03 of the second cycle carried out next to the first cycle. For this reason, the shapes of the openings of the opening pattern MS and the opening pattern ML can be maintained such that each of the opening diameters (opening spaces) of the opening pattern MS and the opening pattern ML of the resist layer M has a predetermined size.

Thereafter, in the dry-etching step S04 of the second cycle, as a result of carrying out the etching with a high degree of anisotropy, reach of the etching plasma to the bottom portion VSb1 and the bottom portion VLb1 is not inhibited by the deposition layer D1 and the deposition layer D2. Consequently, the etching with respect to the bottom portion VSb1 and the bottom portion VLb1 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape. It is possible to form each of the recess patterns VS and VL so as to have a uniform diameter in the depth direction with a high-aspect ratio.

In the ashing step S05 of the first cycle, as described above, it is necessary to carry out the plasma processing with a high degree of ionization to the $O_2$ gas used in order to reliably remove the deposition layer D1 that remains on the inner-periphery positions of the opening patterns MS and ML. Therefore, also in the ashing step S05 of the first cycle, the plasma processing apparatus 10 shown in FIGS. 1 and 2 is used.

In this situation, when carrying out the ashing step S05 of the first cycle in the plasma processing apparatus 10, the high-frequency power of the first frequency λ1 is applied to the first electrode E1 and the second electrode E2. The high-frequency power of the second frequency λ2 is applied to the third electrode E3. The first frequency λ1 is set higher than the second frequency λ2. Particularly, the first frequency λ1 is 13.56 MHz, and the second frequency λ2 is 2 MHz.

Furthermore, in the ashing step S05, the alternating-current power having the first frequency λ1 output from the high-frequency power source 17 is split into the first electrode E1 and the second electrode E2 by the power splitter 16.

Therefore, it is possible to suppress variations in ashing rate of the deposition layer D1 in the radial direction. Here, the split ratio of the first electrode E1 and the second electrode E2 controlled by the power splitter 16 is set depending on the kinds of processing gas and the variations in the ashing rate.

Moreover, in the ashing step S05 of the first cycle, the values of the alternating-current powers having the first frequency λ1 applied to the first electrode E1 and the second electrode E2 may be set higher than those of the deposition step S03, or may be set equal to or higher than those of the dry-etching step S04.

Furthermore, in the ashing step S05 of the first cycle, the values of the alternating-current powers having the first frequency λ1 applied to the first electrode E1 and the second electrode E2 may be set the value of the alternating-current power having the second frequency λ2 applied to the third electrode E3.

Additionally, in the ashing step S05 of the first cycle, to the inner electrode 12, it is preferable to apply the bias voltage having the frequency λ3 to the inner electrode 12. The value of the frequency λ3 may be set lower than that of the second frequency λ2 of the alternating-current power applied to the third electrode E3. The value of the bias voltage of the ashing step S05 of the first cycle may be set equal to the value of the bias voltage of the dry-etching step S04 of the first cycle or may be set higher than the value of the bias voltage of the dry-etching step S04 of the first cycle.

In the ashing step S05 of the first cycle, it is possible to carry out the ashing by supply of $O_2$ gas. According to the anisotropic plasma processing using the $O_2$ gas, the deposition layer D1 is reliably removed and the side walls VSq and VLq are exposed at the regions close to the inner-peripheral portions of the opening patterns MS and ML, and the side walls VSq and VLq corresponding to the opening patterns MS and ML, respectively. At the same time, the ashing is carried out by supply of $O_2$ gas in the ashing step S05 of the first cycle. In this step, the resist layer M made of a resin is slightly removed, and therefore the film thickness of the resist layer M may decrease.

As shown in FIG. 5, the silicon dry etching method according to the Example carries out the deposition step S03, the dry-etching step S04, the ashing step S05, the depth-determining step S06a, and the resist protection determining step S06.

In other words, the deposition step S03, the dry-etching step S04, the ashing step S05, the depth-determining step S06a, and the resist protection determining step S06 form one cycle (one process cycle). This cycle may be referred to as "repetitive cycle". Additionally, this cycle may be referred to as "substrate-processing cycle". In the Example, this cycle is repeated multiple times at a predetermined frequency. In other words, the dry-etching step S04 is repetitively carried out multiple times. Since one cycle includes the etching step, the cycle may be referred to as etching cycle.

After this cycle is completed, the resist protective film forming step S07 may be carried out in accordance with the determination result of the depth-determining step S06a. In other words, after the dry-etching step S04 is repetitively carried out multiple times, the resist protective film forming step S07 may be carried out.

Consequently, in the silicon dry etching method according to the Example, not only it is possible to cause the depths of the recess patterns VS and VL to be larger by the steps S03, S04, and S05, but also it is possible to carry out the determination of the depths of the recess patterns VS and VL and the determination as to whether or not a resist protective film is necessary.

In the depth-determining step S06a, it is determined whether to proceed to the subsequent resist protection determining step S06. At this time, regarding the determination standard of the depth-determining step S06a, determination in accordance with the depths of the recess patterns VS and VL is carried out. In other words, the determination in accordance with the aspect ratio of the recess patterns VS and VL is carried out.

When it is determined that the depths of the recess patterns VS and VL are not sufficient in the depth-determining step S06a (determination result: NO), it is determined that the etching step of the subsequent cycle is necessary, and the step proceeds to the resist protection determining step S06. In the resist protection determining step S06, it is determined whether to proceed to the resist protective film forming step S07 described below.

On the other hand, when it is determined that the depths of the recess patterns VS and VL are sufficient in the depth-determining step S06a (determination result: YES), the etching is completed, and the step proceeds to the post-treatment step S08.

In the resist protection determining step S06, it is determined whether the subsequent cycle including the etching step is carried out without carrying out the resist protective film forming step S07 or whether the step proceeds to the resist protective film forming step S07 described below.

Here, regarding the determination standard of the resist protection determining step S06, the determination in accordance with the depths of the recess patterns VS and VL is carried out.

When it is determined that the depths of the recess patterns VS and VL are not sufficient (determination result: NO), the step proceeds to the deposition step S03 for the first step of the subsequent cycle.

The reason that the subsequent cycle is carried out without carrying out the resist protective film forming step S07 is as follows.

When the depths of the recess patterns VS and VL are not sufficient, when a resist protective film Mm is formed by proceeding to the resist protective film forming step S07 described below, it is conceivable that a defect occurs. Specifically, in the resist protective film forming step S07, the resist protective film Mm is formed not only on the top surface of the resist layer M but also on the bottom portions VSb and VLb of the opening patterns MS and ML. When the resist protective film Mm is formed on the bottom portions VSb and VLb of the opening patterns MS and ML, there is a possibility that an undesirable effect of etching affects to the silicon substrate S such that etching does not progress or the like on the bottom portions VSb and VLb.

Regarding the determination standard of the resist protection determining step S06, the determination in accordance with the depths of the recess patterns VS and VL is carried out. In other words, the determination in accordance with the aspect ratio of the recess patterns VS and VL is carried out. Particularly, when the aspect ratio of the recess patterns VS and VL is, for example, in a range of approximately 1 to 2 (determination result: NO), the subsequent cycle including the etching step is carried out.

When the aspect ratio of the recess patterns VS and VL is in a range of approximately 3 to 4 (determination result: YES), the step proceeds to the resist protective film forming step S07 described below. That is, determination of the resist protection determining step S06 is carried out in accordance with the opening spaces of the recess patterns VS and VL and the etching amounts of the bottom portions VSb and VLb by the etching step of the first cycle.

In other cases, the determination of the resist protection determining step S06 may be based on the measurement result obtained by measuring the depths of the recess patterns VS and VL of the silicon substrate S after the first cycle is carried out. Additionally, in the determination of the resist protection determining step S06, an estimation of the etching conditions of the first cycle is carried out, and it may be determined whether to proceed to the second cycle. The determination based on the etching conditions may be based on the setting corresponding to the etching depth obtained by a predetermined condition in advance.

Next, a case of carrying out the second cycle without carrying out the resist protective film forming step S07 will be described.

Figure 10:
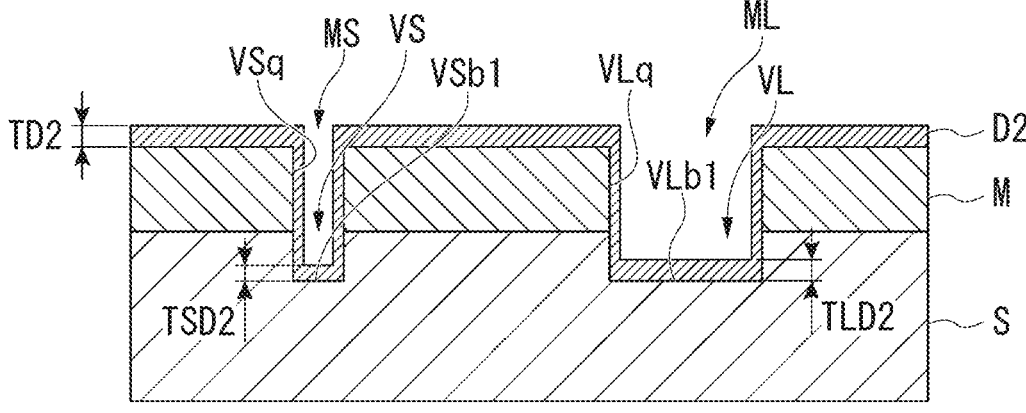
FIG. 10 is a cross-sectional view showing a cycle etching step of the plasma processing method according to the Example of the invention.

FIG. 10 is a cross-sectional view showing a step of the silicon dry etching method according to the Example.

The deposition step S03 of the second cycle shown in FIG. 5 is carried out after the determination based on the depth-determining step S06a and the resist protection determining step S06 of the first cycle is carried out. In the deposition step S03 of the second cycle, a deposition layer D2 made of a polymer such as fluorocarbon or the like is formed on the entire surface of the silicon substrate S by anisotropic plasma processing as shown in FIG. 10. It is possible to protect the side walls of the recess pattern VS and the recess pattern VL from being etched by the dry-etching step S04 to be carried out after the deposition step S03 of the second cycle.

The deposition layer D2 is formed in order to protect the side walls VSq and VLq of the recess patterns VS and VL from being etched, respectively, and in order to limitedly carry out etching with respect to the bottom portions VSb1 and VLb1 of the recess patterns VS and VL, respectively. Therefore, in the dry-etching step S04 to be carried out after the deposition step S03 of the second cycle, vertical side walls VSq and VLq are obtained by carrying out etching using a fluorine compound.

The deposition layer D2 is formed on the surface of the resist layer M and the bottom portions VSb1 and VLb1 of the recess patterns VS and VL. Although the deposition layer D2 coated on the side walls VSq and VLq of the recess patterns VS and VL, respectively, is shown in FIG. 10, practically, the deposition layer D2 is almost not formed on the side walls VSq and VLq.

The deposition step S03 of the second cycle is the same as the deposition step S03 of the first cycle. An anisotropic plasma processing is carried out using a fluorocarbon gas. In the deposition step S03 of the second cycle, the plasma processing apparatus 10 shown in FIGS. 1 and 2 described above is used in a similar way to the case of the deposition step S03 of the first cycle as described above.

Regarding the processing conditions of the plasma processing apparatus 10 such as the first frequency λ1, the second frequency λ2, the pressure of the internal space 11N, or the like, the processing conditions of the deposition step S03 of the second cycle may be set the same as those of the deposition step S03 of the first cycle. Here, the processing conditions of the deposition step S03 of the subsequent cycle after the second cycle may be set the same as or different from those of the deposition step S03 of the first cycle.

Moreover, the deposition step S03 of the second cycle is the same as the deposition step S03 of the first cycle. The alternating-current power having the first frequency λ1 output from the high-frequency power source 17 is split into the first electrode E1 and the second electrode E2 by the power splitter 16.

Therefore, it is possible to suppress variations in deposition rate of the deposition layer D2 in the radial direction. Here, the split ratio of the first electrode E1 and the second electrode E2 controlled by the power splitter 16 is set depending on the kinds of processing gas and the variations in the deposition rate. Furthermore, the split ratio of the deposition step S03 of the second cycle may be equal to or different from that of the deposition step S03 of the first cycle.

Note that, the setting of the deposition step S03 of the second cycle may be different from the setting of the deposition step S03 of the first cycle. For example, the setting of the deposition step S03 of the second cycle may be adjusted in order to prevent reduction of the deposition rate for forming the bottom portions VSb1 and VLb1 of the recess patterns VS and VL. Specifically, the alternating-current powers having the first frequency λ1 applied to the first electrode E1 and the second electrode E2 or the alternating-current power having the second frequency λ2 applied to the third electrode E3 may be higher than those of the deposition step S03 of the first cycle. Furthermore, both the alternating-current power having the first frequency λ1 and the alternating-current power having the second frequency λ2 may be higher than those of the deposition step S03 of the first cycle. Additionally, the processing condition for applying the bias voltage to the inner electrode 12 may be adopted in order to attract deposition particles to the recess pattern VS and the recess pattern VL.

The film thickness of the deposition layer D2 formed by the deposition step S03 of the second cycle is the same as that of the deposition step S03 of the first cycle. The film thickness of the deposition layer D2 formed on the bottom portion VLb1 corresponding to the opening pattern ML having the large diameter becomes larger than the film thickness of the deposition layer D2 formed on the bottom portion VSb1 corresponding to the opening pattern MS having the small diameter. Note that, the film thickness of the deposition layer D2 formed on the bottom portion VLb1 of the opening pattern ML becomes equal to or smaller than the film thickness of the deposition layer D2 formed on the surface of the resist layer M located outside the opening patterns MS and ML.

That is, regarding the film thickness of the deposition layer D2, the film thicknesses gradually become smaller in the order of the film thickness TD2 of the deposition layer D2 formed on the surface of the resist layer M positioned outside the opening patterns MS and ML, the film thickness TLD2 of the deposition layer D2 formed on the bottom portion VLb1 of the opening pattern ML, and the film thickness TSD2 of the deposition layer D2 formed on the bottom portion VSb1 of the opening pattern MS.

In the deposition step S03 of the second cycle, the deposition coverage of the deposition layer D2 of the bottom portions VSb1 and VLb1 corresponding to the opening patterns MS and ML, respectively, is controlled so as to obtain optimized deposition coverage by setting deposition conditions as described above. Here, the preferred conditions for forming the deposition coverage are those that shorten a processing time required for causing the deposition layer D2 having a necessary film thickness to be formed on the bottom portions VSb1 and VLb1. That is, the preferred conditions for forming the deposition layer D2 are those that increase the film-formation rate of the deposition layer D2 formed on the bottom portions VSb1 and VLb1.

In the deposition step S03 of the second cycle, the preferred conditions for forming the deposition coverage are those that control the deposition coverage in accordance with the etching depth and the aspect ratio. That is, as described below, the depths of the bottom portions VSb and VLb are different from the depths of the bottom portions VSb1 and VLb1, and therefore the depths of the bottom portions are changed. Even in a case in which the aspect ratio is changed depending on variations in the depths of the bottom portions as described above, it is possible to form the deposition layer D2 having a desired thickness at a predetermined film-formation rate.

Furthermore, the preferred conditions for forming the deposition coverage are those that improve uniformity and reliability with respect to the deposition layer D2 formed on the bottom portion VSb1 and improve uniformity and reliability with respect to the deposition layer D2 formed on the bottom portion VLb1.

Additionally, the processing time of the deposition step S03 of the second cycle can be longer than the processing time of the deposition step S03 of the first cycle. Particularly, the above-described setting of the processing time is the same as that of the deposition step S03 to be carried out after the third cycle.

Figure 11:
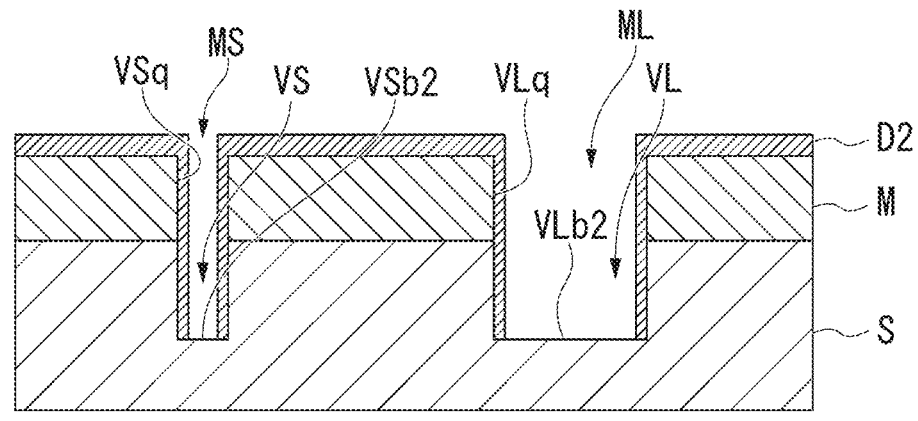
FIG. 11 is a cross-sectional view showing the cycle etching step of the plasma processing method according to the Example of the invention.

FIG. 11 is a cross-sectional view showing a step of the silicon dry etching method according to the Example.

In the dry-etching step S04 of the second cycle shown in FIG. 5, the bottom portions VSb1 and VLb1 corresponding to the opening patterns MS and ML are etched by anisotropic plasma etching as shown in FIG. 11, the positions of the bottom portions VSb1 and VLb1 are lowered, and thereby the bottom portions VSb2 and VLb2 are formed.

In this situation, the depths of the bottom portion VSb2 corresponding to the opening pattern MS and the bottom portion VLb2 corresponding to the opening pattern ML formed by the dry-etching step S04 of the second cycle are set to be uniform by adjusting the processing conditions of the dry-etching step S04 of the second cycle, the plasma anisotropy thereof, and the difference between the film thickness of the deposition layers D2 formed by the deposition step S03 of the second cycle.

Particularly, the film thickness TSD2 of the deposition layer D2 formed on the bottom portion VSb1 corresponding to the opening pattern MS is smaller than the film thickness TLD2 of the deposition layer D2 formed on the bottom portion VLb1 corresponding to the opening pattern ML. Moreover, the etching amount with respect to the bottom portion VSb1 corresponding to the opening pattern MS is smaller than the etching amount with respect to the bottom portion VLb1 corresponding to the opening pattern ML. Therefore, the film thickness of the deposition layer formed by the aforementioned deposition and the etching amount of the aforementioned etching are balanced, and the depth of the bottom portion VSb2 corresponding to the opening pattern MS and the depth of the bottom portion VLb2 corresponding to the opening pattern ML are uniform.

Additionally, an effect of the etching with respect to the side walls VSq and VLq corresponding to the opening patterns MS and ML, respectively, is extremely reduced by adjusting the processing conditions of the dry-etching step S04 of the second cycle, the plasma anisotropy thereof, and the deposition layer D2. For this reason, the side walls VSq and VLq are vertical to the surface of the silicon substrate S. Each of the side walls VSq and VLq has an even surface extending in the depth direction. Accordingly, the side walls VSq and VLq without irregularities are formed so as to extend in the depth direction.

That is, as the recess patterns VS and VL, the bottom portions VSb2 and VLb2 are formed so as to have a uniform diameter.

Also in the dry-etching step S04 of the second cycle, the plasma processing with high anisotropy is carried out so as to achieve this shape. In the dry-etching step S04 of the second cycle, the plasma processing apparatus 10 shown in FIGS. 1 and 2 described above is used.

In this situation, the processing conditions of the plasma processing apparatus 10 used in the dry-etching step S04 of the second cycle can be the same conditions as those of the dry-etching step S04 of the first cycle.

Moreover, the dry-etching step S04 of the second cycle is the same as the dry-etching step S04 of the first cycle. The alternating-current power having the first frequency $\lambda 1$ output from the high-frequency power source 17 is split into the first electrode E1 and the second electrode E2 by the power splitter 16.

Therefore, it is possible to suppress variations in etching rate with respect to the deposition layer D2 in the radial direction. Here, the split ratio of the first electrode E1 and the second electrode E2 controlled by the power splitter 16 is set depending on the kinds of processing gas and the variations in the etching rate. Furthermore, the split ratio of the dry-etching step S04 of the second cycle may be equal to or different from that of the dry-etching step S04 of the first cycle.

Moreover, the dry-etching step S04 of the second cycle is the same as the dry-etching step S04 of the first cycle. The values of the alternating-current powers having the first frequency $\lambda 1$ applied to the first electrode E1 and the second electrode E2 may be set higher than those of the deposition step S03 of the second cycle or may be equal to those of the ashing step S05 of the second cycle.

Moreover, the dry-etching step S04 of the second cycle is the same as the dry-etching step S04 of the first cycle. The values of the alternating-current powers having the first frequency $\lambda 1$ applied to the first electrode E1 and the second electrode E2 may be set the same as the value of the alternating-current power having the second frequency $\lambda 2$ applied to the third electrode E3.

Moreover, the dry-etching step S04 of the second cycle is the same as the dry-etching step S04 of the first cycle. It is preferable to apply the bias voltage having the frequency $\lambda 3$ to the inner electrode 12. The value of the frequency $\lambda 3$ may be set lower than that of the second frequency $\lambda 2$ of the alternating-current power applied to the third electrode E3. The frequency $\lambda 3$ may be, for example, 400 kHz.

Furthermore, the anisotropic plasma etching of the dry-etching step S04 of the second cycle is the same as that of the first cycle. The mixed gas of $SF_6$ and $O_2$ is decomposed by plasma, and anisotropic etching with respect to Si is carried out. For this reason, Si is etched by the F-radical generated due to decomposition of $SF_6$ ($F+Si \rightarrow SiF_4$). This etching reaction occurs in isotropic etching. In order to carry out anisotropic etching, the etching reaction with respect to the side walls VSq and VLq may be suppressed by forming a protective film that adheres to the side walls VSq and VLq.

The anisotropic plasma etching using the mixed gas of $SF_6/O_2$ in the dry-etching step S04 of the second cycle is the same as the dry-etching step S04 of the first cycle. The deposition layer D2 is removed from the side walls VSq and VLq corresponding to the opening patterns MS and ML, respectively, and the side walls VSq and VLq are exposed.

Here, anisotropic plasma etching using the mixed gas of $SF_6/O_2$ in the dry-etching step S04 of the second cycle is the same as the dry-etching step S04 of the first cycle. The side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Moreover, the dry-etching step S04 of the second cycle is the same as the dry-etching step S04 of the first cycle. $SiF_4$ can be used as an etching gas in order to prevent lack of the etching product of $SiF_4$.

Moreover, the dry-etching step S04 of the second cycle is the same as the dry-etching step S04 of the first cycle. $SF_6$ or $NF_3$ is used as an etching gas, $SiF_4$ serving as a silicon compound is added to the etching gas, and $O_2$, $N_2$, $N_2O$, NO, $NO_x$, or $CO_2$ which serves as a reactant is added to the gas. Accordingly, the bottom portions VSb1 and VLb1 can be intensively etched.

Additionally, the processing time of the dry-etching step S04 of the second cycle can be longer than the processing time of the dry-etching step S04 of the first cycle. Particularly, the above-described setting of the processing time is the same as that of the dry-etching step S04 to be carried out after the third cycle.

Figure 12:
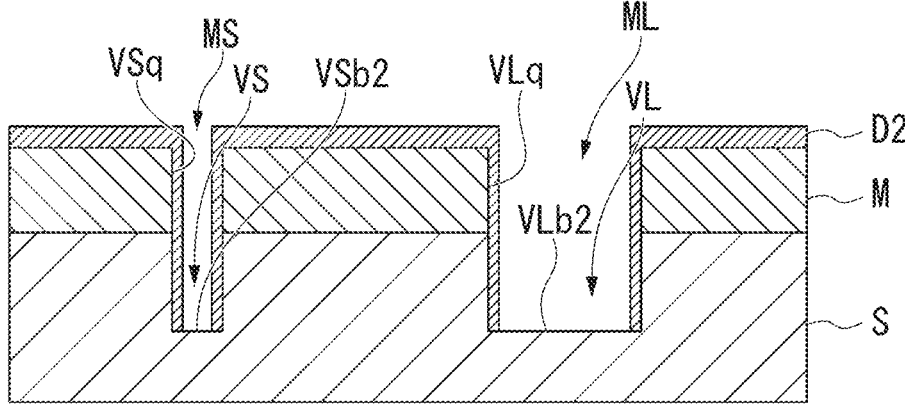
FIG. 12 is a cross-sectional view showing the cycle etching step of the plasma processing method according to the Example of the invention.

FIG. 12 is a cross-sectional view showing a step of the silicon dry etching method according to the Example.

In the ashing step S05 of the second cycle shown in FIG. 5, the remaining deposition layer D2 is removed after the dry-etching step S04 of the second cycle is completed as shown in FIG. 12.

Particularly, in the ashing step S05 of the second cycle, the ashing conditions are set so as to reliably remove the deposition layer D2 that remains on the region close to the inner-peripheral portions of the opening pattern MS and the opening pattern ML of the resist layer M.

The ashing step S05 of the second cycle is the same as the ashing step S05 of the first cycle. After the dry-etching step S04 of the second cycle is completed, the deposition layer D2 adhered to the surface of the resist layer M, the deposition layer D2 that remains on the region close to the inner-peripheral portions of the opening pattern MS and the opening pattern ML of the resist layer M, and the deposition layers D2 that remain on the side walls VSq and VLq corresponding to the opening patterns MS and ML, respectively, are removed.

Furthermore, in a case in which the deposition layer D2 remains on the bottom portion VSb2 corresponding to the opening pattern MS and the deposition layer D2 remains on the bottom portion VLb2 corresponding to the opening pattern ML, the deposition layer D2 is removed.

Here, it is most important to remove the deposition layer D2 that remains at the inner-periphery position of the opening pattern MS and the deposition layer D2 that remains at the inner-periphery position of the opening pattern ML. When the deposition layer D2 remains without being removed, a deposition layer D3 is further deposited on the remaining deposition layer D2 by carrying out the deposition step S03 of the next cycle in the repetitive cycles. In this case, the opening diameters (opening spaces) of the opening pattern MS and the opening pattern ML of the resist layer M decrease.

As described above, in a case in which the opening diameters of the opening pattern MS and the opening pattern ML of the resist layer M decrease, even where the etching with a high degree of anisotropy is carried out in the dry-etching step S04 of the third cycle carried out next to the second cycle, the deposition layer D2 and the deposition layer D3 inhibit the etching plasma from reaching the bottom portion VSb2 and the bottom portion VLb2. Accordingly, the etching with respect to the bottom portion VSb2 and the bottom portion VLb2 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in a state in which the deposition layer D2 does not remain at the inner-periphery position of the opening pattern MS and the deposition layer D2 does not remain at the inner-periphery position of the opening pattern ML, the deposition layer D3 is not further deposited on the remaining deposition layer D2 in the deposition step S03 of the third cycle carried out next to the second cycle of the repetitive cycles. For this reason, the opening diameters (opening spaces) of the opening pattern MS and the opening pattern ML of the resist layer M can be maintained so as to have a predetermined size.

Therefore, in the dry-etching step S04 of the third cycle of the repetitive cycles, as a result of carrying out the etching with a high degree of anisotropy, reach of the etching plasma to the bottom portion VSb2 and the bottom portion VLb2 is not inhibited by the deposition layer D2 and the deposition layer D3. Consequently, the etching with respect to the bottom portion VSb2 and the bottom portion VLb2 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape. It is possible to form each of the recess patterns VS and VL with a high-aspect ratio so as to have a uniform diameter in the depth direction.

In the ashing step S05 of the second cycle, the deposition layer D2 that remains at the inner-periphery positions of the opening patterns MS and ML is reliably removed as described above. For this purpose, in a similar way to the case of the ashing step S05 of the first cycle described above, it is necessary to generate plasma with high anisotropy. Therefore, also in the ashing step S05 of the second cycle, the plasma processing apparatus 10 shown in FIGS. 1 and 2 described above is used.

In this situation, when carrying out the ashing step S05 of the second cycle in the plasma processing apparatus 10, the high-frequency power of the first frequency λ1 is applied to the first electrode E1 and the second electrode E2 in a similar way to the case of the ashing step S05 of the first cycle. The high-frequency power of the second frequency λ2 is applied to the third electrode E3. The first frequency λ1 is set higher than the second frequency λ2. Particularly, the first frequency λ1 is 13.56 MHz, and the second frequency λ2 is 2 MHz.

Moreover, the ashing step S05 of the second cycle is the same as the first cycle. That is, the values of the alternating-current powers having the first frequency λ1 applied to the first electrode E1 and the second electrode E2 may be set higher than those of the deposition step S03 the subsequent cycle after the first cycle or the second cycle and may be equal to those of the dry-etching step S04 of the second cycle.

The ashing step S05 of the second cycle is the same as the ashing step S05 of the first cycle. The values of the alternating-current powers having the first frequency λ1 applied to the first electrode E1 and the second electrode E2 may be set the same as the value of the alternating-current power having the second frequency λ2 applied to the third electrode E3.

The ashing step S05 of the second cycle is the same as the ashing step S05 of the first cycle. It is preferable to apply the bias voltage having the frequency λ3 to the inner electrode 12. The frequency λ3 may be set lower than the second frequency λ2 of the alternating-current power applied to the third electrode E3. The frequency λ3 may be, for example, 400 kHz. The value of the bias voltage of the ashing step S05 of the second cycle may be set equal to the value of the bias voltage of the dry-etching step S04 of the second cycle or higher than the value of the bias voltage of the dry-etching step S04 of the second cycle.

The ashing step S05 of the second cycle is the same as the ashing step S05 of the first cycle. The alternating-current power having the first frequency λ1 output from the high-frequency power source 17 is split into the first electrode E1 and the second electrode E2 by the power splitter 16.

Therefore, it is possible to suppress variations in ashing rate of the deposition layer D2 in the radial direction. Here, the split ratio of the first electrode E1 and the second electrode E2 controlled by the power splitter 16 is set depending on the kinds of processing gas and the variations in the ashing rate. Furthermore, the split ratio of the ashing step S05 of the second cycle may be equal to or different from that of the ashing step S05 of the first cycle.

In the ashing step S05 of the second cycle, it is possible to carry out the ashing by supply of $O_2$ gas. According to the anisotropic plasma processing using the $O_2$ gas, the deposition layer D2 is reliably removed and the side walls VSq and VLq are exposed at the regions close to the inner-peripheral portions of the opening patterns MS and ML, and the side walls VSq and VLq corresponding to the opening patterns MS and ML, respectively. At the same time, it is possible to carry out the ashing by supply of $O_2$ gas in the ashing step S05 of the second cycle. The resist layer M made of a resin is slightly removed, and therefore the film thickness of the resist layer M may decrease in this step.

When the ashing step S05 of the second cycle is completed, the depth-determining step S06a is carried out in a similar way to the case of the first cycle. In accordance with the determination result of the depth-determining step S06a, it is determined whether to carry out the post-treatment step S08 or the resist protection determining step S06 of the second cycle. In accordance with the determination result of the resist protection determining step S06, it is determined that the subsequent cycle including the etching step is carried out or the resist protective film forming step S07 described below is carried out.

In the depth-determining step S06a of the second cycle, it is determined whether to proceed to the subsequent resist protection determining step S06. At this time, regarding the determination standard of the depth-determining step S06a, determination in accordance with the depths of the recess patterns VS and VL is carried out. In other words, the determination in accordance with the aspect ratio of the recess patterns VS and VL is carried out.

When the depths of the recess patterns VS and VL are not sufficient (determination result: NO), it is determined that the etching step of the subsequent cycle is necessary, and the step proceeds to the resist protection determining step S06. In the resist protection determining step S06, it is determined whether to proceed to the resist protective film forming step S07 described below.

On the other hand, when the depths of the recess patterns VS and VL are sufficient in the depth-determining step S06a (determination result: YES), the etching is completed, and the step proceeds to the post-treatment step S08.

The resist protection determining step S06 of the second cycle is the same as the resist protection determining step S06 of the first cycle. Regarding the determination standard, the determination in accordance with the depths of the recess patterns VS and VL is carried out. In other words, the determination in accordance with the aspect ratio of the recess patterns VS and VL is carried out.

In the resist protection determining step S06 of the second cycle, when it is determined that the depths of the recess patterns VS and VL are not sufficient (determination result:

NO), the step proceeds to the deposition step S03 for the first step of the subsequent cycle in a similar way to the case of the resist protection determining step S06 of the first cycle.

On the other hand, when the depths of the recess patterns VS and VL are sufficient (determination result: YES) and the aspect ratio of the recess patterns VS and VL is greater than the aforementioned range, a determination of forming the resist protective film Mm in the resist protective film forming step S07 is carried out.

That is, determination of the resist protection determining step S06 is carried out in accordance with the opening spaces of the recess patterns VS and VL and the etching amounts of the bottom portions VSb1 and VLb1 by the etching step of the second cycle.

In other cases, the determination of the resist protection determining step S06 may be based on the measurement result obtained by measuring the depths of the recess patterns VS and VL of the silicon substrate S after the second cycle. Furthermore, the determination of the resist protection determining step S06 may be based on an estimation of the etching conditions of the second cycle, and therefore it may be determined whether to proceed to the third cycle. The determination based on the etching conditions may be based on the setting corresponding to the etching depth obtained by a predetermined condition in advance.

Furthermore, in the resist protection determining step S06 of the second cycle, the determination is carried out based on the following determination standard.

For example, when the amount of thickness loss of the resist layer M obtained by the ashing step S05 of the second cycle is smaller than a predetermined value, it is determined that the cycle including the subsequent etching step S04 is carried out without carrying out the resist protective film forming step S07.

On the other hand, regarding the determination standard of the resist protection determining step S06 of the second cycle, when the amount of thickness loss of the resist layer M obtained by the ashing step S05 of the second cycle is larger than a predetermined value, it is determined that the resist protective film forming step S07 of the second cycle is carried out.

The reason for carrying out the above-described determination is that, when the step proceeds to the etching step of the third cycle in a state in which the amount of thickness loss of the resist layer M is larger than a predetermined value, there is a possibility that the film thickness of the resist layer M becomes insufficient, and it is not possible to maintain a degree of accuracy of the shape formed by the etching processing.

Next, a case of proceeding with the resist protective film forming step S07 will be described.

As shown in FIG. 5, the resist protective film forming step S07 of the second cycle is carried out before proceeding to the third cycle.

Figure 13:
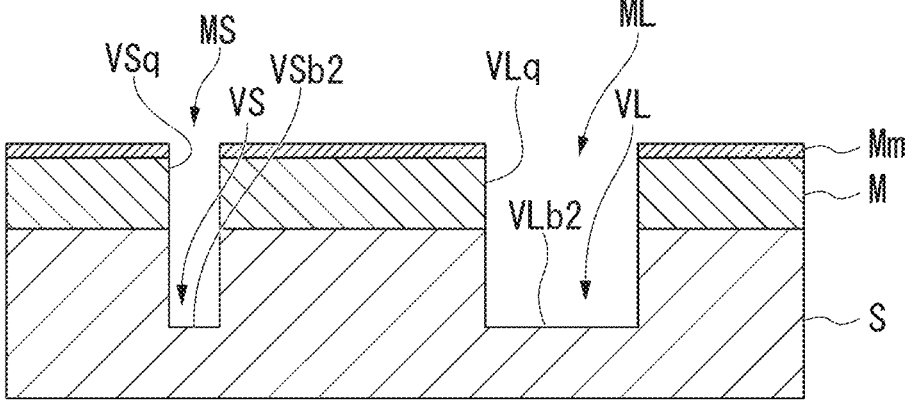
FIG. 13 is a cross-sectional view showing the cycle etching step of the plasma processing method according to the Example of the invention.

FIG. 13 is a cross-sectional view showing a step of the silicon dry etching method according to the Example.

In the resist protective film forming step S07 shown in FIG. 5, as shown in FIG. 13, the resist protective film Mm is formed on the surface of the resist layer M by anisotropic plasma processing.

The resist protective film Mm is a film capable of protecting the resist layer M from being etched in the dry-etching step S04 and the ashing step S05 to be carried out after the third cycle.

In the resist protective film forming step S07, the conditions for film formation are set such that the deposition rate of the resist protective film Mm becomes higher than that of the deposition layer D2. For example, the deposition rate of the resist protective film Mm is set to be approximately 1.5 times higher than the deposition rate of the deposition layer D2.

In the plasma CVD (Chemical Vapor Deposition) method used in the resist protective film forming step S07, a gas capable of forming $Si_xO_{y\alpha z}$, for example, a mixed gas of $SiF_4$ and $O_2$, a mixed gas of $SiCl_4$ and $O_2$, a mixed gas of $SiH_4$ and $O_2$, TEOS (Tetraethyl orthosilicate Tetraethoxysilane), or the like is used. Accordingly, it is possible to form the resist protective film Mm including a film configuration of SiOF. The plasma CVD method is an example of a plasma film formation method.

Here, in a case of using the mixed gas of $SiF_4$ and $O_2$ in the resist protective film forming step S07, it is possible to use $SiF_4$ gas common to the gas used in the dry-etching step S04. In this case, since the gas supply devices can be common in the configuration of the plasma processing apparatus 10, it is preferable.

A SiOF film has a configuration similar to that of a $SiO_2$ film. Accordingly, regarding the SiOF film, the thickness of the resist protective film Mm does not decrease in the deposition step S03, the dry-etching step S04, and the ashing step S05, which are to be carried out after the third cycle.

That is, the resist protective film Mm can prevent the thickness of the resist layer M from being reduced in the deposition step S03, the dry-etching step S04, and the ashing step S05, which are to be carried out after the third cycle.

Although the resist protective film Mm is formed on the surface of the resist layer M by the anisotropic plasma processing, the resist protective film Mm is not formed on the side walls VSq and VLq of the recess patterns VS and VL. Furthermore, the resist protective film Mm is not formed on the bottom portions VSb2 and VLb2 of the recess patterns VS and VL. This is because the aspect ratio of the recess patterns VS and VL is set to be greater than or equal to a predetermined value in the depth-determining step S06a and the resist protection determining step S06.

In the resist protective film forming step S07 that is firstly carried out before proceeding the third cycle, the plasma processing apparatus 10 shown in FIGS. 1 and 2 described above is used in order to generate plasma with high anisotropy.

In this situation, when carrying out the resist protective film forming step S07 of the second cycle in the plasma processing apparatus 10, the high-frequency power of the first frequency $\lambda 1$ is applied to the first electrode E1 and the second electrode E2. The high-frequency power of the second frequency $\lambda 2$ is applied to the third electrode E3. The first frequency $\lambda 1$ is set higher than the second frequency $\lambda 2$. Particularly, the first frequency $\lambda 1$ is 13.56 MHz, and the second frequency $\lambda 2$ is 2 MHz.

The conditions of the alternating-current power having the first frequency $\lambda 1$ of the resist protective film forming step S07 of the second cycle is the same as those of the dry-etching step S04 and the ashing step S05 of the first cycle or the second cycle. That is, the values of the alternating-current powers having the first frequency $\lambda 1$ applied to the first electrode E1 and the second electrode E2 may be set higher than those of the deposition step S03 of the first cycle or the second cycle, and may be equal to those of one of the dry-etching step S04 of the first cycle or the second cycle, the dry-etching step S04 of the second cycle, the ashing step S05 of the first cycle or the second cycle, and the ashing step S05 of the first cycle or the second cycle.

Furthermore, also in the resist protective film forming step S07 of the second cycle, the values of the alternating-current powers having the first frequency $\lambda 1$ applied to the first electrode E1 and the second electrode E2 may be set the same as the value of the alternating-current power having the second frequency $\lambda 2$ applied to the third electrode E3.

Additionally, in the resist protective film forming step S07 of the second cycle, the bias voltage may not be applied to the inner electrode 12 in a similar way to the case of the deposition step S03 of the first cycle or the second cycle. The pressure of the internal space 11N of the resist protective film forming step S07 of the second cycle may be set the same as that of each of the dry-etching step S04 and the ashing step S05 of the second cycle.

Moreover, the resist protective film forming step S07 of the second cycle is the same as at least one of the deposition step S03, the dry-etching step S04, the ashing step S05 of the first cycle or the second cycle. The alternating-current power having the first frequency $\lambda 1$ output from the high-frequency power source 17 is split into the first electrode E1 and the second electrode E2 by the power splitter 16.

Therefore, it is possible to suppress variations in deposition rate of the resist protective film Mm in the radial direction. Here, the split ratio of the first electrode E1 and the second electrode E2 controlled by the power splitter 16 is set depending on the kinds of processing gas and the variations in the deposition rate. Furthermore, the split ratio of the first electrode E1 and the second electrode E2 of the resist protective film forming step S07 of the second cycle may be equal to or different from that of at least one of the deposition step S03 of the first cycle, the dry-etching step S04 of the first cycle, the ashing step S05 of the first cycle, the deposition step S03 of the second cycle, the dry-etching step S04 of the second cycle, and the ashing step S05 of the second cycle.

In a state in which the resist protective film Mm having the film configuration such as SiOF is formed on the surface of the resist layer M, even in a case of carrying out the ashing step S05 of the subsequent third cycle, it is possible to prevent the resist layer M from being consumed.

However, the resist protective film Mm having the film configuration such as SiOF is gradually consumed by the anisotropic plasma etching processing using a fluorocarbon gas such as a CF-based gas, that is, $CHF_3$, $C_2F_6$, $C_2F_4$, $C_4F_8$, or the like which is used in the deposition step S03 to be carried out after the third cycle, $SF_6$ or $NF_3$, $SiF_4$ serving as a silicon compound added to an etching gas, $O_2$, $N_2$, $N_2O$, NO, $NO_x$, or $CO_2$ serving as a reactant added to a gas, for example, a mixed gas of $SF_6$ and $O_2$ used as an etching gas in the dry-etching step S04.

Consequently, regarding the film thickness of the resist protective film Mm, the film thickness of the resist protective film Mm is set such that each of the recess patterns VS and VL reaches a desired depth and such that the predetermined number of cycles can be carried out. At this time, it is important that variations in film thickness does not occur in the radial direction.

Furthermore, in a case in which the number of cycles reaches the predetermined number of cycles, in order to recover the film thickness of the consumed resist protective film Mm, the resist protective film Mm is formed on the surface of the resist layer M again by further carrying out the resist protective film forming step S07 as described below.

In the silicon dry etching method according to the Example, the deposition step S03, the dry-etching step S04, and the ashing step S05 serve as one cycle as shown in FIG. 5, and the cycle is repetitively carried out. Consequently, the depths of the recess patterns VS and VL further become large. Moreover, the resist protective film Mm is formed on the surface of the resist layer M by carrying out the resist protective film forming step S07 every predetermined cycle number, that is, after the cycles are carried out at a predetermined frequency.

After the resist protective film forming step S07 is carried out, the step proceeds to the third cycle as the next cycle.

Next, a case of proceeding with the third cycle will be described.

Figure 14:
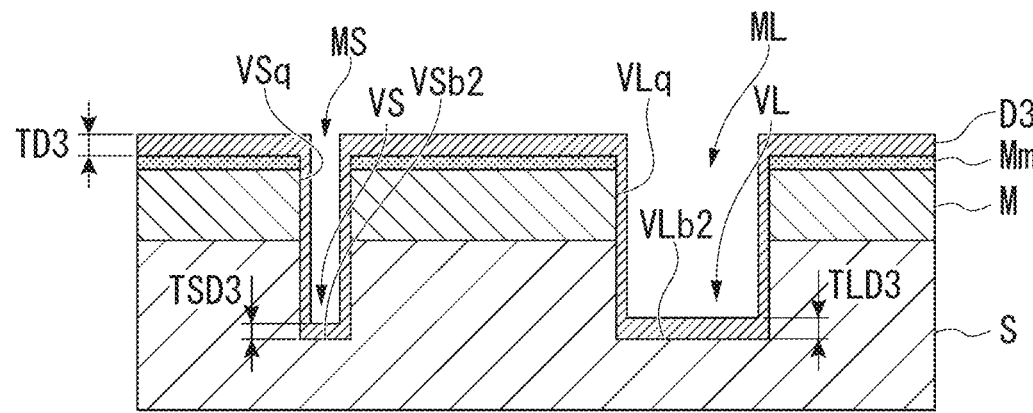
FIG. 14 is a cross-sectional view showing the cycle etching step of the plasma processing method according to the Example of the invention.

FIG. 14 is a cross-sectional view showing a step of the silicon dry etching method according to the Example.

In the deposition step S03 shown in FIG. 5 of the third cycle, a deposition layer D3 made of a polymer such as fluorocarbon or the like is formed on the surface of the resist protective film Mm by anisotropic plasma processing as shown in FIG. 14. Consequently, in the dry-etching step S04 to be carried out after the deposition step S03 of the third cycle, it is possible to protect the side walls of the recess pattern VS and the recess pattern VL from being etched.

In this situation, although the film thickness of the resist protective film Mm slightly decreases, the resist protective film Mm almost remains in the deposition step S03.

The deposition layer D3 is formed in order to protect the side walls VSq and VLq of the recess patterns VS and Vt, from being etched, respectively, and in order to limitedly carry out etching with respect to the bottom portions VSb2 and VLb2 of the recess patterns VS and VL, respectively. Consequently, the vertical side walls VSq and VLq are obtained in the dry-etching step S04, which is etching using a fluorine compound.

The deposition layer D3 is formed on the surface of the resist protective film Mm and the bottom portions VSb2 and VLb2 of the recess patterns VS and VL. Moreover, although FIG. 14 shows that the deposition layer D3 is on the side walls VSq and VLq of the recess patterns VS and VL, practically, the deposition layer D3 is almost not formed on the side walls VSq and VLq.

The deposition step S03 of the third cycle is the same as that of the second cycle. That is, an anisotropic plasma processing is carried out using a fluorocarbon gas such as $CHF_3$, $C_2F_6$, $C_2F_4$, $C_4F_8$, or the like. In the deposition step S03, the plasma processing apparatus 10 shown in FIGS. 1 and 2 described above is used in order to carry out the plasma processing with high anisotropy.

When carrying out the deposition step S03 of the third cycle in the plasma processing apparatus 10, the high-frequency power of the first frequency λ1 is applied to the first electrode E1 and the second electrode E2. The high-frequency power of the second frequency λ2 is applied to the third electrode E3. The first frequency λ1 is set higher than the second frequency λ2. Particularly, the first frequency λ1 is 13.56 MHz, and the second frequency λ2 is 2 MHz.

At this time, the processing conditions of the deposition step S03 of the third cycle may be the same as those of at least one of the deposition step S03 of the first cycle and the deposition step S03 of the second cycle.

Regarding the processing conditions of the plasma processing apparatus 10 such as the first frequency λ1, the second frequency λ2, the pressure of the internal space 11N, or the like, the processing conditions of the deposition step S03 of the third cycle may be set the same as those of the deposition step S03 of at least one of the first cycle and the second cycle. Here, the processing conditions of the deposition step S03 of the subsequent cycle after the third cycle may be set the same as or different from those of the deposition step S03 of at least one of the first cycle and the second cycle.

Moreover, the deposition step S03 of the third cycle is the same as the deposition step S03 of at least one of the first cycle and the second cycle. The alternating-current power having the first frequency λ1 output from the high-frequency power source 17 is split into the first electrode E1 and the second electrode E2 by the power splitter 16.

Therefore, it is possible to suppress variations in deposition rate of the deposition layer D3 in the radial direction. Here, the split ratio of the first electrode E1 and the second electrode E2 controlled by the power splitter 16 is set depending on the kinds of processing gas and the variations in the deposition rate. Furthermore, the split ratio of the deposition step S03 of the third cycle may be equal to or different from that of the deposition step S03 of at least one of the first cycle and the second cycle.

Moreover, in the deposition step S03 of the third cycle in the plasma processing apparatus 10, the values of the alternating-current powers having the first frequency λ1 applied to the first electrode E1 and the second electrode E2 may be set lower than those of the dry-etching step S04 and the ashing step S05 of the third cycle. Furthermore, in the deposition step S03 of the third cycle in the plasma processing apparatus 10, a bias voltage may not be applied to the inner electrode 12.

Regarding the film thickness of the deposition layer D3 formed by the deposition step S03 of the third cycle, the film thickness of the deposition layer D3 formed on the bottom portion VLb2 corresponding to the opening pattern ML having a large diameter becomes larger than the film thickness of the deposition layer D3 formed on the bottom portion VSb2 corresponding to the opening pattern MS having a small diameter. Note that, the film thickness of the deposition layer D3 formed on the bottom portion VLb2 of the opening pattern ML becomes equal to or smaller than the film thickness of the deposition layer D3 formed on the surface of the resist protective film Mm located outside the opening patterns MS and ML.

That is, regarding the film thickness of the deposition layer D3, the film thicknesses gradually become smaller in the order of the film thickness TD3 of the deposition layer D3 formed on the surface of the resist protective film Mm positioned outside the opening patterns MS and ML, the film thickness TLD3 of the deposition layer D3 formed on the bottom portion VLb2 of the opening pattern ML, and the film thickness TSD3 of the deposition layer D3 formed on the bottom portion VSb2 of the opening pattern MS.

In the deposition step S03 of the third cycle, the deposition coverage of the deposition layer D3 of the bottom portions VSb2 and VLb2 corresponding to the opening patterns MS and ML, respectively, are controlled so as to obtain optimized deposition coverage by setting deposition conditions as described above. Here, the preferred conditions for forming the deposition coverage are those that shorten a processing time required for causing the deposition layer D3 having a necessary film thickness to be formed on the bottom portions VSb2 and VLb2. That is, the preferred conditions for forming the deposition layer D3 are those that increase the film-formation rate of the deposition layer D3 formed on the bottom portions VSb2 and VLb2.

Furthermore, in the deposition step S03 of the third cycle, the preferred conditions for forming the deposition coverage are those that control the deposition coverage in accordance with the etching depth and the aspect ratio. That is, as described below, the depths of the bottom portions VSb1 and VLb1 are different from the depths of the bottom portions VSb2 and VLb2, and therefore the depths of the bottom portions are changed. Even in a case in which the aspect ratio is changed depending on variations in the depths of the bottom portions as described above, the deposition layer D3 having a desired thickness is formed at a predetermined film-formation rate.

Furthermore, the preferred conditions for forming the deposition coverage are those that improve uniformity and reliability with respect to the deposition layer D3 formed on the bottom portion VSb2 and improve uniformity and reliability with respect to the deposition layer D3 formed on the bottom portion VLb2.

Moreover, the deposition step S03 of the third cycle may be carried out in a similar way to the case of at least one of the deposition step S03 of the first cycle and the deposition step S03 of the second cycle.

Figure 15:
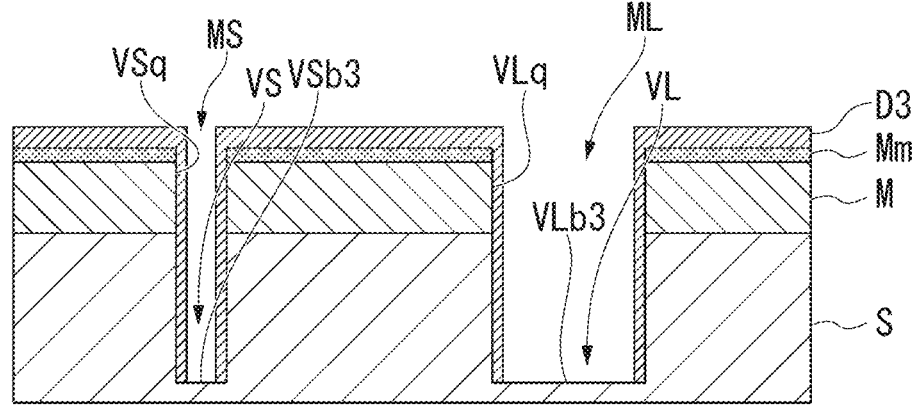
FIG. 15 is a cross-sectional view showing the cycle etching step of the plasma processing method according to the Example of the invention.

FIG. 15 is a cross-sectional view showing a step of the silicon dry etching method according to the Example.

In the dry-etching step S04 of the third cycle shown in FIG. 5, the bottom portions VSb2 and VLb2 corresponding to the opening patterns MS and ML are etched by anisotropic plasma etching as shown in FIG. 15, the positions of the bottom portions VSb2 and VLb2 are lowered, and thereby the bottom portions VSb3 and VLb3 are formed.

In this situation, although the film thickness of the resist protective film Mm slightly decreases, the resist protective film Mm almost remains in the dry-etching step S04 of the third cycle.

In this situation, the depths of the bottom portion VSb3 corresponding to the opening pattern MS and the bottom portion VLb3 corresponding to the opening pattern ML formed by the dry-etching step S04 of the third cycle are set to be uniform by adjusting the processing conditions of the dry-etching step S04 of the third cycle, the plasma anisotropy thereof, and the difference between the film thickness of the deposition layers D3 formed by the deposition step S03.

Particularly, the film thickness TSD3 of the deposition layer D3 formed on the bottom portion VSb2 corresponding to the opening pattern MS is smaller than the film thickness TLD3 of the deposition layer D3 formed on the bottom portion VLb2 corresponding to the opening pattern ML. Moreover, the etching amount with respect to the bottom portion VSb2 corresponding to the opening pattern MS is smaller than the etching amount with respect to the bottom portion VLb2 corresponding to the opening pattern ML. Therefore, the film thickness of the deposition layer formed by the aforementioned deposition and the etching amount of the aforementioned etching are balanced, and the depth of the bottom portion VSb3 corresponding to the opening pattern MS and the depth of the bottom portion VLb3 corresponding to the opening pattern ML are uniform.

Additionally, an effect of the etching with respect to the side walls VSq and VLq corresponding to the opening patterns MS and ML, respectively, may be extremely reduced by adjusting the processing conditions of the dry-etching step S04 of the third cycle, the plasma anisotropy thereof, and the deposition layer D3. For this reason, the side walls VSq and VLq are vertical to the surface of the silicon substrate S. Each of the side walls VSq and VLq has an even surface extending in the depth direction. Accordingly, the side walls VSq and VLq without irregularities are formed so as to extend in the depth direction.

That is, as the recess patterns VS and VL, the bottom portions VSb3 and VLb3 are formed so as to have a uniform diameter.

Also in the dry-etching step S04 of the third cycle, the plasma processing apparatus 10 shown in FIGS. 1 and 2 described above is used in order to generate plasma with high anisotropy.

In this situation, when carrying out the dry-etching step S04 of the third cycle in the plasma processing apparatus 10, the high-frequency power of the first frequency $\lambda 1$ is applied to the first electrode E1 and the second electrode E2 in a similar way to the case of the dry-etching step S04 of the second cycle. The high-frequency power of the second frequency $\lambda 2$ is applied to the third electrode E3. The first frequency $\lambda 1$ is set higher than the second frequency $\lambda 2$. Particularly, the first frequency $\lambda 1$ is 13.56 MHz, and the second frequency $\lambda 2$ is 2 MHz.

Moreover, even in the dry-etching step S04 of the third cycle in the plasma processing apparatus 10, the values of the alternating-current powers having the first frequency $\lambda 1$ applied to the first electrode E1 and the second electrode E2 may be higher than those of the deposition step S03 of the third cycle and may be equal to those of the ashing step S05 of the third cycle in a similar way to the case of the second cycle.

Furthermore, even in the dry-etching step S04 of the third cycle, the values of the alternating-current powers having the first frequency $\lambda 1$ applied to the first electrode E1 and the second electrode E2 may be set the same as the value of the alternating-current power having the second frequency $\lambda 2$ applied to the third electrode E3 in a similar way to the case of the second cycle.

Also, the dry-etching step S04 of the third cycle is the same as the dry-etching step S04 of the second cycle. The alternating-current power having the first frequency $\lambda 1$ output from the high-frequency power source 17 is split into the first electrode E1 and the second electrode E2 by the power splitter 16.

Therefore, it is possible to suppress variations in etching rate with respect to the deposition layer D3 in the radial direction. Here, the split ratio of the first electrode E1 and the second electrode E2 controlled by the power splitter 16 is set depending on the kinds of processing gas and the variations in the etching rate. Furthermore, the split ratio of the dry-etching step S04 of the third cycle may be equal to or different from that of the dry-etching step S04 of the first cycle or the second cycle.

Additionally, the dry-etching step S04 of the third cycle in the plasma processing apparatus 10 is the same as the dry-etching step S04 of the second cycle. It is preferable to apply the bias voltage having the frequency $\lambda 3$ to the inner electrode 12. The value of the frequency $\lambda 3$ may be set lower than that of the second frequency $\lambda 2$ of the alternating-current power applied to the third electrode E3. The frequency $\lambda 3$ may be, for example, 400 kHz.

Moreover, the anisotropic plasma etching of the dry-etching step S04 of the third cycle is the same as the dry-etching step S04 of the second cycle. The mixed gas of $SF_6$ and $O_2$ is decomposed by plasma, and anisotropic etching with respect to Si is carried out. For this reason, Si is etched by the F-radical generated due to decomposition of $SF_6$ ($F+Si \rightarrow SiF_4$). This etching reaction occurs in isotropic etching. In order to carry out anisotropic etching, the etching reaction with respect to the side walls VSq and VLq may be suppressed by forming a protective film that adheres to the side walls VSq and VLq.

The anisotropic plasma etching using the mixed gas of $SF_6/O_2$ in the dry-etching step S04 of the third cycle is the same as the dry-etching step S04 of the second cycle. The deposition layer D3 is removed from the side walls VSq and VLq corresponding to the opening patterns MS and ML, respectively, and the side walls VSq and VLq are exposed.

Here, the anisotropic plasma plasma etching using the mixed gas of $SF_6/O_2$ in the dry-etching step S04 of the third cycle is the same as the dry-etching step S04 of the second cycle. That is, the side walls VSq and VLq may be protected by forming an insulating layer on the side walls. At the same time, the side walls VSq and VLq are protected by oxidation of the side walls VSq and VLq due to oxygen (O) and formation of the deposition layer of $SiO_x$ generated due to reaction of O and Si obtained by re-decomposition of the etching product of $SiF_4$.

Furthermore, the dry-etching step S04 of the third cycle is the same as the dry-etching step S04 of the second cycle. $SiF_4$ can be used as an etching gas in order to prevent lack of the etching product of $SiF_4$.

Moreover, the dry-etching step S04 of the third cycle is the same as the dry-etching step S04 of the second cycle. $SF_6$ or $NF_3$ is used as an etching gas, $SiF_4$ serving as a silicon compound is added to the etching gas, and $O_2$, $N_2$, $N_2O$, NO, $NO_x$, or $CO_2$ which serves as a reactant is added to the gas. Accordingly, the bottom portions VSb2 and VLb2 can be intensively etched.

Additionally, the processing time of the dry-etching step S04 of the third cycle can also be longer than the processing time of at least one of the dry-etching step S04 of the first cycle and the dry-etching step S04 of the second cycle.

Figure 16:
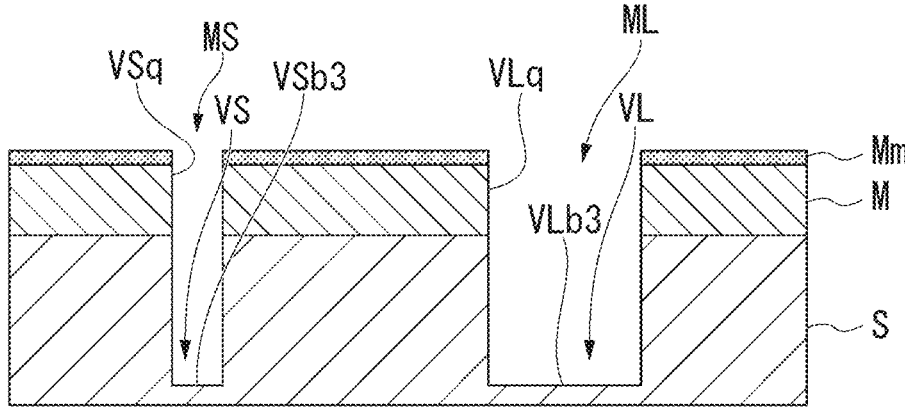
FIG. 16 is a cross-sectional view showing the cycle etching step of the plasma processing method according to the Example of the invention.

FIG. 16 is a cross-sectional view showing a step of the silicon dry etching method according to the Example.

In the ashing step S05 of the third cycle shown in FIG. 5, the remaining deposition layer D3 is removed after the dry-etching step S04 of the third cycle is completed as shown in FIG. 16.

Particularly, in the ashing step S05 of the third cycle, the ashing conditions are set so as to reliably remove the deposition layer D3 that remains on the region close to the inner-peripheral portions of the opening pattern MS and the opening pattern ML of the resist layer M and formed on the region close to the surface of the resist protective film Mm.

The ashing step S05 of the third cycle is the same as at least one of the first cycle and the second cycle. After the dry-etching step S04 of the third cycle is completed, the deposition layer D3 adhered to the surface of the resist protective film Mm, the deposition layer D3 that remains on the region close to the inner-peripheral portions of the openings of the opening pattern MS and the opening pattern ML, and the deposition layers D3 that remain on the side walls VSq and VLq corresponding to the opening patterns MS and ML, respectively, are removed.

Furthermore, in the ashing step S05 of the third cycle, in a case in which the deposition layer D3 remains on the bottom portion VSb3 corresponding to the opening pattern MS and the deposition layer D3 remains on the bottom portion VLb3 corresponding to the opening pattern ML, the deposition layer D3 is removed.

In this situation, the film thickness of the resist protective film Mm does not change. The resist protective film Mm substantially remains in the ashing step S05 of the third cycle.

Here, it is most important to remove the deposition layer D3 that remains at the inner-periphery position of the opening pattern MS and the deposition layer D3 that remains at the inner-periphery position of the opening pattern ML. When the deposition layer D3 remains without being removed, a next deposition layer D4 is further deposited on the remaining deposition layer D3 in the deposition step S03 of the next fourth cycle of the repetitive cycles to be carried out. In this case, the opening diameters (opening spaces) of the opening pattern MS and the opening pattern ML of the resist layer M and the resist protective film Mm decrease.

As described above, in a case in which the opening diameters of the opening pattern MS and the opening pattern ML of the resist layer M decrease, even where the etching with a high degree of anisotropy is carried out in the dry-etching step S04 of the fourth cycle carried out next to the third cycle, the deposition layer D3 and the deposition layer D4 inhibit the etching plasma from reaching the bottom portion VSb3 and the bottom portion VLb3. Accordingly, the etching with respect to the bottom portion VSb3 and the bottom portion VLb3 is preferably not carried out, the side walls VSq and VLq corresponding to the opening patterns MS and ML, respectively, are not vertical, and therefore there is possibility that the shapes of the recess patterns VS and VL each become a tapered shape.

In contrast, in a state in which the deposition layer D3 does not remain at the inner-periphery position of the opening pattern MS and the deposition layer D3 does not remain at the inner-periphery position of the opening pattern ML in the ashing step S05 of the third cycle, the deposition layer D4 is not further deposited on the remaining deposition layer D3 in the deposition step S03 of the fourth cycle of the repetitive cycles. For this reason, the opening diameters (opening spaces) of the opening pattern MS and the opening pattern ML of the resist layer M and the resist protective film Mm can be maintained so as to have a predetermined size.

Therefore, in the dry-etching step S04 of the fourth cycle of the repetitive cycles, as a result of carrying out the etching with a high degree of anisotropy, reach of the etching plasma to the bottom portion VSb3 and the bottom portion VLb3 is not inhibited by the deposition layer D3 and the deposition layer D4. Consequently, the etching with respect to the bottom portion VSb3 and the bottom portion VLb3 is preferably carried out, and the side walls VSq and VLq extend in a state of being vertical to the surface of the silicon substrate S so as to correspond to the opening patterns MS and ML. As a result, the shapes of the recess patterns VS and VL are prevented from being a tapered shape. It is possible to form each of the recess patterns VS and VL with a high-aspect ratio so as to have a uniform diameter in the depth direction.

It is important for the resist protective film Mm to maintain a sufficient film thickness in this situation so as to cause the resist layer M not to disappear in the ashing step S05.

In the ashing step S05 of the third cycle, the deposition layer D3 that remains at the inner-periphery positions of the opening patterns MS and ML is reliably removed as described above. For this purpose, in a similar way to the case of the ashing step S05 of the first cycle and the ashing step S05 of the second cycle, it is necessary to generate plasma with high anisotropy. Therefore, also in the ashing step S05 of the third cycle, the plasma processing apparatus 10 shown in FIGS. 1 and 2 described above is used.

In this situation, when carrying out the ashing step S05 of the third cycle in the plasma processing apparatus 10, the high-frequency power of the first frequency λ1 is applied to the first electrode E1 and the second electrode E2 in a similar way to the case of the ashing step S05 of at least one of the first cycle and the second cycle. The high-frequency power of the second frequency λ2 is applied to the third electrode E3. The first frequency λ1 is set higher than the second frequency λ2. Particularly, the first frequency λ1 is 13.56 MHz, and the second frequency λ2 is 2 MHz.

Moreover, the ashing step S05 of the third cycle is the same as the ashing step S05 of at least one of the first cycle and the second cycle. The values of the alternating-current powers having the first frequency λ1 applied to the first electrode E1 and the second electrode E2 may be set higher than those of the deposition step S03 of the third cycle and may be set the same as those of the dry-etching step S04 of the third cycle.

Moreover, the ashing step S05 of the third cycle is the same as the ashing step S05 of at least one of the first cycle and the second cycle. The values of the alternating-current powers having the first frequency λ1 applied to the first electrode E1 and the second electrode E2 may be set the same as the value of the alternating-current power having the second frequency λ2 applied to the third electrode E3.

Moreover, the ashing step S05 of the third cycle is the same as the ashing step S05 of at least one of the first cycle and the second cycle. It is preferable to apply the bias voltage having the frequency λ3 to the inner electrode 12. The frequency λ3 may be set lower than the second frequency λ2 of the alternating-current power applied to the third electrode E3. The frequency λ3 may be, for example, 400 kHz.

Also, the value of the bias voltage of the ashing step S05 of the third cycle may be set equal to the value of the bias voltage of the dry-etching step S04 of the third cycle or higher than the value of the bias voltage of the dry-etching step S04 of the third cycle.

In the ashing step S05 of the third cycle, it is possible to carry out the ashing by supply of $O_2$ gas. According to the anisotropic plasma processing using the $O_2$ gas, the deposition layer D3 is reliably removed and the side walls VSq and VLq are exposed at the regions close to the inner-peripheral portions of the opening patterns MS and ML, and the side walls VSq and VLq corresponding to the opening patterns MS and ML, respectively. At the same time, the ashing is carried out by supply of $O_2$ gas in the ashing step S05 of the third cycle. Since the resist protective film Mm is formed on the resist layer M, the resist layer M is not removed by $O_2$ plasma.

Furthermore, the ashing step S05 of the third cycle is the same as at least one of the ashing step S05 of the first cycle and the second cycle. The alternating-current power having the first frequency λ1 output from the high-frequency power source 17 is split into the first electrode E1 and the second electrode E2 by the power splitter 16.

Therefore, it is possible to suppress variations in ashing rate of the deposition layer D3 in the radial direction. Here, the split ratio of the first electrode E1 and the second electrode E2 controlled by the power splitter 16 is set depending on the kinds of processing gas and the variations in the ashing rate. Furthermore, the split ratio of the ashing step S05 of the third cycle may be equal to or different from that of the ashing step S05 of at least one of the first cycle and the second cycle.

In the silicon dry etching method according to the Example, the deposition step S03, the dry-etching step S04, and the ashing step S05 which constitute one cycle are repetitively carried out as shown in FIG. 5. That is, a plurality of cycles are repetitively carried out. Consequently, the depths of the recess patterns VS and VL further become large.

As shown in FIG. 5, the depth-determining step S06a and the resist protection determining step S06 are carried out after the deposition step S03 to the ashing step S05 of the third cycle is completed.

In the depth-determining step S06a of the third cycle, it is determined whether to proceed to the subsequent resist protection determining step S06. At this time, regarding the determination standard of the depth-determining step S06a, determination in accordance with the depths of the recess patterns VS and VL is carried out. In other words, the determination in accordance with the aspect ratio of the recess patterns VS and VL is carried out.

When it is determined that the depths of the recess patterns VS and VL are not sufficient in the depth-determining step S06a (determination result: NO), it is determined that the etching step of the subsequent cycle is necessary, and the step proceeds to the resist protection determining step S06. In the resist protection determining step S06, it is determined whether to proceed to the resist protective film forming step S07 described below.

On the other hand, when it is determined that the depths of the recess patterns VS and VL are sufficient in the depth-determining step S06a (determination result: YES), the etching cycle is completed, and the step proceeds to the post-treatment step S08.

In the resist protection determining step S06 of the third cycle, it is determined whether to carry out the subsequent cycle including the etching step without carrying out the resist protective film forming step S07 or whether the step proceeds to the resist protective film forming step S07 described below.

Here, regarding the determination standard of the resist protection determining step S06 of the third cycle, the determination in accordance with the depths of the recess patterns VS and VL, and the determination in accordance with the degree of etching with respect to the resist protective film Mm, that is, the determination in accordance with the degree of reduction in the thickness of the resist protective film Mm are carried out.

When the ashing step S05 carried out in the third cycle is completed, the depths of the recess patterns VS and VL or the aspect ratios thereof are sufficient values. Accordingly, regarding the determination standard of the resist protection determining step S06 to be carried out in the third cycle, the determination in accordance with the degree of etching with respect to the resist protective film Mm is carried out, that is, the determination in accordance with the degree of reduction in the thickness of the resist protective film Mm is carried out.

In the resist protection determining step S06 of the third cycle, the determination is carried out at the point in time after the deposition step S03 to the ashing step S05 of the third cycle are completed. Specifically, when it is determined that the film thickness of the resist protective film Mm is sufficient and the characteristics of protecting the resist layer M are obtained, that is, the resistance to etching is maintained in the deposition step S03 and the dry-etching step S04 of the fourth cycle to be next carried out, it is determined whether to proceed the fourth cycle for the subsequent cycle.

Furthermore, in the resist protection determining step S06 of the third cycle, when it is predicted that the film thickness of the resist protective film Mm is not sufficient and the characteristics of protecting the resist layer M are not sufficiently obtained, that is, a sufficient resistance to etching is not obtained, it is determined that the step proceeds to the resist protective film forming step S07.

In other cases, the determination of the resist protection determining step S06 of the third cycle may be based on the measurement result obtained by measuring the film thickness of the remaining resist protective film Mm after the third cycle is carried out. The determination may be based on an estimation of the resist protective film Mm maintaining a sufficient film thickness from the etching condition of the second cycle, and it is determined whether to proceed to the fourth cycle. In the determination based on the etching conditions, the degree of reduction in the thickness of the resist protective film Mm obtained by a predetermined condition is set in advance, and the determination is carried out based on the preset value.

Note that, in a case in which one cycle is constituted of the deposition step S03, the dry-etching step S04, and the ashing step S05 as described above in the processing steps of the silicon substrate S, after approximately 5 to 20 cycles are carried out, preferably, after approximately 8 to 12 cycles are carried out, one resist protective film forming step S07 can be carried out between the cycles.

Next, the fourth cycle will be described.

Figure 17:
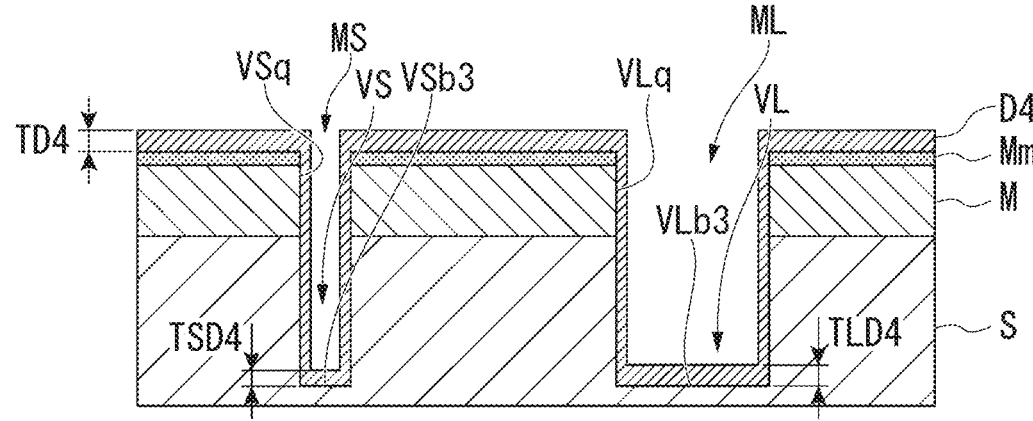
FIG. 17 is a cross-sectional view showing the cycle etching step of the plasma processing method according to the Example of the invention.

FIG. 17 is a cross-sectional view showing a step of the silicon dry etching method according to the Example.

In the deposition step S03 shown in FIG. 5 of the fourth cycle, a deposition layer D4 made of a polymer such as fluorocarbon or the like is formed on the surface of the resist protective film Mm by anisotropic plasma processing as shown in FIG. 17. In the dry-etching step S04 to be carried out after the deposition step S03 of the fourth cycle, it is possible to protect the side walls of the recess pattern VS and the recess pattern VL from being etched.

In this situation, although the film thickness of the resist protective film Mm slightly decreases, the resist protective film Mm almost remains in the deposition step S03.

The deposition layer D4 is formed in order to protect the side walls VSq and VLq of the recess patterns VS and VL from being etched, respectively, and in order to limitedly carry out etching with respect to the bottom portions VSb3 and VLb3 of the recess patterns VS and VL, respectively. Consequently, the vertical side walls VSq and VLq are obtained in the dry-etching step S04, which is etching using a fluorine compound.

The deposition layer D4 is formed on the surface of the resist protective film Mm and the bottom portions VSb3 and VLb3 of the recess patterns VS and VL. Moreover, although FIG. 17 shows that the deposition layer D4 is on the side walls VSq and VLq of the recess patterns VS and VL, practically, the deposition layer D4 is almost not formed on the side walls VSq and VLq.

The deposition step S03 of the fourth cycle is the same as that of the third cycle. That is, an anisotropic plasma processing is carried out using a fluorocarbon gas such as $CHF_3$, $C_2F_6$, $C_2F_4$, $C_4F_8$, or the like. In the deposition step S03, the plasma processing apparatus 10 shown in FIGS. 1 and 2 described above is used in order to carry out the plasma processing with high anisotropy.

When carrying out the deposition step S03 of the fourth cycle, in the plasma processing apparatus 10, the high-frequency power of the first frequency λ1 is applied to the first electrode E1 and the second electrode E2. The high-frequency power of the second frequency λ2 is applied to the third electrode E3. The first frequency λ1 is set higher than the second frequency λ2. Particularly, the first frequency λ1 is 13.56 MHz, and the second frequency λ2 is 2 MHz.

At this time, the processing conditions of the deposition step S03 of the fourth cycle may be set the same as the deposition step S03 of at least one of the first cycle to the third cycle.

Moreover, in the deposition step S03 of the fourth cycle in the plasma processing apparatus 10, the values of the alternating-current powers having the first frequency λ1 applied to the first electrode E1 and the second electrode E2 may be set lower than those of the dry-etching step S04 and the ashing step S05 of the fourth cycle. Furthermore, in the deposition step S03 of the fourth cycle in the plasma processing apparatus 10, a bias voltage may not be applied to the inner electrode 12.

In the deposition step S03 of the fourth cycle, the processing is carried out in a state in which the pressure of the internal space 11N is set to a predetermined pressure. Moreover, the processing conditions of the deposition step S03 of the fourth cycle may be set the same as the deposition step S03 of at least one of the first cycle to the third cycle.

Additionally, the deposition step S03 of the fourth cycle is the same as the deposition step S03 of at least one of the first cycle to the third cycle. The alternating-current power having the first frequency λ1 output from the high-frequency power source 17 is split into the first electrode E1 and the second electrode E2 by the power splitter 16.

Therefore, it is possible to suppress variations in deposition rate of the deposition layer D4 in the radial direction. Here, the split ratio of the first electrode E1 and the second electrode E2 controlled by the power splitter 16 is set depending on the kinds of processing gas and the variations in the deposition rate. Furthermore, the split ratio of the deposition step S03 of the fourth cycle may be equal to or different from that of the deposition step S03 of at least one of the first cycle to the third cycle.

The film thickness of the deposition layer D4 formed in the deposition step S03 of the fourth cycle is the same as that of at least one of the deposition steps S03 of the first cycle to the third cycle. The film thickness of the deposition layer D4 formed on the bottom portion VLb3 corresponding to the opening pattern ML having a large diameter becomes larger than the film thickness of the deposition layer D4 formed on the bottom portion VSb3 corresponding to the opening pattern MS having a small diameter. Note that, the film thickness of the deposition layer D4 formed on the bottom portion VLb3 of the opening pattern ML becomes equal to or smaller than the film thickness of the deposition layer D4 formed on the surface of the resist protective film Mm located outside the opening patterns MS and ML.

That is, regarding the film thickness of the deposition layer D4, the film thicknesses gradually become smaller in the order of the film thickness TD4 of the deposition layer D4 formed on the surface of the resist protective film Mm positioned outside the opening patterns MS and ML, the film thickness TLD4 of the deposition layer D4 formed on the bottom portion VLb3 of the opening pattern ML, and the film thickness TSD4 of the deposition layer D4 formed on the bottom portion VSb3 of the opening pattern MS.

In the deposition step S03 of the fourth cycle, the deposition coverage of the deposition layer D4 of the bottom portions VSb3 and VLb3 corresponding to the opening patterns MS and ML, respectively, can be controlled so as to obtain optimized deposition coverage by setting deposition conditions as described above. Here, the preferred conditions for forming the deposition coverage are those that shorten a processing time required for causing the deposition layer D4 having a necessary film thickness to be formed on the bottom portions VSb3 and VLb3. That is, the preferred conditions for forming the deposition layer D4 are those that increase the film-formation rate of the deposition layer D4 formed on the bottom portions VSb3 and VLb3.

Furthermore, in the deposition step S03 of the fourth cycle, the preferred conditions for forming the deposition coverage are those that control the deposition coverage in accordance with the etching depth and the aspect ratio. That is, as described below, the depths of the bottom portions VSb2 and VLb2 are different from the depths of the bottom portions VSb3 and VLb3, and therefore the depths of the bottom portions are changed. Even in a case in which the aspect ratio is changed depending on variations in the depths of the bottom portions as described above, it is possible to form the deposition layer D4 having a desired thickness at a predetermined film-formation rate.

Moreover, the preferred conditions for forming the deposition coverage are those that improve uniformity and reliability with respect to the deposition layer D4 formed on the bottom portion VSb3 and improve uniformity and reliability with respect to the deposition layer D4 formed on the bottom portion VLb3.

In the dry-etching step S04 of the fourth cycle shown in FIG. 5, the bottom portions VSb3 and VLb3 corresponding to the opening patterns MS and ML are etched by anisotropic plasma etching, and the positions of the bottom portions VSb3 and VLb3 are lowered. Because of this, in the opening patterns MS and ML, bottom portions are formed at positions deeper than the positions of the bottom portions VSb3 and VLb3.

In this situation, although the film thickness of the resist protective film Mm slightly decreases, the resist protective film Mm almost remains in the dry-etching step S04 of the fourth cycle.

Additionally, the dry-etching step S04 of the fourth cycle is the same as the dry-etching step S04 of at least one of the first cycle to the third cycle. The alternating-current power having the first frequency λ1 output from the high-frequency power source 17 is split into the first electrode E1 and the second electrode E2 by the power splitter 16.

Therefore, it is possible to suppress variations in etching rate with respect to the deposition layer D4 in the radial direction. Here, the split ratio of the first electrode E1 and the second electrode E2 controlled by the power splitter 16 is set depending on the kinds of processing gas and the variations in the etching rate. Furthermore, the split ratio of the dry-etching step S04 of the fourth cycle may be equal to or different from that of the dry-etching step S04 of at least one of the first cycle to the third cycle.

Next, in the ashing step S05 of the fourth cycle shown in FIG. 5, the remaining deposition layer D4 is removed. In this situation, the film thickness of the resist protective film Mm slightly decreases.

Moreover, the ashing step S05 of the fourth cycle is the same as the ashing step S05 of at least one of the first cycle to the third cycle. The alternating-current power having the first frequency λ1 output from the high-frequency power source 17 is split into the first electrode E1 and the second electrode E2 by the power splitter 16.

It is possible to suppress variations in ashing rate of the deposition layer D4 in the radial direction. Here, the split ratio of the first electrode E1 and the second electrode E2 controlled by the power splitter 16 is set depending on the kinds of processing gas and the variations in the ashing rate. Furthermore, the split ratio of the ashing step S05 of the fourth cycle may be equal to or different from that of the ashing step S05 of at least one of the first cycle to the third cycle.

Furthermore, the depth-determining step S06a and the resist protection determining step S06 of the fourth cycle are carried out. Based on the thickness of the resist protective film Mm, it is determined whether to insert the resist protective film forming step S07 between the cycles after the aforementioned cycles are carried out at a predetermined frequency. Even in a case of not carrying out the resist protective film forming step S07 or in a case of carrying out the resist protective film forming step S07, the cycle including the dry-etching step S04 is carried out.

As a result, the recess pattern VS having the diameter of ΦS and the recess pattern VL having the diameter of ΦL are formed on the surface of the silicon substrate S so as to have the same depth.

Furthermore, in the post-treatment step S08 shown in FIG. 5, if necessary, the resist protective film Mm is removed by carrying out the processing similar to the dry-etching step S04. Moreover, the resist layer M is removed by carrying out a wet etching step or the processing similar to the ashing step S05. Consequently, the silicon dry etching method according to the Example is completed.

Note that, approximately 50 cycles can be used for the silicon dry etching method according to the Example.

Experimental Example 1

As described above, the plasma processing apparatus 10 shown in FIGS. 1 and 2 was used, and the alternating-current power having the first frequency λ1 output from the high-frequency power source 17 was split into the first electrode E1 and the second electrode E2 by the power splitter 16. Here, a change in profile of the processing characteristics in the radial direction was evaluated when changing the split ratio of the alternating-current powers split into the first electrode E1 and the second electrode E2. Furthermore, a change in profile of the processing characteristics in the radial direction in a case of dual-frequency ICP (Inductively Coupled Plasma) was evaluated. Particularly, plasma processing of a step suitably selected from the following steps was evaluated.

Deposition step: deposition step S03 of forming a silicon-containing thin film

Etching step: etching step S04 of using a carbon-containing film as a mask and forming a TSV bottom portion of the insulating layer Ashing step: ashing step S05 of ashing the carbon-containing film Deposition step: deposition step S07 of forming a carbon-containing thin film (corresponding to the resist protective film forming step S07)

Here, film formation on a silicon substrate of Φ300 mm was evaluated as evaluation of plasma processing using power splitting (electricity distribution) with $SiF_4/O_2$. Here, the "IN" means the alternating-current power supplied to the first electrode E1. The "OUT" means the alternating-current power supplied to the second electrode E2. The split ratio of electric power between IN and OUT was changed in a range of IN:OUT=999:0 to 0:999 (corresponding to the split ratio 0.9:0.1 to 0.1:0.9).

The items of the conditions for the film formation using power splitting are as follows.

The plasma processing apparatus 10 shown in FIGS. 1 and 2 was used, and the gas was supplied from the gas introduction part 30 through the gas introduction hole 15 to the internal space 11N of the chamber 11. Furthermore, the diameter D (mm) of the inner electrode 12 serving as the substrate support was 400 mm. The diameter d (mm) of the second electrode (antenna AT2) was 400 mm.

Processing Conditions of Deposition Step

Supply gas: $SiF_4/O_2$

Flow rate of supply gas: $SiF_4/O_2$=160/150 sccm

First frequency λ1: 13.56 MHz

Supply power of first frequency λ1: 1800 W

Split ratio of supply power having first frequency λ1:
IN:OUT=999:0 to 0:999 (corresponding to split ratio 0.9:0.1 to 0.1:0.9)
Supply power of second frequency λ2: 0 W
Processing time of film formation: 120 sec
Temperature of inner electrode: −10° C.

The results of the film formation using power splitting are as follows.

FIGS. 18 to 22 are graphs showing a change in film thickness in the radial direction in the case of the Example using power splitting. In FIGS. 18 to 22, reference letters X and Y mean a radial direction of the substrate. The X and Y mean the directions orthogonal to each other. Furthermore, the X means the results obtained by calculating the film thickness in the X direction. The Y means the results obtained by calculating the film thickness in the Y direction. The "DISTANCE FROM THE CENTER OF THE SUBSTRATE" means the distance in a direction from the center of the silicon substrate S to the periphery of the substrate S (radially outward direction).

Figure 18:
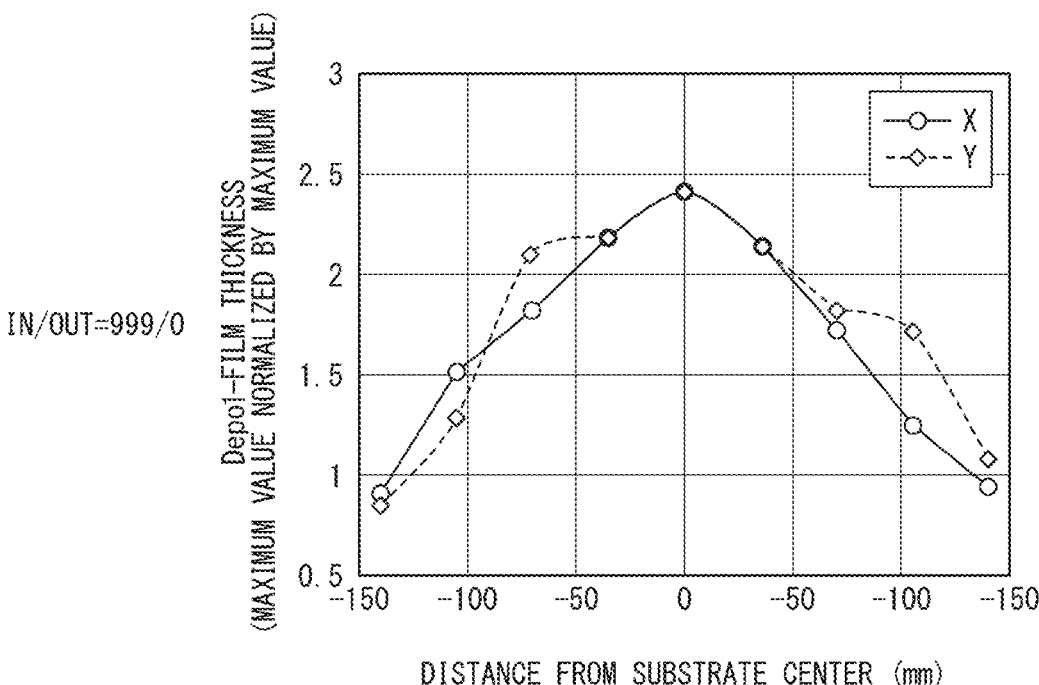
FIG. 18 is a graph showing a change in film thickness by the power splitter used in the plasma processing method according to the Example of the invention.
Figure 19:
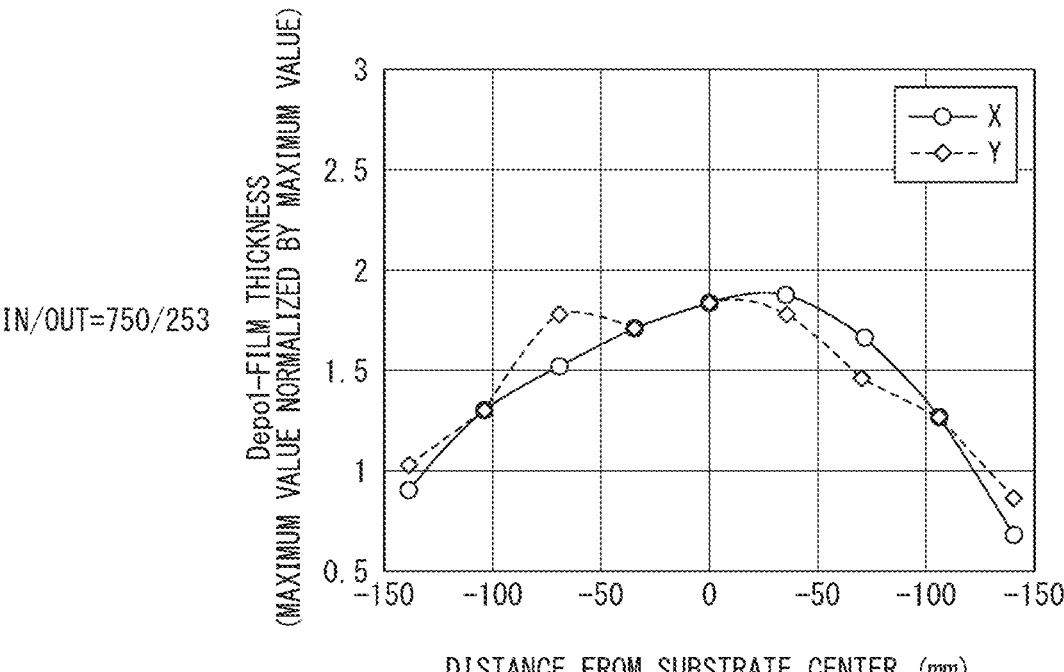
FIG. 19 is a graph showing a change in film thickness by the power splitter used in the plasma processing method according to the Example of the invention.
Figure 20:
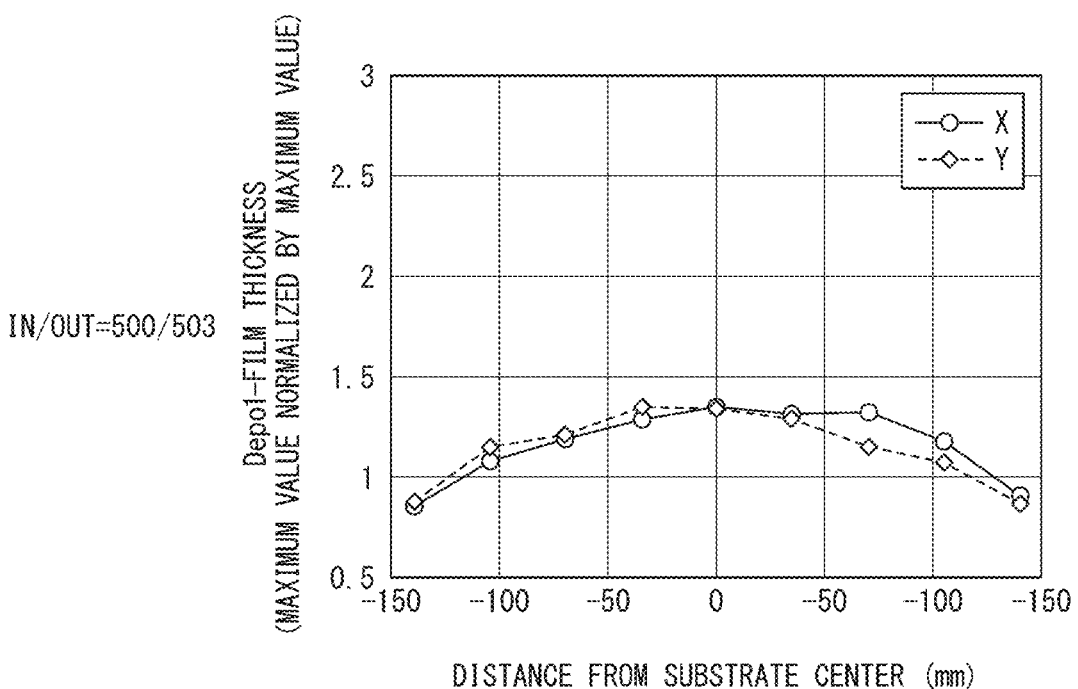
FIG. 20 is a graph showing a change in film thickness by the power splitter used in the plasma processing method according to the Example of the invention.
Figure 21:
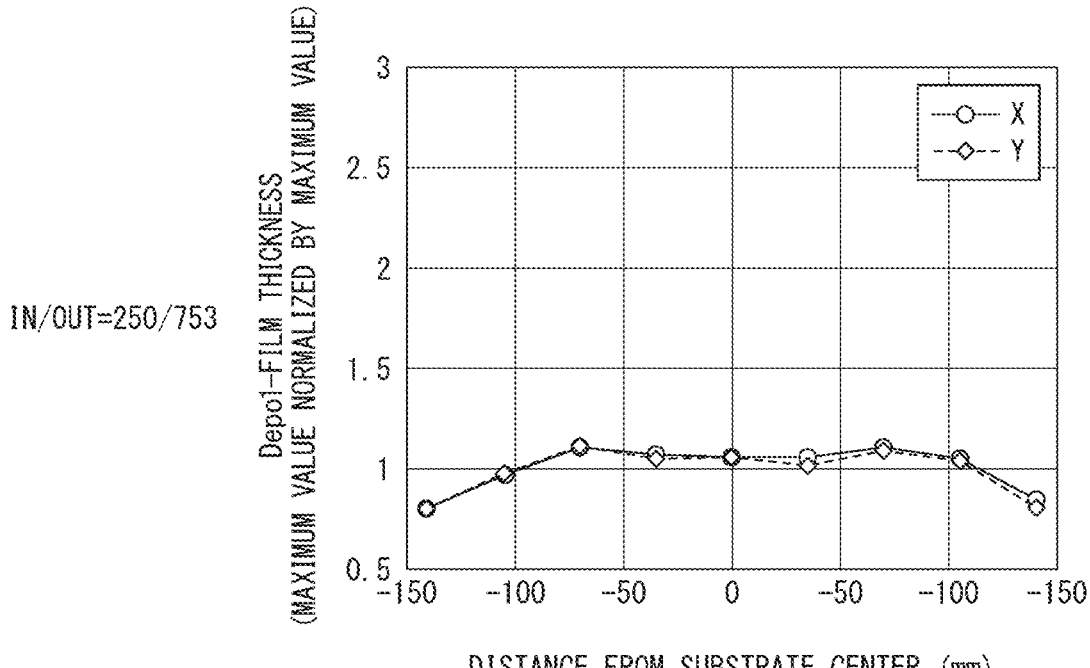
FIG. 21 is a graph showing a change in film thickness by the power splitter used in the plasma processing method according to the Example of the invention.
Figure 22:
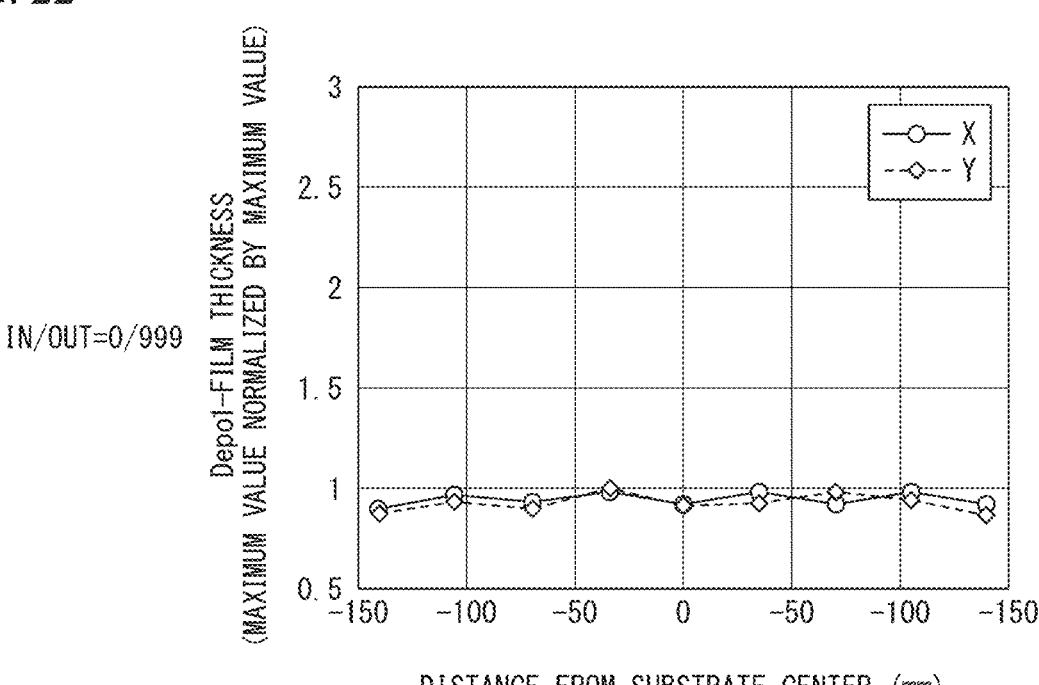
FIG. 22 is a graph showing a change in film thickness by the power splitter used in the plasma processing method according to the Example of the invention.

Note that, regarding the split ratio, FIG. 18 shows a case of IN:OUT=999:0 (split ratio 0.9:0.1), FIG. 19 shows a case of IN:OUT=750:253 (split ratio 0.75:0.25), FIG. 20 shows a case of IN:OUT=500:503 (split ratio 0.5:0.5), FIG. 21 shows a case of IN:OUT=250:753 (split ratio 0.25:0.75), and FIG. 22 shows a case of IN:OUT=0:999 (split ratio 0.1:0.9).

From the results shown in FIGS. 18 to 22, it was found that it is possible to vary the in-plane distribution of the film thickness. Consequently, with respect to the film thickness distribution such as being obtained in the state in which power splitting were not carried out, it was found that it is possible to control the film thickness distribution so as to correct the film thickness distribution by adjustment of the split ratio.

Experimental Example 2

Next, the relationship between an RF distribution (split ratio) and gas introduction was verified.

In the plasma processing apparatus 10 shown in FIGS. 1 and 2, the gas supply route from the gas introduction part 30 to the internal space 11N of the chamber 11 was changed. Specifically, regarding comparison of the case of supplying the gas to the internal space 11N through the gas introduction hole 14 (CIRCUMFERENCE GAS) and the case of supplying the gas to the internal space 11N through the gas introduction hole 15 (CENTER GAS), RF distribution (split ratio) was verified. Moreover, when the types of supply gas were changed and the power splitter was used, the film thickness distribution in the radial direction (change in deposition rate) was evaluated.

The items of the conditions for the film formation by changing the gas supply route are as follows.

In the plasma processing apparatus 10 shown in FIGS. 1 and 2, the diameter D (mm) of the inner electrode 12 serving as the substrate support was 400 mm. The diameter d (mm) of the second electrode (antenna AT2) was 400 mm.
Processing Conditions of Deposition Step
Flow rate of supply gas: $C_4F_8$: 200 sccm
Flow rate of supply gas: $SiF_4/O_2$=160/150 sccm
First frequency λ1: 13.56 MHz
Supply power of first frequency λ1: 2000 W
Supply power of second frequency λ2: 0 W
Processing time of film formation: 120 sec
Temperature of inner electrode: −10° C.

The results of the film formation by changing the gas supply route are as follows.

Figure 23:
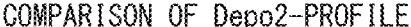
FIG. 23 is a graph showing a change in film thickness by the plasma processing method according to the Example of the invention.
Figure 24:
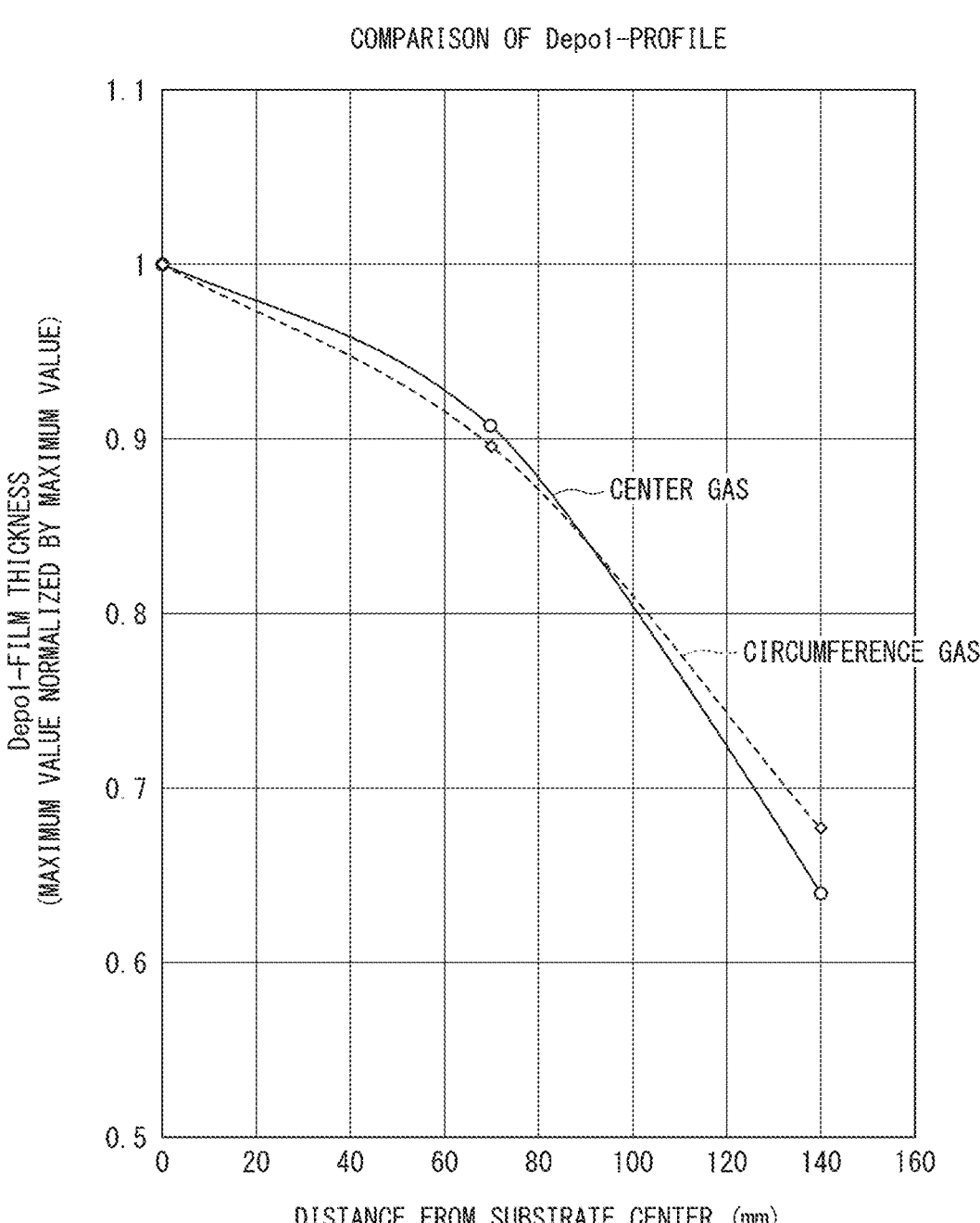
FIG. 24 is a graph showing a change in film thickness by the plasma processing method according to the Example of the invention.

FIG. 23 is a graph showing a change in film thickness distribution in the radial direction in the case of the Example using $C_4F_8$ gas. FIG. 24 is a graph showing a change in film thickness distribution in the radial direction in the case of the Example using $SiF_4/O_2$ gas.

In FIGS. 23 and 24, the "CENTER GAS" means the case of supplying the gas to the internal space 11N through the gas introduction hole 15. The "CIRCUMFERENCE GAS" means the case of supplying the gas to the internal space 11N the gas introduction hole 14.

Furthermore, Depo1 means the results of the film formation using $SiF_4/O_2$ gas. Depo2 means the results of the film formation using $C_4F_8$ gas.

From the results shown in FIGS. 23 and 24, it was found that the distribution of the film thickness of Depo2 using $C_4F_8$ gas significantly varies depending on the position of the gas introduction hole. It was found that the film thickness of Depo1 using $SiF_4/O_2$ gas does not significantly vary even in the case of changing the position of the gas introduction hole.

Additionally, it was found that RF of 13.56 MHz affects the distribution of the film thickness of Depo1 using $SiF_4/O_2$ gas. That is, it was found that it is necessary to control the film thickness of Depo1 using $SiF_4/O_2$ gas by adjustment of the plasma profile using the power splitter 16.

Experimental Example 3

Next, the relationship between an RF distribution (split ratio) and an etching depth was verified.

Here, the plasma processing apparatus 10 shown in FIGS. 1 and 2 was used, and the gas was supplied from the gas introduction part 30 through the gas introduction hole to the internal space 11N of the chamber 11. Etching was carried out by changing the split ratio of the alternating-current powers supplied to the first electrode E1 and the second electrode E2 using the power splitter 16, and the distribution of the etching depth (variations in etching rate) in the radial direction was evaluated.

The items of the conditions for the etching are as follows.

In the plasma processing apparatus 10 shown in FIGS. 1 and 2, the diameter D (mm) of the inner electrode 12 serving as the substrate support was 400 mm. The diameter d (mm) of the second electrode (antenna AT2) was 400 mm.
Processing Conditions of Etching Step
Flow rate of supply gas: $SF_6/SiF_4/O_2$=275/50/40 sccm
First frequency λ1: 13.56 MHz
Supply power of first frequency λ1: 1800 W
Split ratio of supply power having first frequency λ1:
IN:OUT=999:0, 750:250, 500:500, 250:550, 0:999
Supply power of second frequency λ2: 0 W
Processing time of film formation: 135 sec
Temperature of inner electrode: −10° C.
Gas introduction position: center (gas introduction hole 15)

The relationship between the RF distribution (split ratio) and the etching depth was evaluated, and the evaluation results are as follows.

Figure 25:
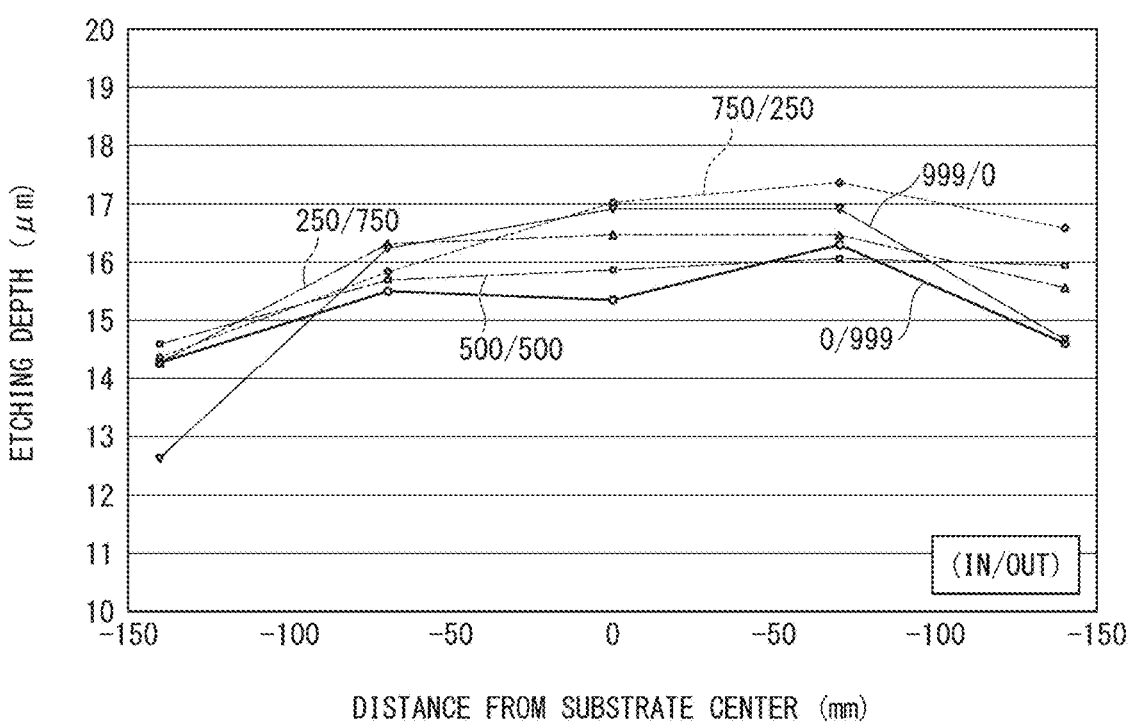
FIG. 25 is a graph showing a change of an etching state by the power splitter used in the plasma processing method according to the Example of the invention.

FIG. 25 is a graph showing a change in distribution of the etching depth in the radial direction in the case of the Example.

From the results shown in FIG. 25, it was found that, although the in-plane distribution of the TSV etching depth in the radial direction is changed by use of the power splitter, the amount of change is lower than the amount of change in film thickness in the deposition step.

Experimental Example 4

Next, the relationship between frequency superposition and an etching depth was verified.

Here, the plasma processing apparatus 10 shown in FIGS. 1 and 2 was used, and the gas was supplied from the gas introduction part 30 through the gas introduction hole 15 to the internal space 11N of the chamber 11. Furthermore, the alternating-current power having the second frequency λ2 was supplied to the third electrode E3. Etching was carried out by the frequency superposition of the alternating-current powers supplied to the first electrode E1, the second electrode E2, and the third electrode E3, and the distribution of the etching depth in the radial direction (variations in etching rate) was evaluated.

The items of the conditions for the etching are as follows.

In the plasma processing apparatus 10 shown in FIGS. 1 and 2, the diameter D (mm) of the inner electrode 12 serving as the substrate support was 400 mm. The diameter d (mm) of the second electrode (antenna AT2) was 400 mm.

Processing Conditions of Etching Step

Flow rate of supply gas: $SF_6/SiF_4/O_2 = 275/50/40$ sccm

First frequency λ1: 13.56 MHz

Supply power of first frequency λ1: 1800 W

Split ratio of supply power having first frequency λ1: IN:OUT=999:0

Second frequency λ2: 2 MHz

Supply power of second frequency λ2: 200 W

Processing time of film formation: 135 sec

Temperature of inner electrode: −10° C.

Gas introduction position: center (gas introduction hole 15)

Etching diameter: Φ5 μm

The results of the etching using the frequency superposition are as follows.

Figure 26:
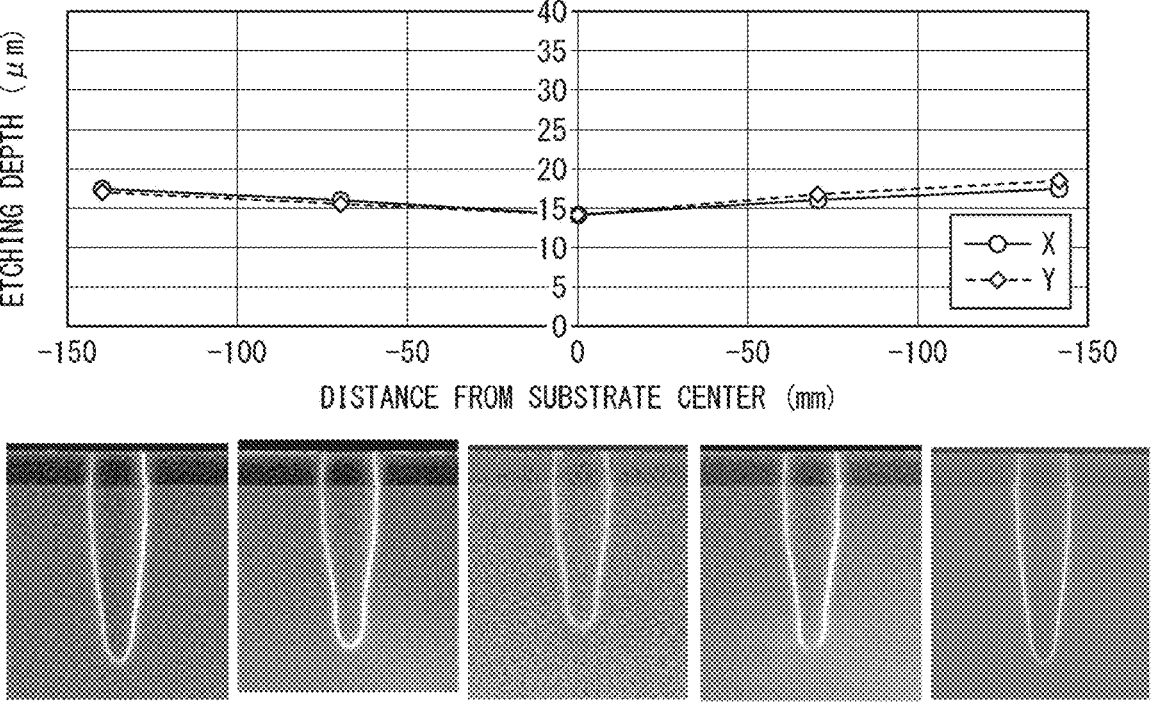
FIG. 26 is a graph showing a change in etching depth depending on frequency superposition in the plasma processing method according to the Example of the invention.

FIG. 26 is a graph showing a change in distribution of the etching depth in the radial direction in the case of the Example. Furthermore, FIG. 26 shows SEM images obtained at a plurality of measured points in the thickness direction of the substrate. Note that, the positions of each SEM image in the left-right direction shown in FIG. 26 correspond to the measured points of the graph. Moreover, the SEM image is an image at the measured point only in the X direction.

From the results shown in FIG. 26, it was found that the in-plane distribution of the etching depth in the radial direction varies by the dual-frequency superposition as compared with the case of the etching using the power splitting by the power splitter 16.

Experimental Example 5

Next, the relationship between the presence or absence of the frequency superposition and an etching depth was verified.

Here, the plasma processing apparatus 10 shown in FIGS. 1 and 2 was used, and the gas was supplied from the gas introduction part 30 through the gas introduction hole 15 to the internal space 11N of the chamber 11. Additionally, the distribution of the etching depth in the radial direction (variations in etching rate) depending on the presence or absence of the frequency superposition was evaluated by switching the supply of the alternating-current power having the second frequency λ2.

The items of the conditions for the etching are as follows.

In the plasma processing apparatus 10 shown in FIGS. 1 and 2, the diameter D (mm) of the inner electrode 12 serving as the substrate support was 400 mm. The diameter d (mm) of the second electrode (antenna AT2) was 400 mm.

Processing Conditions of Etching Step

Flow rate of supply gas: $SF_6/SiF_4/O_2 = 275/50/40$ sccm

First frequency λ1: 13.56 MHz

Supply power of first frequency λ1: 1800 W

Split ratio RFS of supply power of first frequency λ1: IN:OUT=999:0

Second frequency λ2: 2 MHz

Supply power of second frequency λ2: 200 W, 0 W

Processing time of film formation: 135 sec

Temperature of inner electrode: −10° C.

Gas introduction position: center (gas introduction hole 15)

Etching diameter: Φ5 μm

Bias electric power: 100 to 200 W

Frequency λ3 of bias electric power: 400 kHz

The results of the change in the etching depth depending on the presence or absence of the frequency superposition are as follows.

Figure 27:
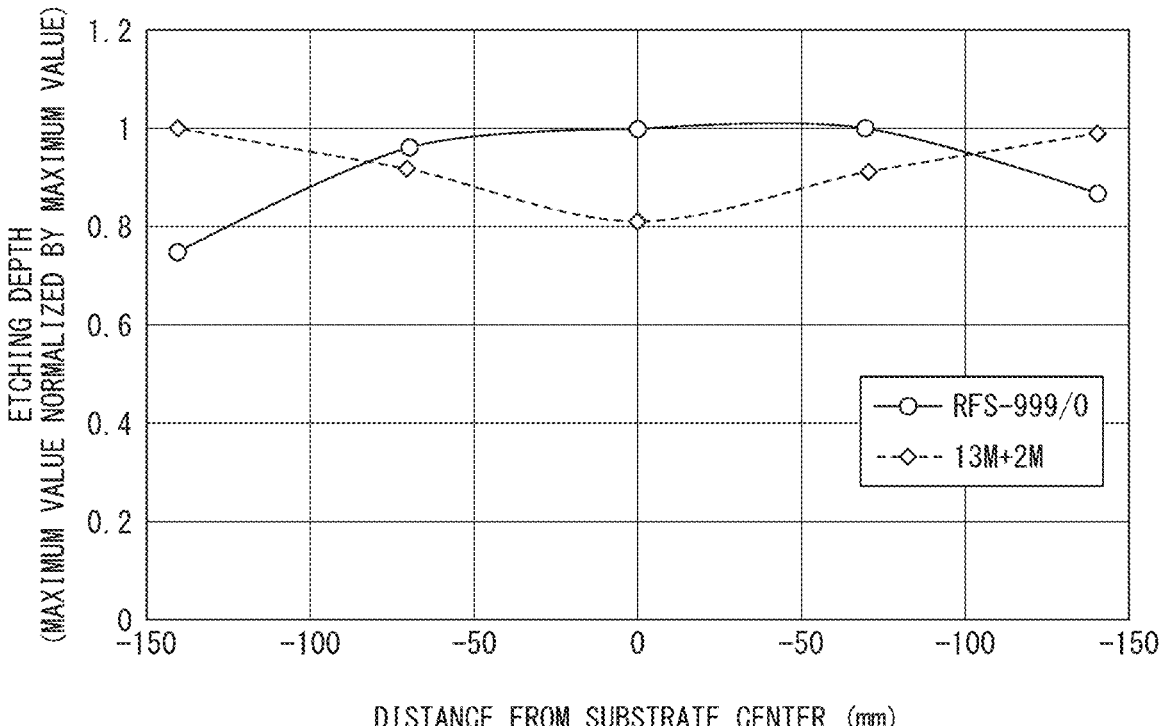
FIG. 27 is a graph showing a change in etching depth depending on the presence or absence of frequency superposition in the plasma processing method according to the Example of the invention.

FIG. 27 is a graph showing the change in the distribution of the etching depth in the radial direction depending on the presence or absence of the frequency superposition in the case of the Example.

From the results shown in FIG. 27, it was found that the distribution of the etching depth varies depending on the presence or absence of the dual-frequency superposition as compared with the case of the etching using the power splitting by the power splitter 16. In other words, it was found that a distribution of etching rate varies. Specifically, in the case of not carrying out the etching using the dual-frequency superposition, the etching depth at the center in the radial direction is larger, and the etching depth at the periphery of in the radial direction is smaller. In the case of carrying out the etching using the dual-frequency superposition, the etching depth at the center in the radial direction is smaller, and the etching depth at the periphery of in the radial direction is larger.

Experimental Example 6

Next, the relationship between the presence or absence of the frequency superposition and a change in film thickness was verified.

Here, the plasma processing apparatus 10 shown in FIGS. 1 and 2 was used, and the gas was supplied from the gas introduction part 30 through the gas introduction hole 15 to the internal space 11N of the chamber 11. Additionally, the film thickness distribution in the radial direction (variations in deposition rate) depending on the presence or absence of the frequency superposition was evaluated by switching the supply of the alternating-current power having the second frequency λ2.

Processing Conditions of Deposition Step

Supply gas: $SiF_4/O_2$

Flow rate of supply gas: $SiF_4/O_2 = 160/150$ sccm

First frequency λ1: 13.56 MHz

Supply power of first frequency λ1: 1800 W

Split ratio RFS of supply power of first frequency λ1: IN:OUT=999:0 (corresponding to split ratio of 0.9:0.1)

Second frequency λ2: 2 MHz

Supply power of second frequency λ2: 200 W, 0 W

Processing time of film formation: 120 sec

Temperature of inner electrode: −10° C.

The results of change in the film thickness of the deposition film depending on the presence or absence of the frequency superposition are as follows.

Figure 28:
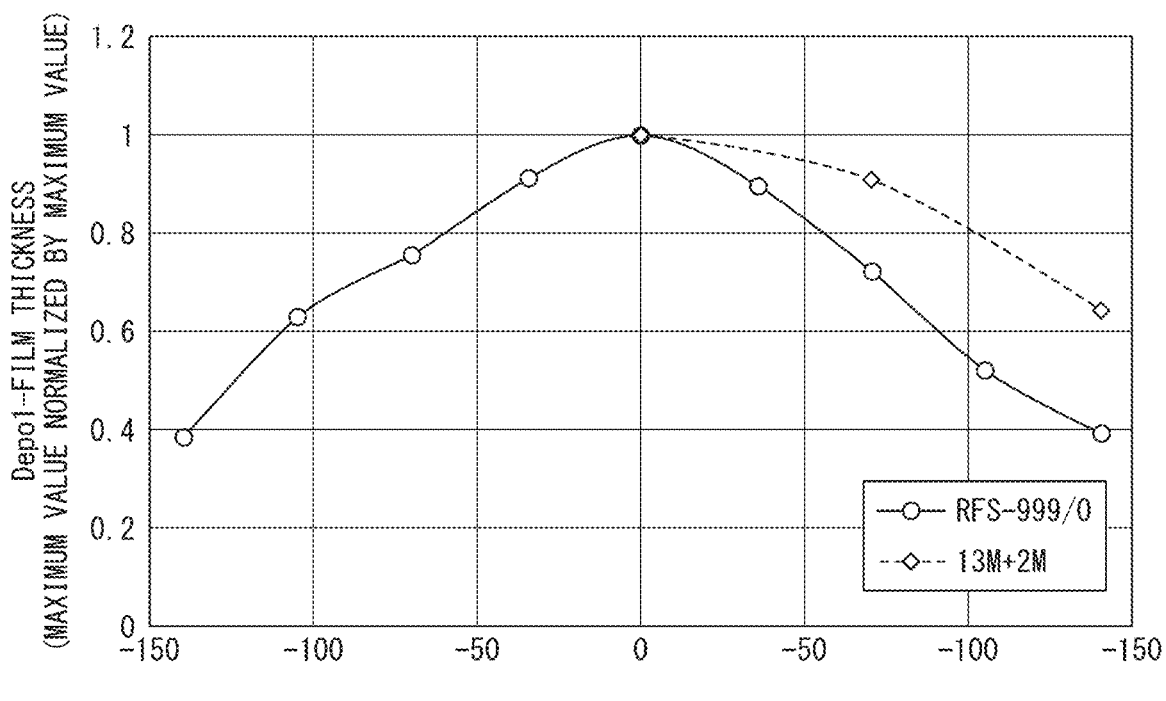
FIG. 28 is a graph showing a change in film thickness of a deposition film depending on the presence or absence of frequency superposition in the plasma processing method according to the Example of the invention.

FIG. 28 is a graph showing a change in film thickness of the deposition film in the radial direction depending on the presence or absence of the frequency superposition in the case of the Example.

From the results shown in FIG. 28, it was found that partially varies the film thickness of the deposition film depending on the presence or absence of the dual-frequency superposition as compared with the case of the etching using the power splitting by the power splitter 16. Specifically, it was found that, regardless of the presence or absence of the dual-frequency superposition, although the deposition rate of the film thickness of the deposition film at the center in the radial direction is large, the deposition rate at the outer-peripheral portion in the radial direction is smaller than the deposition rate at the center in the radial direction. Moreover, it was found that, in the case of carrying out the dual-frequency superposition (the dual-frequency superposition is present), the deposition rate at the outer-peripheral portion in the radial direction is larger than that of the case of not carrying out the dual-frequency superposition (the dual-frequency superposition is absent).

That is, from the results of the Experimental Example 5 shown in FIG. 27 and the results of the Experimental Example 6 shown in FIG. 28, in comparison of the case of using power splitting by the power splitter 16 is compared with the results due to the dual-frequency superposition, it was found the following points.

Regarding the etching depth, as the dual-frequency superposition is carried out, the etching depth was changed from the state in which the etching depth is large at the center of the substrate (Center Fast) to the state in which the etching depth is large at the outer-peripheral portion of the substrate (Edge Fast). The frequency of 2 MHz significantly affected the etching depth.

Regarding the film thickness of the deposition film, regardless of the presence or absence of the dual-frequency superposition, the state in which the film thickness is large at the center of the substrate (Center Fast) was not changed. Therefore, the effect of the frequency of 2 MHz on the film thickness was small.

It was necessary to adjust the deposition distribution and the etching distribution by the power splitter in order to improve the uniformity of processing on the surface of the substrate such that the in-plane distribution obtained by the etching step corresponds to the in-plane distribution obtained by the deposition step.

Experimental Example 7

Next, the state of magnetic field generated by power splitting and frequency superposition using the power splitter was verified.

Here, simulation for a space distribution of a generated magnetic field was carried out in each of two plasma processing apparatus.

A first plasma processing apparatus is the plasma processing apparatus 10 shown in FIGS. 1 and 2. The plasma processing apparatus includes a power splitter configured to split the alternating-current power having the first frequency $\lambda 1$ into the first electrode E1 and the second electrode E2; and a high-frequency power source configured to apply alternating-current power having a second frequency $\lambda 2$ to the third electrode E3. That is, the first plasma processing apparatus is a plasma processing apparatus using the dual-frequency ICP. Hereinbelow, the first plasma processing apparatus may be referred to as a dual-frequency ICP plasma processing apparatus.

A second plasma processing apparatus is a plasma processing apparatus not including the power splitter. Hereinbelow, the second plasma processing apparatus may be referred to as a plasma processing apparatus of the Comparative Example.

Simulation results are shown in FIGS. 29 to 32.

Figure 29:
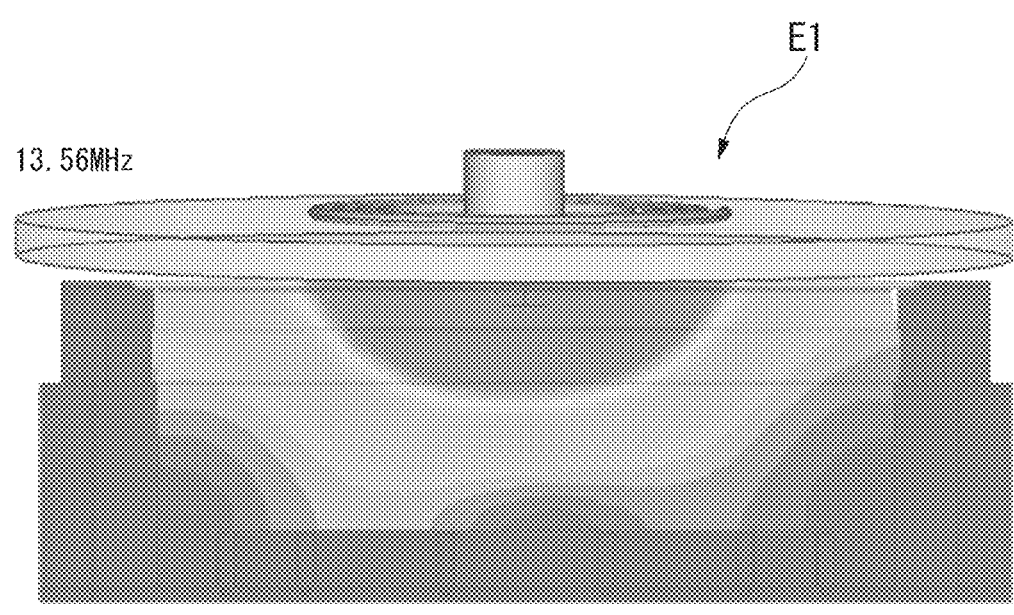
FIG. 29 is a view showing an intensity distribution of a magnetic field in the plasma processing apparatus according to the Example of the invention.

FIG. 29 shows the simulation results of the magnetic field generated in the plasma processing apparatus of the Comparative Example. In FIG. 29 shows a space distribution of the magnetic field generated only by the first electrode E1 using the alternating-current power having the frequency $\lambda 1$.

Figure 30:
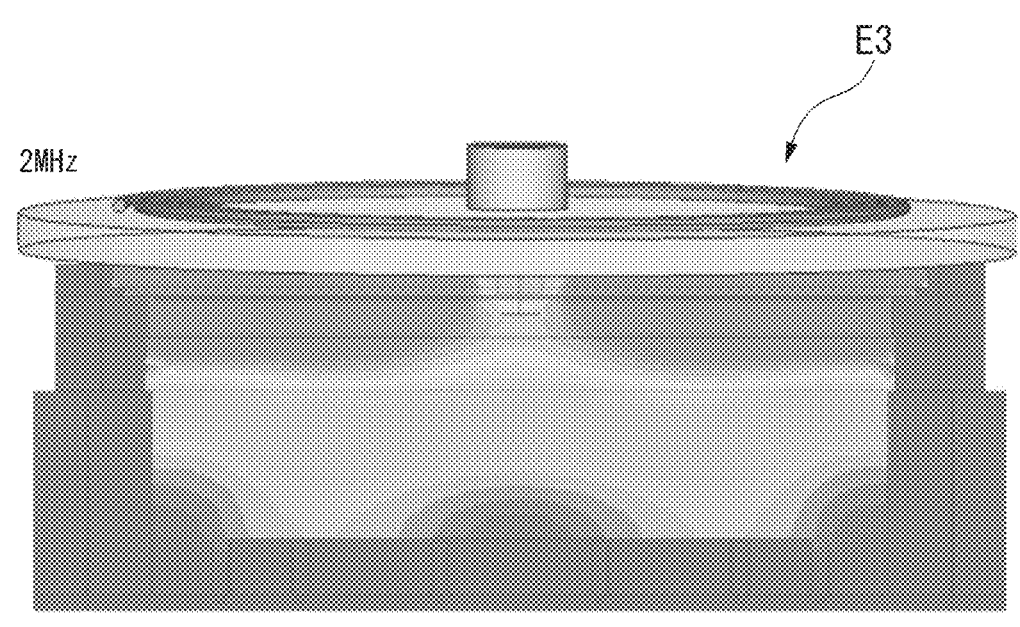
FIG. 30 is a view showing an intensity distribution of a magnetic field in the plasma processing apparatus according to the Example of the invention.

FIG. 30 shows the simulation results of the magnetic field generated in the plasma processing apparatus of the Comparative Example. FIG. 30 shows a space distribution of the magnetic field generated only by the third electrode E3 using the alternating-current power having the frequency $\lambda 2$.

Figure 31:
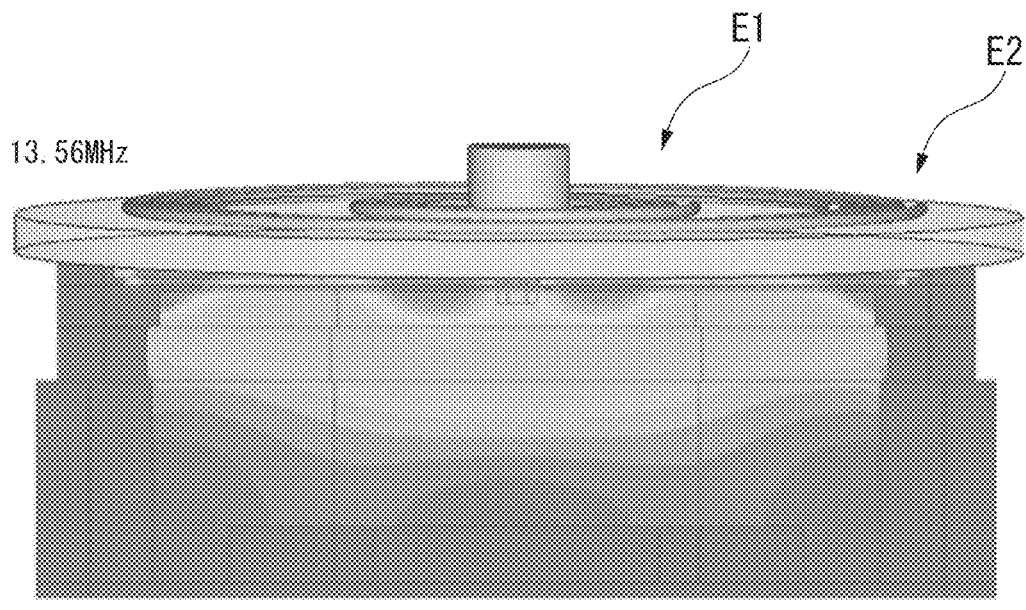
FIG. 31 is a view showing an intensity distribution of a magnetic field in the plasma processing apparatus according to the Example of the invention.

FIG. 31 shows the simulation results of the magnetic field generated in the dual-frequency ICP plasma processing apparatus. FIG. 31 shows a space distribution of the magnetic field generated only by the first electrode E1 using the alternating-current power having the frequency $\lambda 1$.

Figure 32:
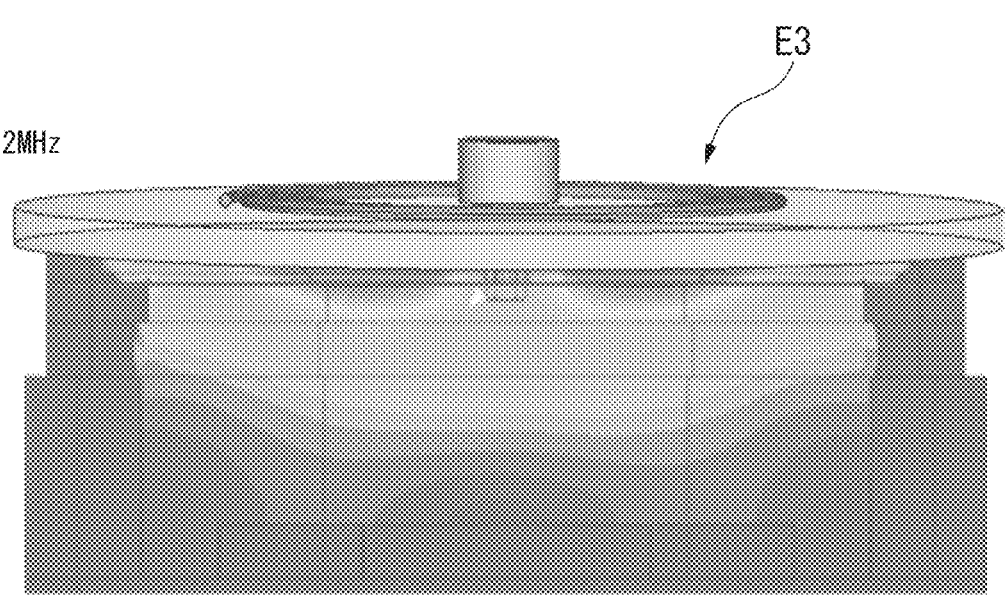
FIG. 32 is a view showing an intensity distribution of a magnetic field in the plasma processing apparatus according to the Example of the invention.

FIG. 32 shows the simulation results of the magnetic field generated in the dual-frequency ICP plasma processing apparatus. FIG. 32 shows a space distribution of the magnetic field generated only by the third electrode E3 using the alternating-current power having the frequency $\lambda 2$.

In FIGS. 29 to 32, the part surrounded by a solid line is a range of a space that directly contributes to plasma processing on the substrate in the plasma processing apparatus.

The simulation conditions of the plasma processing apparatus of the Comparative Example are as follows.

Two four-turn antennas were prepared.

The IN terminal and the OUT terminal of an M/B for 13.56 MHz were connected to both ends of one of the antennas. The antenna was a 13.56 MHz-antenna.

The IN terminal and the OUT terminal of an M/B for 2 MHz were connected to both ends of the other of the antennas. The antenna was a 2 MHz-antenna. The two antennas were arranged in a concentric form. In the concentric form, the 13.56 MHz-antenna was located at the inside position, and the 2 MHz-antenna was located at the outside position. In other words, the plasma processing apparatus of the Comparative Example includes a conventional antenna.

The simulation conditions of the dual-frequency ICP plasma processing apparatus are as follows.

Three four-turn antennas were prepared.

An inner-side circuit of the power splitter was connected to both ends of a first antenna.

An outer-side circuit of the power splitter was connected to both ends of a second antenna. In other words, each of the first antenna and the second antenna was a 13.56 MHz-power-splitting-inner-side antenna.

An M/B for 2 MHz was connected to both ends of a third antenna. The antenna was a 2 MHz-antenna. The 13.56 MHz-power-splitting-inner-side antenna and the third antenna were arranged in a concentric form. In the concentric form, the 13.56 MHz-power-splitting-inner-side antenna was located at the inside position, and the 2 MHz-antenna was located at the outside position.

The power splitter split power with a predetermined split ratio (electric power ratio) and supplied the split power to each of the first antenna and the second antenna. The split ratio was 0.5:0.5. The electric power of 1 kW having the frequency of 13.56 MHz was supplied to the 13.56 MHz-power-splitting-inner-side antenna forming the first antenna and the second antenna. The electric power of 1 kW having the frequency of 2 MHz was supplied to the third antenna.

In each of the plasma processing apparatus of the Comparative Example and the dual-frequency ICP plasma processing apparatus, the antenna was separated from a vacuum chamber with a dielectric window interposed therebetween. The magnetic field intensity generated in the vacuum chamber when supplying the electric power corresponding to the frequency to the antenna was calculated by simulation.

From the results shown in FIGS. 29 to 32, regarding the distribution of the magnetic field intensity in the space surrounded by the solid line in the dual-frequency-ICP plasma processing apparatus, it was found that it is possible to improve the uniformity of processing by matching the magnetic field of 13.56 MHz to the magnetic field of 2 MHz.

That is, although the magnetic field of 13.56 MHz does not match the magnetic field of 2 MHz in the plasma processing apparatus of the Comparative Example, it was ascertained that the magnetic field of 13.56 MHz matches the magnetic field of 2 MHz in the dual-frequency-ICP plasma processing apparatus.

Next, the ashing step S05 using the dual-frequency-ICP plasma processing apparatus will be described. The processing conditions in the ashing step S05 are as follows.

Supply gas: $O_2$

Flow rate of supply gas: $O_2$: 450 sccm

Processing pressure: 9 Pa

Supply power of first frequency λ1: 2000 W

First frequency λ1: 13.56 MHz

Supply power of second frequency λ2: 2000 W

Second frequency λ2: 2 MHz

Bias electric power: 200 W

Frequency λ3 of bias electric power: 400 kHz

Even in the ashing step S05, it was possible to improve the in-plane uniformity.

According to the invention, in a case of sequentially or intermittently carrying out a plurality of plasma processing types while maintaining a hermetically-closed state without breaking a vacuum state in the same chamber, it was found that the in-plane distributions of the processing characteristics of the plurality of the plasma processing types can coincide with each other. Consequently, it was found that the processing characteristics on the entire surface of the substrate can be uniform.

That is, in a case in which a plurality of processing steps, for example, the deposition step, the dry-etching step, the ashing step, the protective film forming step (deposition step) is one cycle, the cycle may be carried out multiple times. For example, there is a case in which the cycle is repetitively carried out approximately thirty times. In such a case, if the in-plane distribution of each of the deposition step, the dry-etching step, the ashing step, the protective film forming step varies, processing cannot be uniformly carried out. In this case, as a result, there is a problem in that a desired configuration cannot be obtained. For example, in a case in which this problem is applied to the cycle etching processing in the Example described above, there is a problem in that the configuration of recess patterns formed on the silicon substrate, particularly, the depth thereof, or the uniformity in diameter thereof cannot be maintained.

In contrast, in the plasma processing apparatus according to the invention using the power splitter 16 and being capable of carrying out power splitting and frequency superposition, even in the case of carrying out the above-mentioned cycle multiple times, it is possible to improve the in-plane uniformity of the processing characteristics in each of the steps. It is possible to maintain the configuration of recess patterns formed on the silicon substrate, particularly, the depth thereof, or the uniformity in diameter thereof.

According to the dual-frequency-ICP plasma processing apparatus, the alternating-current power having the frequency of 2 MHz increases the electron density of the plasma volume generated by the frequency of 13.56 MHz, and a high degree of controllability of dissociation of molecule in the plasma can be wider.

Additionally, in the dual-frequency-ICP plasma processing apparatus, the following effects were ascertained.

It is possible to generate plasma by the electric power of 13.56 MHz (electron density, low-temperature).

It is possible to heat plasma by the electric power of 2 MHz at the deep position in the plasma volume generated by the electric power of 13.56 MHz. This is because the low-frequency magnetic field reaches a deep position in plasma volume.

It is possible to control the electron density by frequency superposition of 13.56 MHz and 2 MHz. Consequently, the margin of controllability of gas dissociation becomes wider.

According to the power splitter, it is possible to split electric power generated from one power source into the two antennas with an optionally-selected split ratio, and it is possible to adjust the density distribution in the space of the generated plasma.

An etching rate and a deposition rate with respect to the density distribution of plasma varies depending on the gas type for use. Even in this case, processing can be carried out depending on the change of the in-plane distribution due to the characteristics of the gas to be used in processing steps different from each other using various types of gas.

According to the invention, since the high-frequency power splitter is used, it is possible to provide a mechanism for adjusting the distribution while maintaining the characteristics obtained by the dual frequency ICP. Particularly, even in a case of using various gases for each step, the power splitter can adjust the split ratio of power applied to the two antennas that are concentrically arranged at the inside position and the outside position in the radial direction. Consequently, it is possible to maintain the in-plane uniformity of the processing characteristics. Furthermore, both the in-plane uniformity of the cycle etching and the etching performance of the dual frequency ICP can be improved by carrying out the dual frequency ICP.

In the aforementioned Experimental Example 1, the film formation using the power splitter that splits the electric power of 13.56 MHz into the first electrode E1 and the second electrode E2 and using $SiF_4/O_2$ gas was evaluated. It was ascertained that the distribution of the film formation on a plane surface can be changed by changing the split ratio in a range of IN:OUT=999:0 to 0:999 (corresponding to split ratio 0.9:0.1 to 0.1:0.9). Additionally, in the aforementioned Experimental Example 3, the etching using $SF_6/SiF_4/O_2$ gas was evaluated. Although the in-plane distribution varies, it was ascertained that the amount of change is small.

In the above-described Experimental Example 5, the film formation using $SF_6/SiF_4/O_2$ gas with the dual-frequency superposition of 13.56 MHz and 2 MHz was evaluated. In the etching evaluation, as compared with the case of using only 13.56 MHz (corresponding to IN:OUT=999:0 when the power splitter is used), it was ascertained that the etching depth is changed from the state in which the etching depth is large at the center of the substrate (Center Fast) to the state in which the etching depth is large at the outer-peripheral portion of the substrate (Edge Fast).

In the above-mentioned Experimental Example 2, the positions of the gas introduction hole (a center position, an outer-peripheral position) was changed, and film formation using the dual-frequency superposition of 13.56 MHz and 2 MHz was evaluated. In the evaluation, evaluation was carried out for each of the two gas types. In the evaluation of the film formation using $C_4F_8$ gas, the distribution of the film formation was significantly varied depending on the positions of the gas introduction hole (a center position, an outer-peripheral position). On the other hand, in the evaluation of the film formation using $SiF_4/O_2$ gas, a change of the distribution of the film formation depending on the positions of the gas introduction hole was not shown. Accordingly, it was certain that the change is affected by the frequency of 13.56 MHz.

As described above, as the electric power of 13.56 MHz is split into two antennas provided at the inside portion and the outside portion with a desired split ratio by the power splitter, it was found that the in-plane distribution of the cycle etching can be uniform by controlling the etching distribution obtained by using $SF_6/SiF_4/O_2$ and the film formation distribution obtained by using $SiF_4/O_2$.

A conventional dual frequency ICP antenna using electric power of 13.56 MHz and electric power of 2 MHz has been utilized for cycle etching of alternately and repetitively carrying out a film formation step and an etching step. However, there was a problem in that variations in distribution for each of a plurality of steps constituting the cycle etching cannot be improved. Furthermore, the in-plane distribution of etched shape cannot be controlled after the processing was carried out.

Specifically, in the deposition step serving as one of the cycle etching, a gas is used such that the characteristic distribution is strongly affected by the space distribution of plasma generated by the alternating-current power of 13.56 MHz. In the etching step serving as one of the cycle etching, a gas is used such that the characteristic distribution is affected by the space distribution of plasma generated by both the alternating-current power having the frequency of 2 MHz and the alternating-current power having the frequency of 13.56 MHz. In the cycle etching, it is necessary to repeatedly carry out the deposition step and the etching step above-described.

As described above, in a case of alternately carrying out the deposition step and the etching step in the cycle etching, even where an excellent distribution is obtained in one of the steps, if the same distribution is not obtained in the other of the steps, it is difficult to maintain the in-plane uniformity of the processed shape. Regarding this point, in a plasma processing apparatus including only a conventional antenna, an antenna configuration is fixed, and a space distribution of a magnetic field to be generated cannot be changed. Accordingly, it was difficult to improve the in-plane distribution of the processing characteristics for each of the plurality of the steps constituting the cycle etching.

Additionally, the film formation step using $SiF_4/O_2$ gas is indispensable for protecting a resist film in a Dual TSV Process (Cycle Etching). It is known that the film thickness distribution of the film formation step depends on the space distribution of plasma. In a conventional dual frequency ICP antenna, since the space distribution of plasma is fixed, the distribution of processing cannot be controlled.

In order to solve the aforementioned problem, the invention achieves the plasma source capable of controlling the space distribution of the dual frequency ICP by using the power splitting technique and the dual frequency ICP. Consequently, as the distribution of the Depo1 film ($SiF_4/O_2$ gas) and the distribution of the etching ($SF_6/SiF_4/O_2$ gas) are combined, it is possible to improve the uniformity of processing with respect to the surface of the substrate (the plane surface of the wafer). It is possible to change the film thickness distribution by using the power splitter and by adjusting the split ratio. As the power splitter is controlled, the in-plane distribution of etching obtained by the dual-frequency superposition using 13.56 MHz and 2 MHz can be matched to the in-plane distribution of the film thickness.

In the resist protective film forming step (deposition step using $SiF_4/O_2$ gas) of the cycle etching processing, regarding the split ratio of electric power split into the inside and the outside of the antenna, it is preferable to set the split ratio of the electric power so as to satisfy the relationship of "inside:outside=0.5:0.5 to 0.1:0.9".

In a side-wall protective film forming step (deposition step using $C_4F_8$ gas) of the cycle etching processing, regarding the split ratio of electric power split into the inside and the outside of the antenna, it is preferable to set the split ratio of the electric power so as to satisfy the relationship of "inside:outside=0.75:0.25 to 0.25:0.75".

In the etching step (dry-etching step using $SF_6/SiF_4/O_2$ gas) the cycle etching processing, regarding the split ratio of electric power split into the inside and the outside of the antenna, it is preferable to set the split ratio of the electric power so as to satisfy the relationship of "inside:outside=0.75:0.25 to 0.25:0.75".

Furthermore, an electrode (antenna) for plasma heating to which a second frequency λ2 is to be applied can be provided on the inner side in the radial direction of the first electrode E1.

Additionally, an electrode (antenna) for plasma heating to which a second frequency λ2 is to be applied can be provided on the outer side in the radial direction of the second electrode E2.

Moreover, regarding the arrangement of electrodes, an electrode to which the second frequency λ2 is applied may be combined with the first electrode E1 and the second electrode E2.

Alternatively, the first electrode E1, the second electrode E2, and the third electrode E3 may have a structure having a first level to a third level in a height direction parallel to the axis direction.

Therefore, it is possible to effectively heat plasma. Furthermore, for processing with respect to a large-scaled substrate, it is possible to effectively control the space distribution of plasma.

Moreover, members are individually extracted from the above-described plurality of members, and an arrangement obtained by optionally combining the extracted members may be adopted.

INDUSTRIAL APPLICABILITY

The invention is applicable to a step of forming a through-hole on a Si substrate in a semiconductor manufacturing process.

What is claimed is:
1. A plasma processing apparatus comprising:
    a chamber having a depressurizable internal space, the chamber being configured to carry out a plasma processing with respect to a target object in the internal space;

an upper lid configured to be provided on an upper surface of the chamber, the upper lid being formed of a dielectric plate;

a flat plate-shaped inner electrode disposed inside the chamber, the inner electrode being configured to receive the target object to be mounted thereon;

a spiral-shaped outer electrode disposed outside the chamber, the outer electrode being disposed so as to face the inner electrode with the upper lid interposed therebetween;

a plasma generating power source configured to apply alternating-current power having a predetermined frequency to the outer electrode; and a gas introduction part configured to introduce a processing gas into the internal space of the chamber, wherein the outer electrode is separated in a radial direction of the outer electrode, the outer electrode includes a spiral-shaped first electrode, a spiral-shaped second electrode, and a spiral-shaped third electrode, the first electrode is disposed at a medial portion in the radial direction, the second electrode is disposed at an outer-peripheral portion in the radial direction, the third electrode is sandwiched between the first electrode and the second electrode in the radial direction, the plasma generating power source includes a first high-frequency power source, a second high-frequency power source, and a power splitter, the first high-frequency power source is configured to apply alternating-current power having a first frequency $\lambda 1$ to the first electrode and the second electrode, the second high-frequency power source is configured to apply alternating-current power having a second frequency $\lambda 2$ to the third electrode, a relationship between the first frequency $\lambda 1$ and the second frequency $\lambda 2$ satisfies a relationship of $\lambda 1 > \lambda 2$, the power splitter is configured to split the alternating-current power to be applied to the first electrode and the second electrode, into the first electrode and the second electrode, with a predetermined split ratio, and the power splitter is configured to apply the split alternating-current power to each of the first electrode and the second electrode.

2. The plasma processing apparatus according to claim 1, wherein plasma having a space distribution controlled by the alternating-current power having the first frequency $\lambda 1$ which is split into and applied to the first electrode and the second electrode is generated, and an electron density of the plasma is increased by the alternating-current power having the second frequency $\lambda 2$ applied to the third electrode.

3. The plasma processing apparatus according to claim 1, wherein the power splitter is configured to apply the split alternating-current power to each of the first electrode and the second electrode such that a magnetic field profile formed by the first electrode and the second electrode substantially coincides with a magnetic field profile formed by the third electrode.

4. The plasma processing apparatus according to claim 1, wherein the first frequency $\lambda 1$ is 13.56 MHz, and the second frequency $\lambda 2$ is 2 MHz.

5. The plasma processing apparatus according to claim 1, wherein the outer electrode includes a plurality of parts stacked in an axis direction of a spiral shape.

6. A method of carrying out plasma processing using a plasma processing apparatus, the plasma processing apparatus includes:

a chamber having a depressurizable internal space, the chamber being configured to carry out a plasma processing with respect to a target object in the internal space;

an upper lid configured to be provided on an upper surface of the chamber, the upper lid being formed of a dielectric plate;

a flat plate-shaped inner electrode disposed inside the chamber, the inner electrode being configured to receive the target object to be mounted thereon;

a spiral-shaped outer electrode disposed outside the chamber, the outer electrode being disposed so as to face the inner electrode with the upper lid interposed therebetween;

a plasma generating power source configured to apply alternating-current power having a predetermined frequency to the outer electrode; and a gas introduction part configured to introduce a processing gas into the internal space of the chamber, wherein the outer electrode is separated in a radial direction of the outer electrode, the outer electrode includes a spiral-shaped first electrode, a spiral-shaped second electrode, and a spiral-shaped third electrode, the first electrode is disposed at a medial portion in the radial direction, the second electrode is disposed at an outer-peripheral portion in the radial direction, the third electrode is sandwiched between the first electrode and the second electrode in the radial direction, the plasma generating power source includes a first high-frequency power source, a second high-frequency power source, and a power splitter, the first high-frequency power source is configured to apply alternating-current power having a first frequency $\lambda 1$ to the first electrode and the second electrode, the second high-frequency power source is configured to apply alternating-current power having a second frequency $\lambda 2$ to the third electrode, a relationship between the first frequency $\lambda 1$ and the second frequency $\lambda 2$ satisfies a relationship of $\lambda 1 > \lambda 2$, the power splitter is configured to split the alternating-current power to be applied to the first electrode and the second electrode, into the first electrode and the second electrode, with a predetermined split ratio, and the power splitter is configured to apply the split alternating-current power to each of the first electrode and the second electrode; wherein the method of carrying out plasma processing comprising:

generating plasma in the internal space by applying the alternating-current power having the first frequency $\lambda 1$ to the first electrode and the second electrode by use of the first high-frequency power source;

controlling a space distribution of the plasma generated in the internal space by splitting the alternating-current power having the first frequency $\lambda 1$ into the first electrode and the second electrode with a predetermined split ratio by use of the power splitter; and increasing an electron density of the plasma by applying the alternating-current power having the second frequency $\lambda 2$ to the third electrode by use of the second high-frequency power source.

7. The plasma processing method according to claim 6, wherein in accordance with the processing gas to be introduced into the internal space of the chamber by the gas introduction part, the split ratio of the alternating-current power to be applied to the first electrode and the second electrode is changed by the power splitter, and the space distribution of the plasma generated in the internal space is thereby controlled.

8. The plasma processing method according to claim 7, wherein in a case in which the alternating-current power to be split by the power splitter and to be applied to the first electrode is defined as Winner, and the alternating-current power to be split by the power splitter and to be applied to the second electrode is defined as Wouter, the split ratio of the power splitter is set so as to obtain a range of Winner:Wouter=0.5:0.5 to 0.1:0.9.

9. The plasma processing method according to claim 8, wherein the target object is subjected to film formation processing using $SiF_4/O_2$ gas as the processing gas.

10. The plasma processing method according to claim 6, wherein in a case in which the alternating-current power to be split by the power splitter and to be applied to the first electrode is defined as Winner, and the alternating-current power to be split by the power splitter and to be applied to the second electrode is defined as Wouter, the split ratio of the power splitter is set so as to obtain a range of Winner:Wouter=0.75:0.25 to 0.25:0.75.

11. The plasma processing method according to claim 10, wherein the target object is subjected to film formation processing using $C_4F_8$ gas as the processing gas, or the target object is subjected to etching processing using $SF_6/SiF_4/O_2$ gas as the processing gas.

12. The plasma processing method according to claim 6, wherein in a case in which the alternating-current power to be split by the power splitter and to be applied to the first electrode is defined as Winner, and the alternating-current power to be split by the power splitter and to be applied to the second electrode is defined as Wouter, the method includes:

a first step of setting the split ratio of the power splitter so as to obtain a range of Winner:Wouter=0.5:0.5 to 0.1:0.9, using $SiF_4/O_2$ gas as the processing gas, and causing the target object to be subjected to film formation processing;

a second step of setting the split ratio of the power splitter so as to obtain a range of Winner:Wouter=0.75:0.25 to 0.25:0.75, using $C_4F_8$ gas as the processing gas, and causing the target object to be subjected to film formation processing; and a third step of setting the split ratio of the power splitter so as to obtain a range of Winner:Wouter=0.75:0.25 to 0.25:0.75, using $SF_6/SiF_4/O_2$ gas as the processing gas, and causing the target object to be subjected to etching processing, wherein the first step, the second step, and the third step are sequentially carried out without breaking a vacuum state in the chamber.

* * * * *